(12) United States Patent
Wang et al.

(10) Patent No.: US 12,046,598 B2
(45) Date of Patent: Jul. 23, 2024

(54) SEMICONDUCTOR DEVICE

(71) Applicant: Socionext Inc., Kanagawa (JP)

(72) Inventors: Wenzhen Wang, Yokohama (JP);
Hirotaka Takeno, Yokohama (JP);
Atsushi Okamoto, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 468 days.

(21) Appl. No.: 17/507,567

(22) Filed: Oct. 21, 2021

(65) Prior Publication Data

US 2022/0045056 A1    Feb. 10, 2022

Related U.S. Application Data

(63) Continuation of application No. PCT/JP2019/017690, filed on Apr. 25, 2019.

(51) Int. Cl.
*H01L 27/092* (2006.01)
*H01L 23/528* (2006.01)
(Continued)

(52) U.S. Cl.
CPC ...... *H01L 27/0922* (2013.01); *H01L 23/5286* (2013.01); *H01L 27/0924* (2013.01);
(Continued)

(58) Field of Classification Search
None
See application file for complete search history.

(56) References Cited

U.S. PATENT DOCUMENTS 6,335,895 B1    1/2002  Sugibayashi
9,129,829 B2    9/2015  Kuhn et al.
(Continued)

FOREIGN PATENT DOCUMENTS

JP    H09-283747 A    10/1997
JP    2005-039294 A    2/2005
(Continued)

OTHER PUBLICATIONS

Ryckaert et al., "The Complementary FET (CFET) for CMOS scaling beyond N3", 2018 Symposium on VLSI Technology Digest of Technical Papers, p. 141-p. 142.
(Continued)

*Primary Examiner* — Michael Lebentritt
(74) *Attorney, Agent, or Firm* — Rimon P.C.

(57) ABSTRACT

A semiconductor device includes a first power supply line, a second power supply line, a first ground line, a switch circuit connected to the first and the second power supply line, and a switch control circuit connected to the first ground line and the first power supply line. The switch circuit includes a first and a second transistor of a first conductive type. A first gate electrode of the first transistor is connected to a second gate electrode of the second transistor. The switch control circuit includes a third transistor of a second conductive type, and a fourth transistor of a third conductive type. A third gate electrode of the third transistor is connected to a fourth gate electrode of the fourth transistor. A semiconductor device includes a signal line that electrically connects a connection point between the third and fourth transistor to the first and second gate electrode.

14 Claims, 44 Drawing Sheets

(51) Int. Cl.
  *H01L 29/06* (2006.01)
  *H01L 29/423* (2006.01)
  *H01L 29/775* (2006.01)
  *H01L 29/786* (2006.01)
(52) U.S. Cl.
  CPC .... *H01L 29/0673* (2013.01); *H01L 29/42392* (2013.01); *H01L 29/775* (2013.01); *H01L 29/78696* (2013.01)

(56) References Cited

U.S. PATENT DOCUMENTS

| | | | |
|---|---|---|---|
| 9,570,395 | B1 | 2/2017 | Sengupta et al. |
| 9,837,414 | B1 | 12/2017 | Balakrishnan et al. |
| 11,563,432 | B2 * | 1/2023 | Okamoto ........... H03K 19/0016 |
| 11,799,471 | B2 * | 10/2023 | Okamoto ........... H03K 19/0016 |
| 2012/0229190 | A1 | 9/2012 | Kajihara et al. |
| 2012/0248544 | A1 | 10/2012 | Yokoyama |
| 2015/0365089 | A1 | 12/2015 | Momiyama |
| 2016/0322097 | A1 * | 11/2016 | Shin ........................ G11C 5/14 |
| 2017/0040321 | A1 | 2/2017 | Mitard |
| 2017/0094220 | A1 | 3/2017 | Kurokawa |
| 2017/0331472 | A1 | 11/2017 | Ogata |
| 2018/0315743 | A1 | 11/2018 | Takeno et al. |
| 2019/0081029 | A1 | 3/2019 | Okamoto et al. |
| 2021/0210468 | A1 * | 7/2021 | Takeno ............... H01L 23/5286 |
| 2022/0231053 | A1 * | 7/2022 | Takeno ............... H01L 23/5226 |
| 2022/0231681 | A1 * | 7/2022 | Okamoto ........... H03K 19/0013 |
| 2022/0239297 | A1 * | 7/2022 | Takeno ............. H01L 23/49562 |
| 2023/0120959 | A1 * | 4/2023 | Okamoto ........... H03K 17/6871 327/382 |

FOREIGN PATENT DOCUMENTS

| | | |
|---|---|---|
| JP | 2008-205168 A | 9/2008 |
| JP | 2012-190998 A | 10/2012 |
| JP | 2012-216776 A | 11/2012 |
| JP | 2014-150481 A | 8/2014 |
| JP | 2015-073039 A | 4/2015 |
| JP | 2016-001652 A | 1/2016 |
| JP | 2018-026565 A | 2/2018 |
| WO | 2017/208888 A1 | 12/2017 |
| WO | 2018/017677 A1 | 1/2018 |

OTHER PUBLICATIONS

Mocuta et al., "Enabling CMOS Scaling Towards 3nm and Beyond", 2018 Symposium on VLSI Technology Digest of Technical Papers, p. 147-148.
International Search Report and Written Opinion issued in International Patent Application No. PCT/JP2019/017690, dated Jun. 18, 2019; with partial English translation.
Chinese Office Action dated Feb. 4, 2024 issued in the corresponding Chinese Patent Application No. 201980095703.8, with English machine translation.

* cited by examiner

SEMICONDUCTOR DEVICE

CROSS-REFERENCE TO RELATED APPLICATION

This application is a continuation application of International Application PCT/JP2019/017690 filed on Apr. 25, 2019 and designated the U.S., the entire contents of which are incorporated herein by reference.

FIELD

The embodiments discussed herein are related to a semiconductor device.

BACKGROUND

Semiconductor devices include various circuit areas, an example of which is a standard cell area. The standard cell area includes various logic circuits and a power supply switch circuit.

DOCUMENTS

[Patent Document 1] Japanese Laid-Open Patent Application No. 2016-1652
[Patent Document 2] U.S. Patent Application Publication No. 2017/0331472
[Patent Document 3] WO2017/208888
[Patent Document 4] U.S. Pat. No. 9,570,395
[Patent Document 5] U.S. Pat. No. 9,837,414
[Patent Document 6] U.S. Patent Application Publication No. 2017/0040321
[Patent Document 7] U.S. Pat. No. 9,129,829
[Patent Document 8] Japanese Laid-Open Patent Application No. 2018-26565
[Non-Patent Document 1] 2018 Symposium on VLSI Technology Digest of Technical Papers, p. 141 to p. 142
[Non-Patent Document 2] 2018 Symposium on VLSI Technology Digest of Technical Papers, p. 147 to p. 148

SUMMARY

A semiconductor device includes a first power supply line, a second power supply line, a first ground line, a switch circuit connected to the first power supply line and the second power supply line, and a switch control circuit connected to the first ground line and the first power supply line. The switch circuit includes a first transistor of a first conductive type, and a second transistor, formed on the first transistor, of the first conductive type, the second transistor being connected in parallel with the first transistor between the first power supply line and the second power supply line. A first gate electrode of the first transistor is connected to a second gate electrode of the second transistor. The switch control circuit includes a third transistor of a second conductive type, and a fourth transistor, formed on the third transistor, of a third conductive type that is different from the second conductive type, the fourth transistor being connected in series with the third transistor between the first ground line and the first power supply line. A third gate electrode of the third transistor is connected to a fourth gate electrode of the fourth transistor. The semiconductor device includes a signal line that electrically connects a connection point between the third transistor and the fourth transistor with the first gate electrode and the second gate electrode.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENTS

Figure 1:
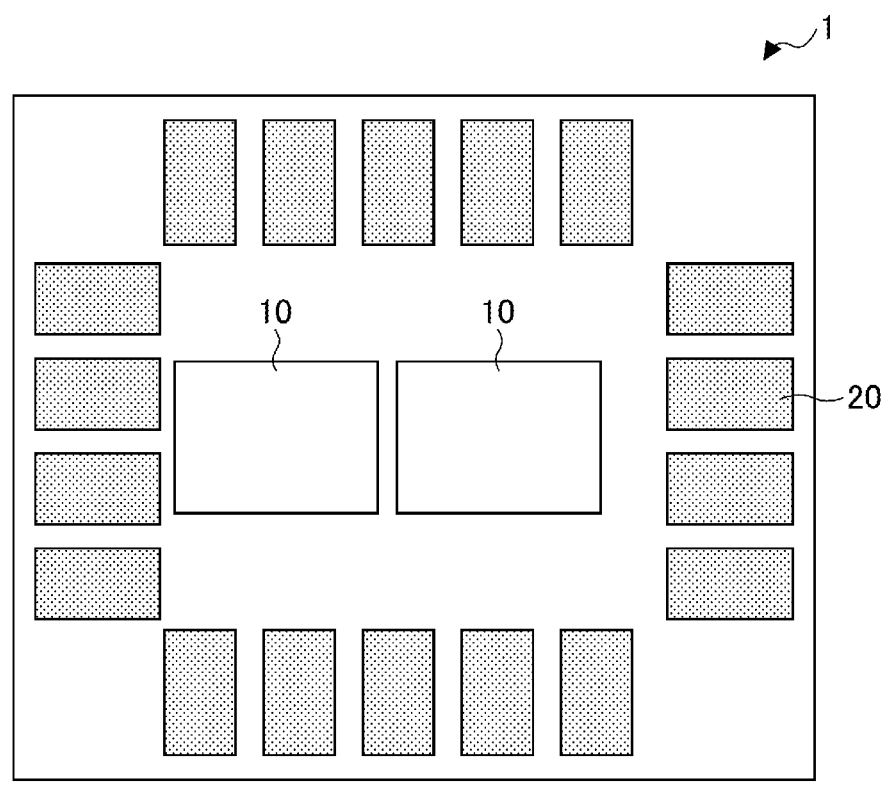
FIG. 1 is a diagram illustrating a layout of a semiconductor device according to a first embodiment.

Semiconductor devices include various circuit areas, an example of which is a standard cell area. The standard cell area includes various logic circuits and a power supply switch circuit.

For example, the power supply switch circuit is connected to a power supply line at a potential of VDD supplied to a semiconductor device and a power supply line at a VVDD power supplied to a transistor in a logic circuit. The power supply switch circuit is configured to turn on and off the supply of the power at the potential of VVDD to the transistor. With the use of the power supply switch circuit, the supply of the power can be turned off when the logic circuit does not need to operate, the leakage current generated by the transistors constituting the logic circuit can be reduced, and the power consumption can be reduced.

In recent years, an element called a complementary field effect transistor (CFET) has been known. In the CFET, the N-channel FET and the P-channel FET are laminated on the substrate. The CFET is suitable for miniaturization of semiconductor devices.

So far, when the CFET is used in a semiconductor device including a power supply switch circuit, a specific configuration has not been studied in detail.

An object of the present disclosure is to provide a semiconductor device capable of implementing a power supply switch circuit including the CFET.

According to the techniques in the present disclosure, a power supply switch circuit including the CFET can be realized.

Hereinafter, embodiments are specifically described with reference to the attached drawings. In the present specification and drawings, constituent elements having substantially the same functional configurations may be denoted by the same reference numerals, and duplicate explanations thereabout are omitted. In the following description, two directions parallel to the surface of a substrate and orthogonal to each other are defined as the X direction and the Y direction, and a direction perpendicular to the surface of the substrate is defined as the Z direction. In the present disclosure, an expression, "the position of any given element is the same as the position of another element", should not be strictly interpreted as excluding the elements being misaligned due to manufacturing errors, and it should be understood that even if the elements are misaligned due to such manufacturing errors, the positions of such elements may be considered to be the same as each other.

First Embodiment

Figure 2:
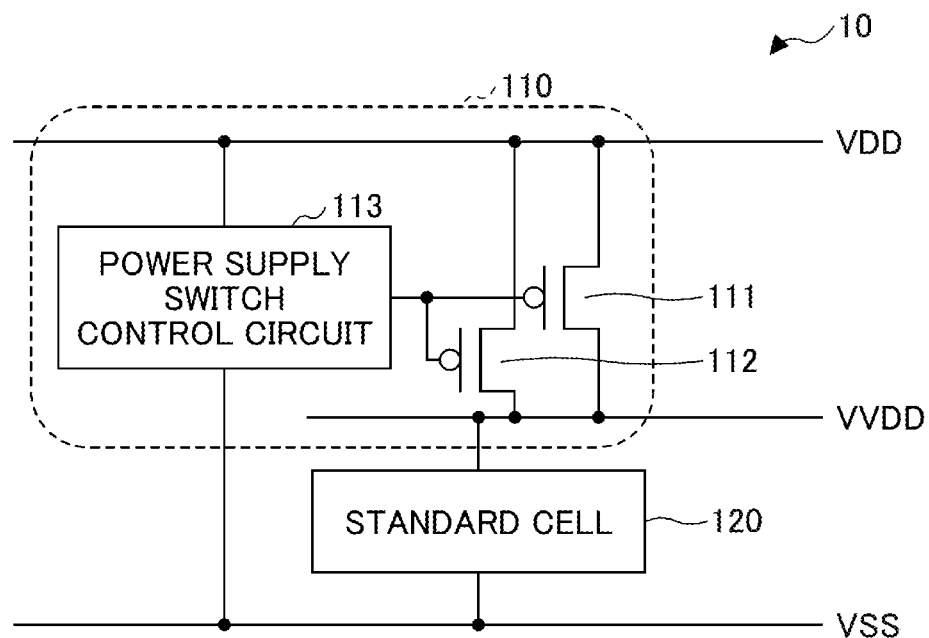
FIG. 2 is a circuit diagram illustrating a configuration of a power supply switch circuit included in the semiconductor device according to the first embodiment.

First, the first embodiment is explained. FIG. 1 is a diagram illustrating a layout of a semiconductor device according to a first embodiment. FIG. 2 is a circuit diagram illustrating a configuration of a power supply switch circuit included in the semiconductor device according to the first embodiment.

As illustrated in FIG. 1, the semiconductor device according to the first embodiment includes multiple standard cell areas 10 and input/output (I/O) cell areas 20 arranged around the standard cell areas 10. Alternatively, a single standard cell area 10 may be provided, or three or more standard cell areas 10 may be provided. As illustrated in FIG. 2, the standard cell area 10 includes a standard cell 120 and a power supply switch circuit 110. For example, the standard cell 120 includes various kinds of logic circuits such as a NAND circuit, an inverter circuit, and the like. The standard cell area 10 is arranged with: a VSS line for supplying a ground potential to the standard cell 120; and a VVDD line for supplying a power supply potential to the standard cell 120. In addition, the standard cell area 10 is arranged with a VDD line for supplying a power supply potential to the power supply switch circuit 110 from outside. The VSS line may be referred to as a ground line, and each of the VVDD line and the VDD line may also be referred to as a power supply line.

As illustrated in FIG. 2, the power supply switch circuit 110 includes a switch transistor 111, a switch transistor 112, and a power supply switch control circuit 113. For example, the switch transistors 111 and 112 are P-channel MOS transistors, and are connected between the VDD line and the VVDD line. A gate of the switch transistor 111 is connected to a gate of the switch transistor 112. The power supply switch control circuit 113 is connected to the gate of the switch transistor 111 and the gate of the switch transistor 112 to control the operation of the switch transistors 111 and 112. The power supply switch control circuit 113 switches the ON/OFF state of the switch transistors 111 and 112 to control the conduction between the VDD line and the VVDD line. For example, the power supply switch control circuit 113 includes a buffer.

Figure 3:
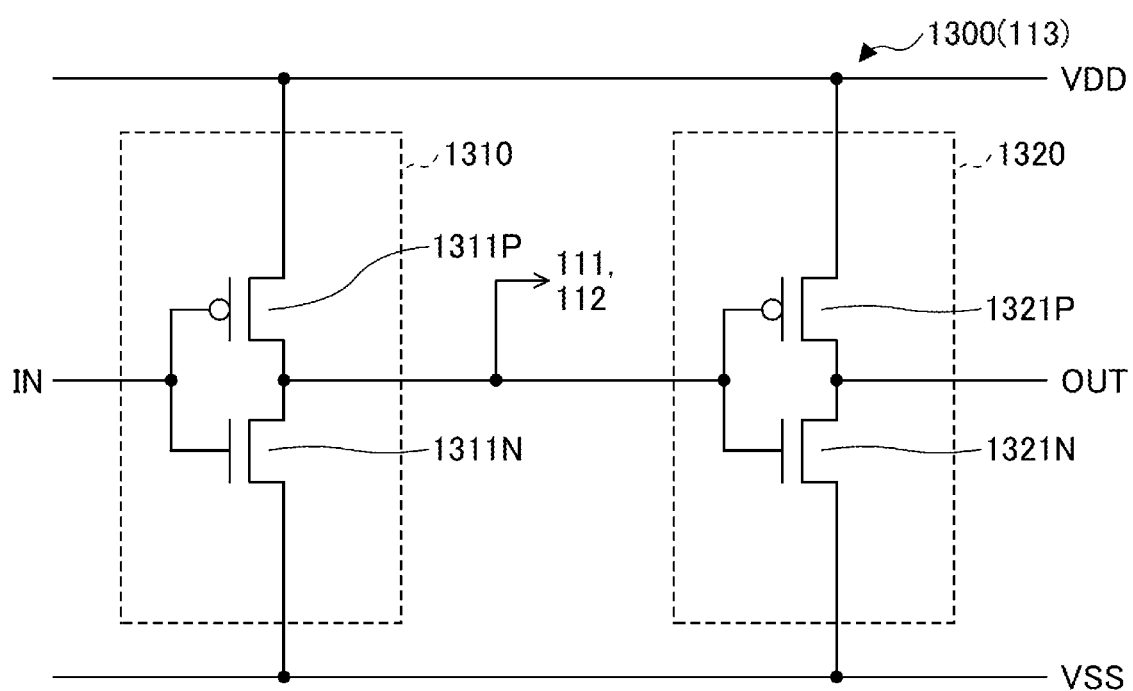
FIG. 3 is a circuit diagram illustrating a configuration of a buffer included in the semiconductor device according to the first embodiment.

Next, the configuration of the buffer used for the power supply switch control circuit 113 is explained. FIG. 3 is a circuit diagram illustrating a buffer.

As illustrated in FIG. 3, the buffer 1300 used for the power supply switch control circuit 113 includes an inverter 1310 and an inverter 1320. The inverter 1310 receives an input signal IN. The output of the inverter 1310 is received by the gate of the switch transistor 111, the gate of the switch transistor 112, and the inverter 1320. The inverter 1320 outputs an output signal OUT. The inverter 1310 includes a pair of a P-channel MOS transistor 1311P and an N-channel MOS transistor 1311N. The inverter 1320 includes a pair of a P-channel MOS transistor 1321P and an N-channel MOS transistor 1321N. The configuration of the inverters 1310 and 1320 is merely an example. For example, two or more pairs of a P-channel MOS transistor and an N-channel MOS transistor may be included in each of the inverters 1310 and 1320. Further, an input signal IN to the inverter 1310 and an output signal OUT from the inverter 1320 may be input to the gate of the switch transistor 111 and the gate of the switch transistor 112.

The switch transistor 112 is formed on the switch transistor 111. In the inverter 1310, the P-channel MOS transistor 1311P is formed on the N-channel MOS transistor 1311N. In the inverter 1320, the P-channel MOS transistor 1321P is formed on the N-channel MOS transistor 1321N.

Figure 4:
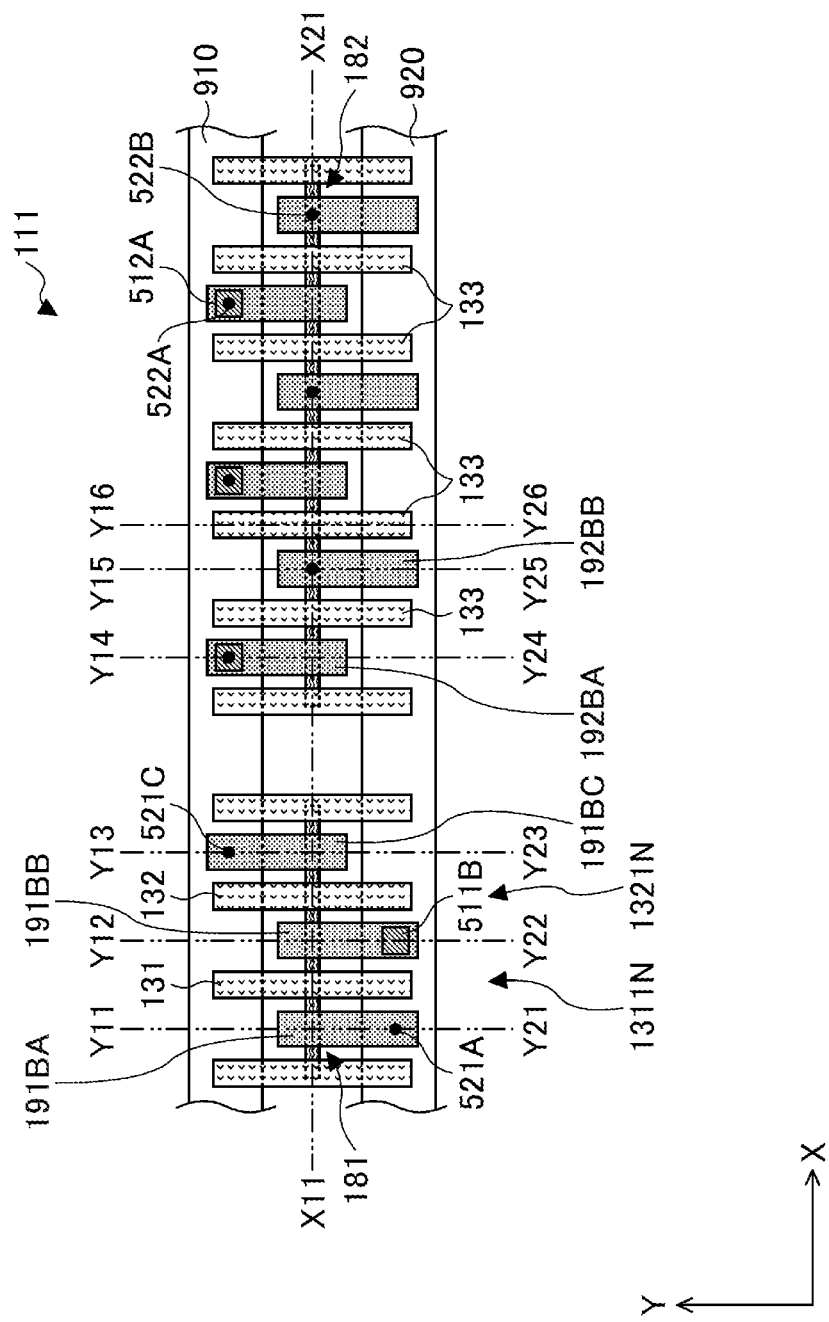
FIG. 4 is a schematic view (Part 1) illustrating a planar configuration of a standard cell area according to the first embodiment.
Figure 5:
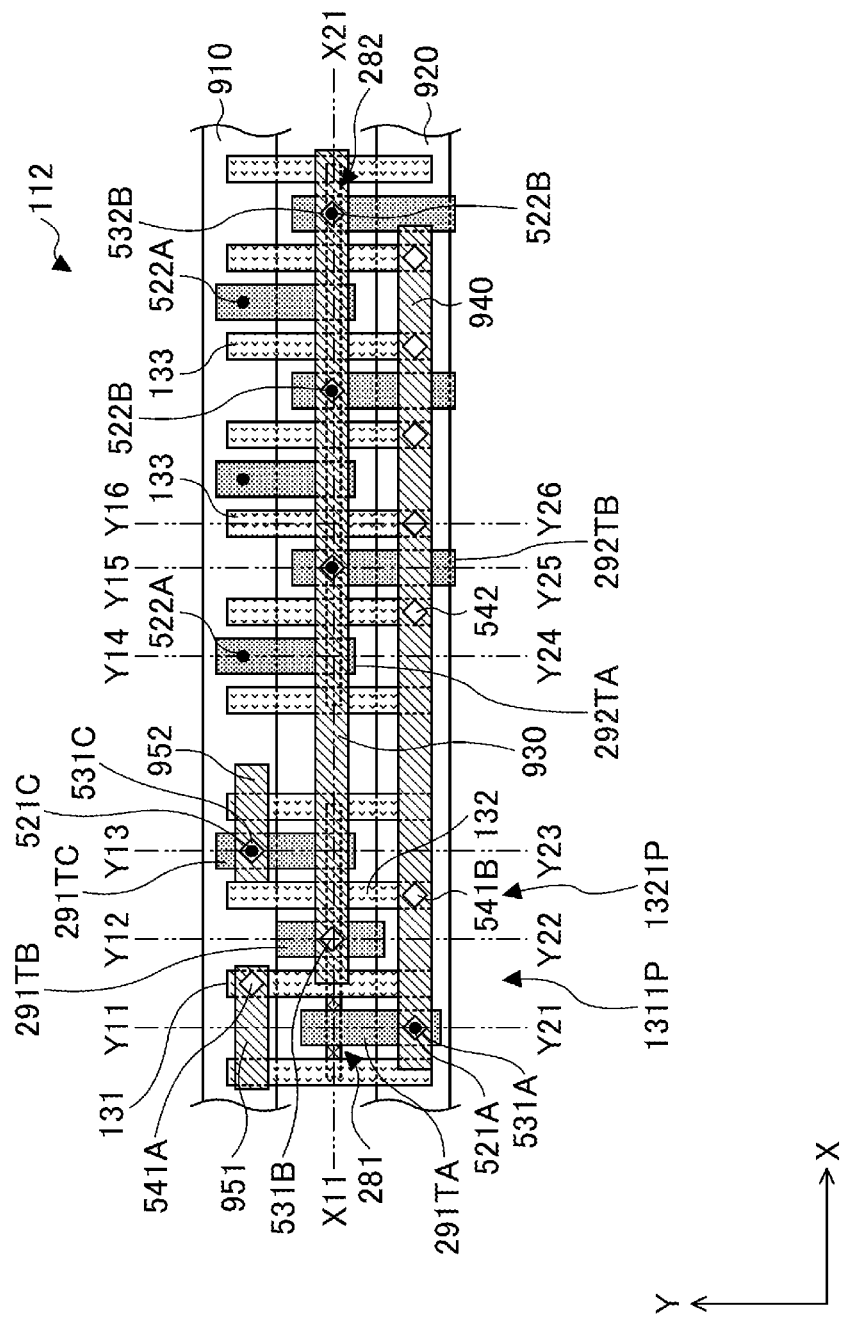
FIG. 5 is a schematic view (Part 2) illustrating a planar configuration of the standard cell area according to the first embodiment.
Figure 6:
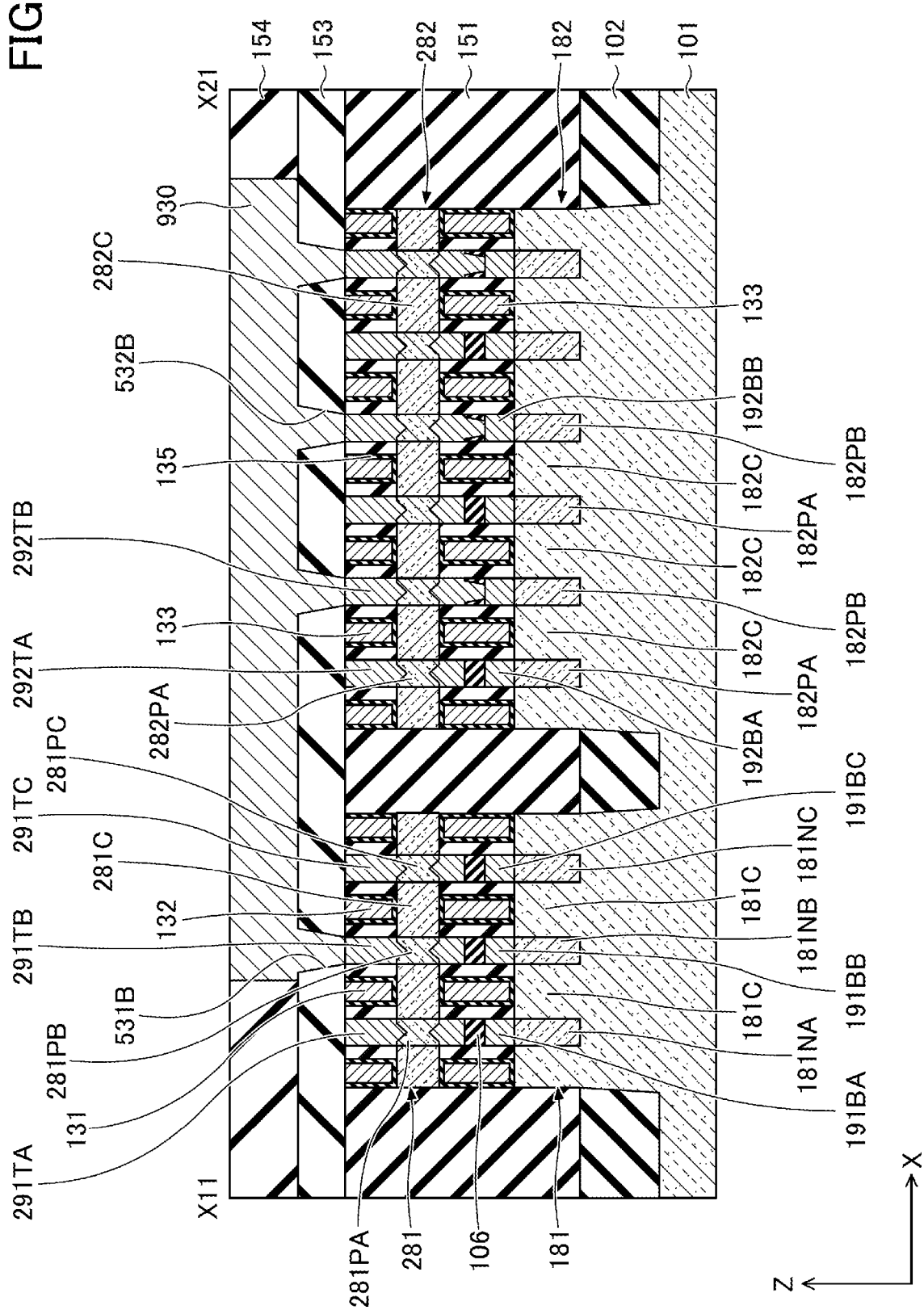
FIG. 6 is a cross-sectional view (Part 1) illustrating the standard cell area according to the first embodiment.
Figure 7:
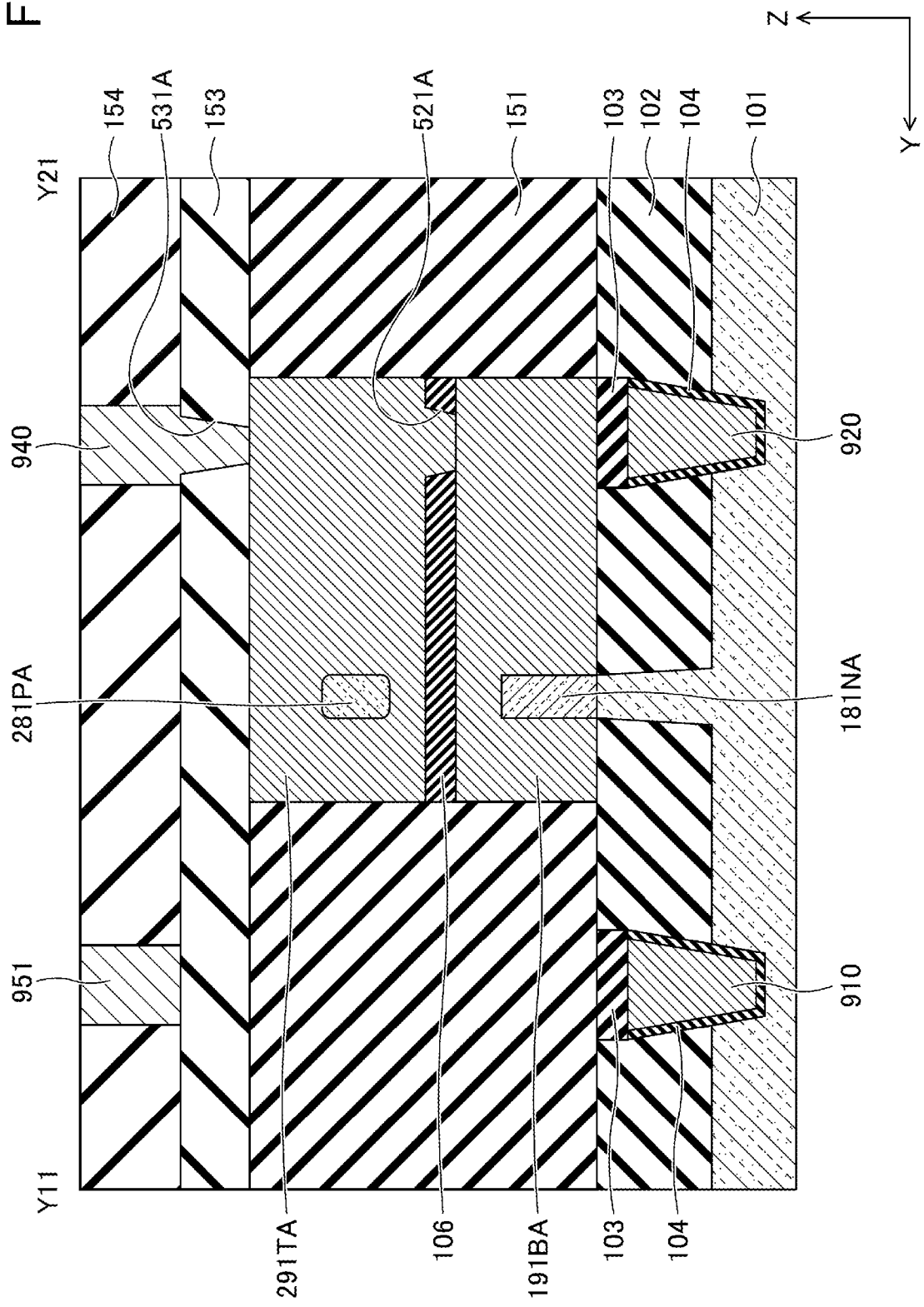
FIG. 7 is a cross-sectional view (Part 2) illustrating the standard cell area according to the first embodiment.
Figure 8:
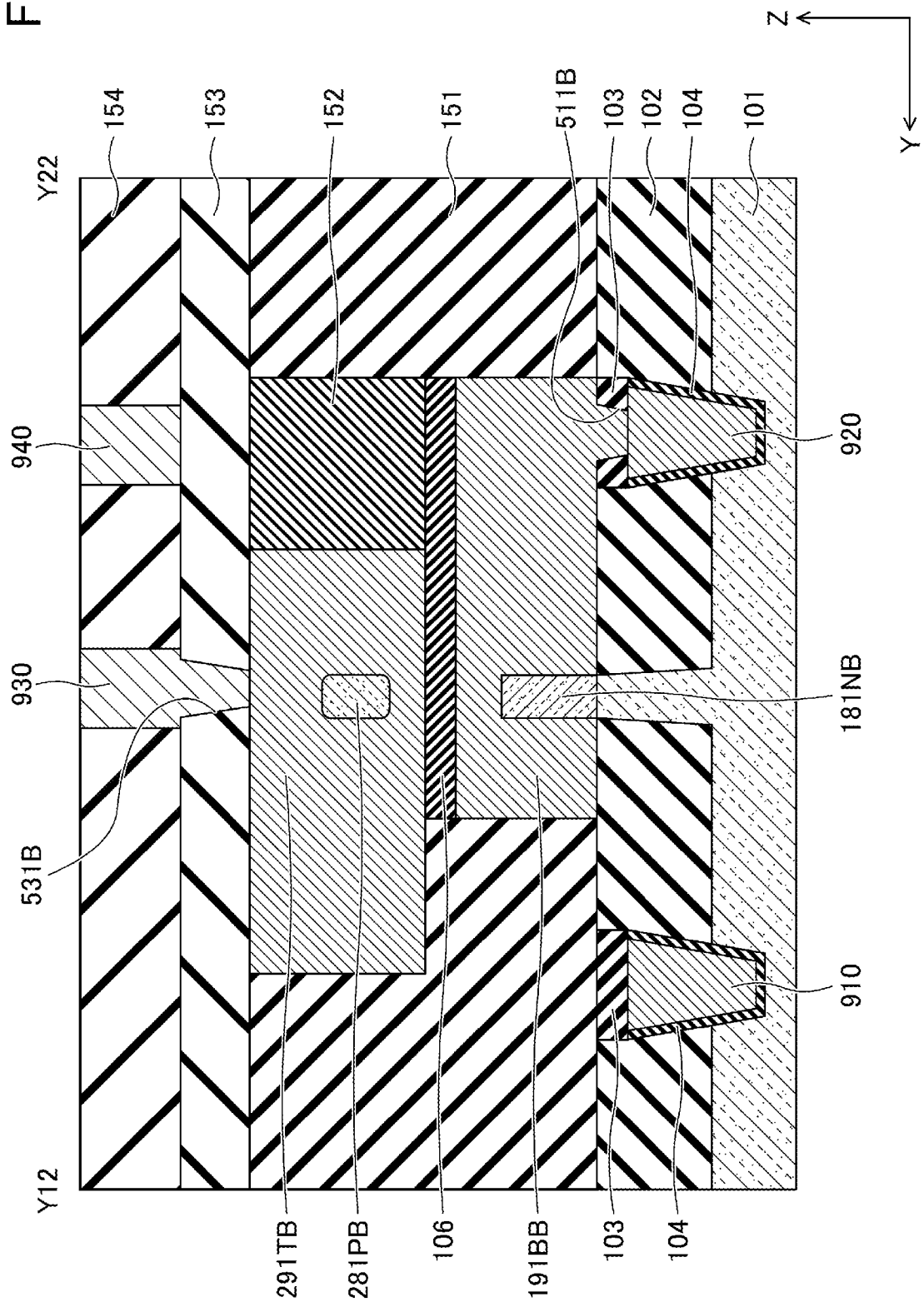
FIG. 8 is a cross-sectional view (Part 3) illustrating the standard cell area according to the first embodiment.
Figure 9:
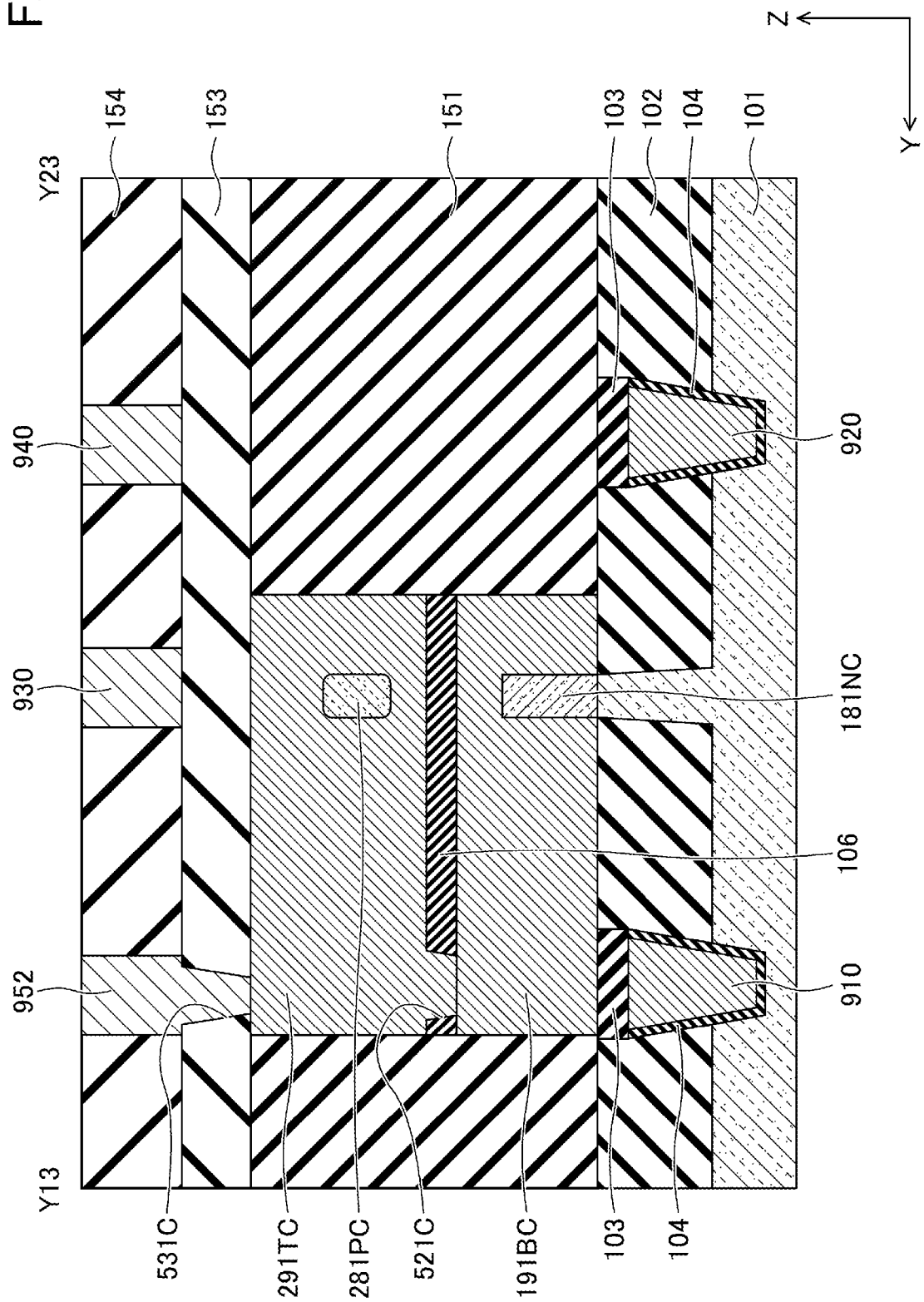
FIG. 9 is a cross-sectional view (Part 4) illustrating the standard cell area according to the first embodiment.
Figure 10:
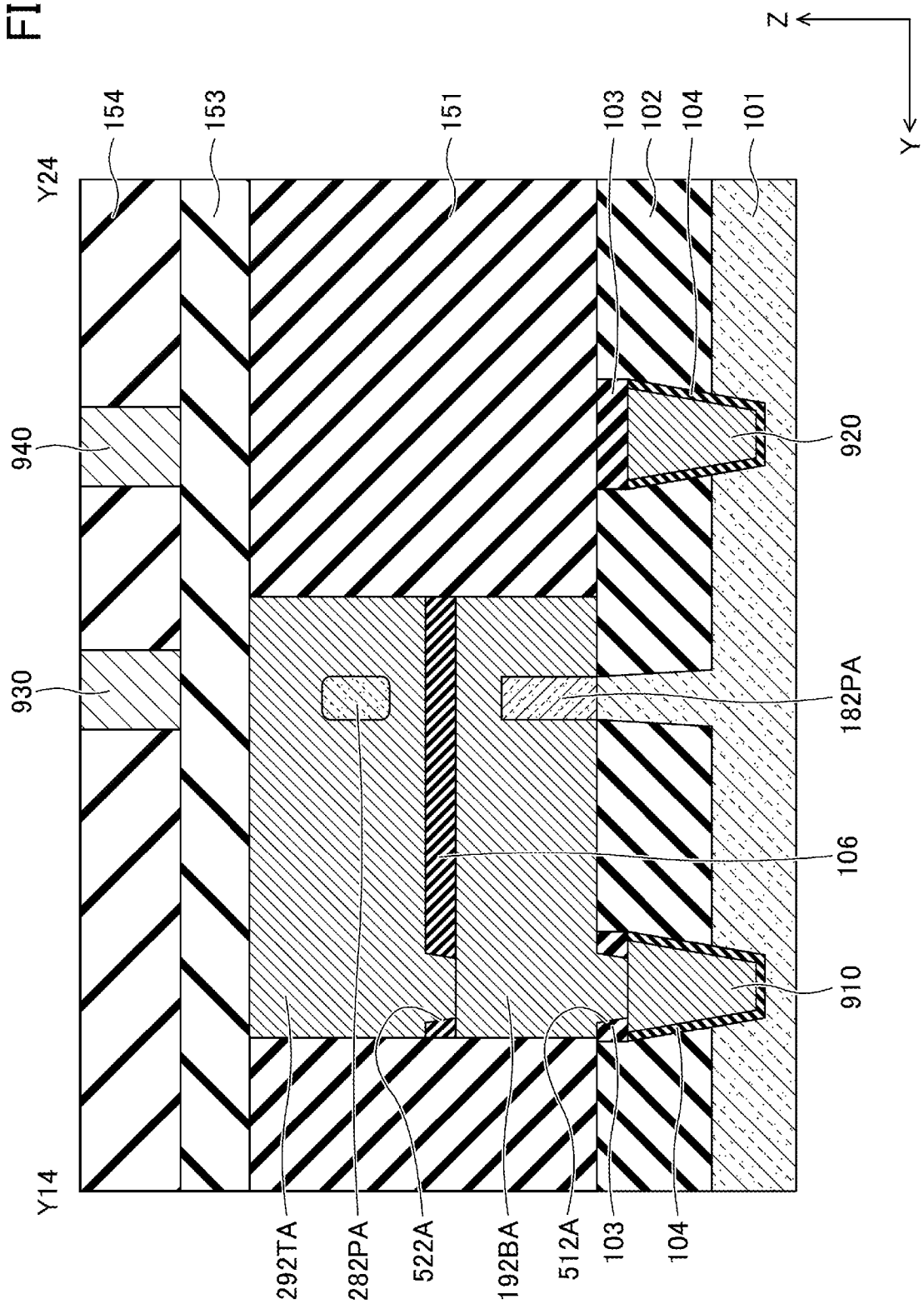
FIG. 10 is a cross-sectional view (Part 5) illustrating the standard cell area according to the first embodiment.
Figure 11:
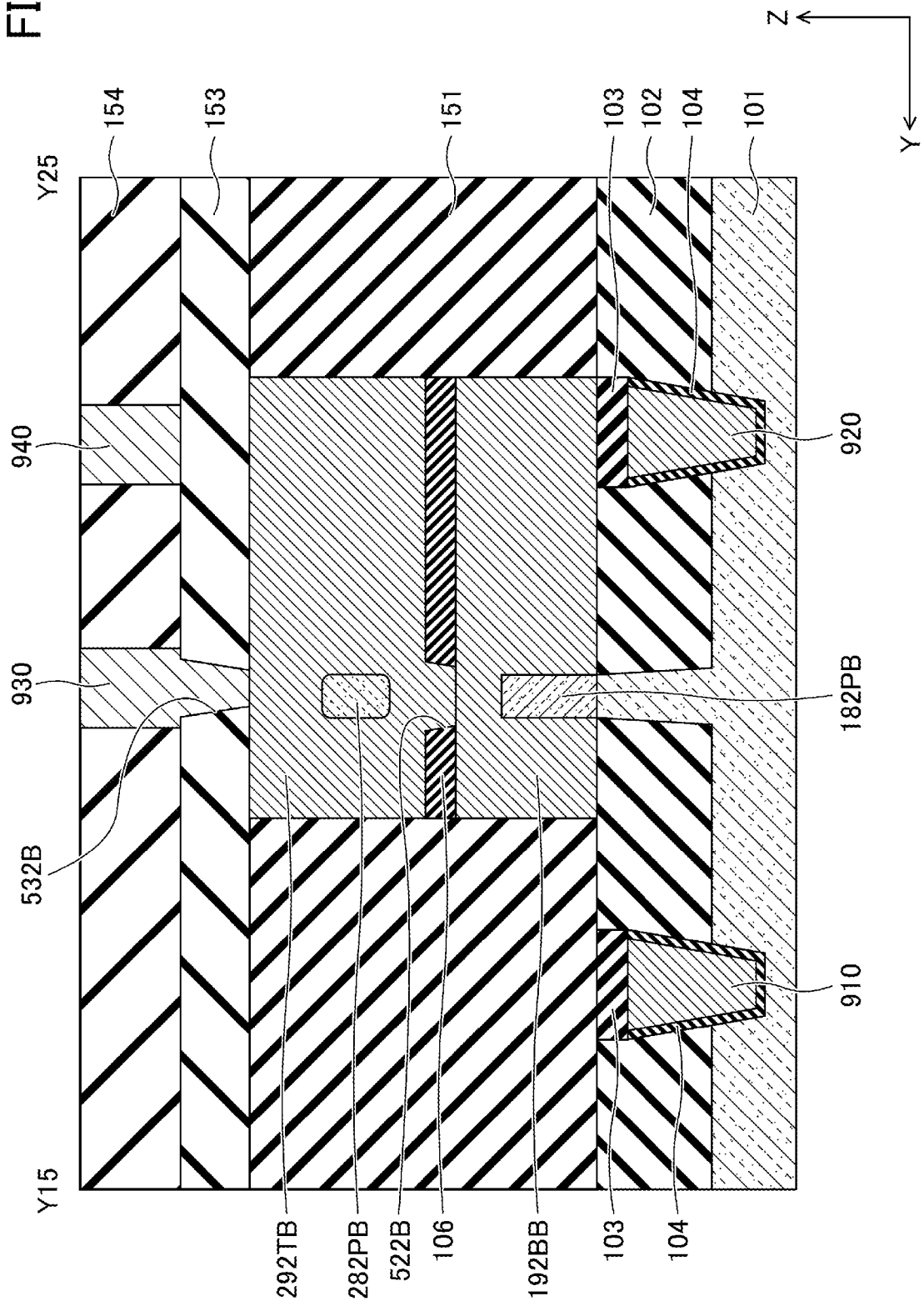
FIG. 11 is a cross-sectional view (Part 6) illustrating the standard cell area according to the first embodiment.
Figure 12:
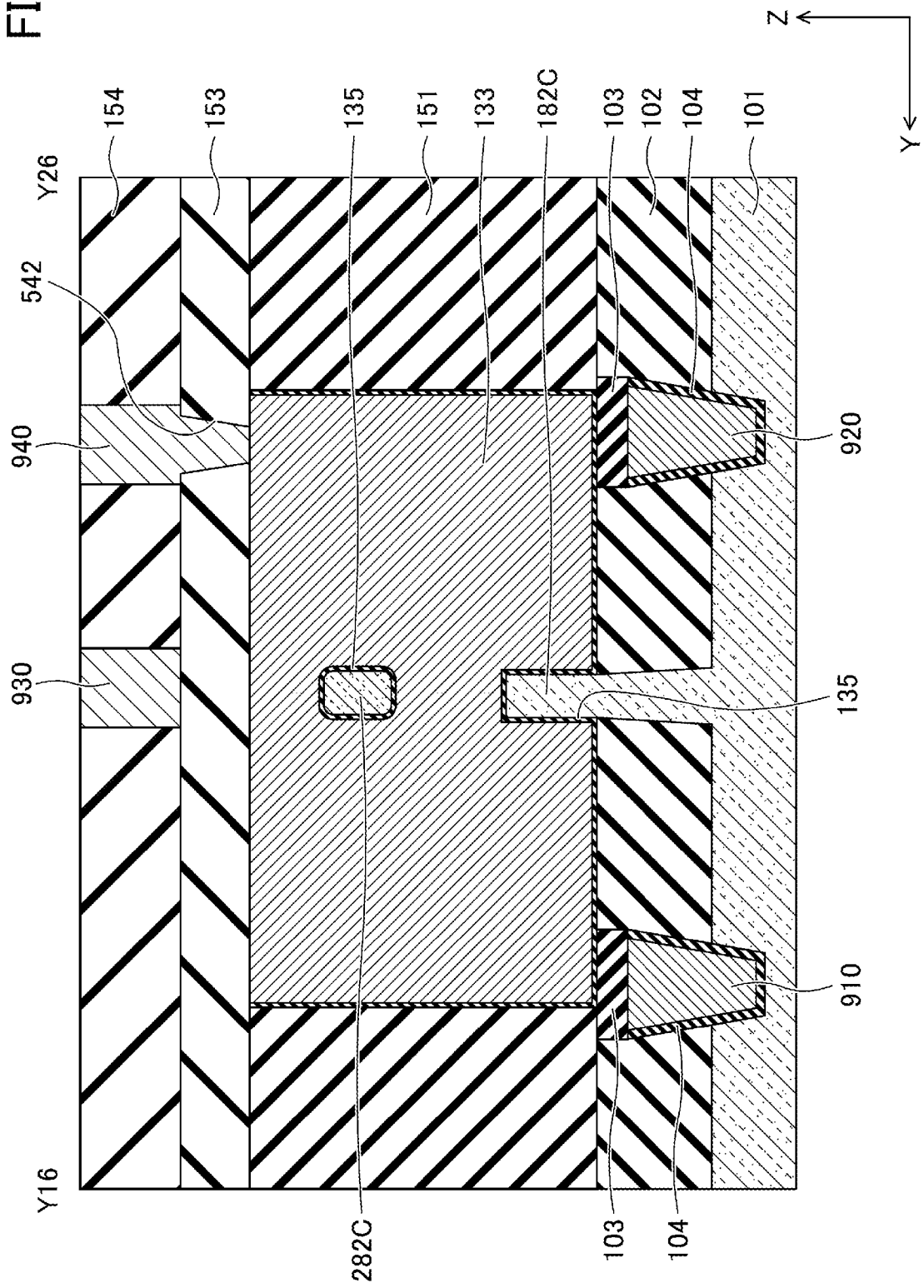
FIG. 12 is a cross-sectional view (Part 7) illustrating the standard cell area according to the first embodiment.

FIG. 4 and FIG. 5 are schematic views illustrating a planar configuration of a standard cell area 10 according to the first embodiment. FIG. 4 mainly illustrates a layout of the N-channel MOS transistor and the switch transistor 111 of the power supply switch control circuit 113. FIG. 5 mainly illustrates a layout of the P-channel MOS transistor and the switch transistor 112 of the power supply switch control circuit 113. Except for the structures illustrated in both FIG. 4 and FIG. 5, the structures illustrated in FIG. 5 are located above the structures illustrated in FIG. 4. FIG. 6 to FIG. 12 are cross-sectional views illustrating the standard cell area 10 according to the first embodiment. FIG. 6 corresponds to a cross-sectional view taken along line X11-X21 of FIG. 4 and FIG. 5. FIG. 7 corresponds to a cross-sectional view taken along line Y11-Y21 of FIG. 4 and FIG. 5. FIG. 8 corresponds to a cross-sectional view taken along line Y12-Y22 of FIG. 4 and FIG. 5. FIG. 9 corresponds to a cross-sectional view taken along line Y13-Y23 of FIG. 4 and FIG. 5. FIG. 10 corresponds to a cross-sectional view taken along line Y14-Y24 of FIG. 4 and FIG. 5. FIG. 11 corresponds to a cross-sectional view taken along line Y15-Y25 of FIG. 4 and FIG. 5. FIG. 12 corresponds to a cross-sectional view taken along line Y16-Y26 of FIG. 4 and FIG. 5.

As illustrated in FIG. 6 to FIG. 12, an element isolation film 102 is formed on the surface of the substrate 101. For example, the element isolation film 102 is formed by Shallow Trench Isolation (STI) process. On the substrate 101 and the element isolation film 102, multiple grooves extending in the X direction are formed, and the power supply lines 910 and 920 are formed in these grooves via an insulation film 104. For example, the surfaces of the power supply lines 910 and 920 are covered with an insulation film 103. For example, the surface of the element isolation film 102 and the surface of the insulation film 103 may be flush with the surface of the substrate 101, or do not have to be flush with the surface of the substrate 101. The power supply lines 910 and 920 having the above structure may be referred to as Buried Power Rail (BPR). For example, the power supply line 910 corresponds to the VVDD line, and the power supply line 920 corresponds to the VSS line.

As illustrated in FIG. 6 and the like, fins 181 and 182 extending in the X direction and rising in the Z direction are formed on the substrate 101 exposed from the element isolation film 102 between the power supply line 910 and the power supply line 920. The fin 181 is formed over the N-channel MOS transistor 1311N and the N-channel MOS transistor 1321N, and the fin 182 is formed on the switch transistor 111.

The fin 181 includes an N-type area 181NA, an N-type area 181NC, and an N-type area 181NB between the N-type area 181NA and the N-type area 181NC. The N-type area 181NA serves as a drain of the N-channel MOS transistor 1311N. The N-type area 181NC serves as a drain of the N-channel MOS transistor 1321N. The N-type area 181NB serves as a source of the N-channel MOS transistor 1311N and a source of the N-channel MOS transistor 1321N. The portion of the fin 181 between the N-type area 181NA and the N-type area 181NB becomes a channel 181C of the N-channel MOS transistor 1311N. The portion of the fin 181 between the N-type area 181NB and the N-type area 181NC becomes the channel 181C of the N-channel MOS transistor 1321N.

The fin 182 includes alternately arranged P-type areas 182PA and P-type areas 182PB. The P-type area 182PA serves as a drain of the switch transistor 111. The P-type area 182PB serves as a source of the switch transistor 111. The portion of the fin 182 between the P-type area 182PA and the P-type area 182PB serves as a channel 182C of the switch transistor 111. Although only one each of fins 181 and 182 is arranged respectively, for example, multiple fins 181 and 182 may be arranged in the Y direction. The number may be changed in the same manner in other embodiments and modifications.

As illustrated in FIG. 4 and the like, a local interconnect 191BA extending in the Y direction from the N-type area 181NA, a local interconnect 191BB extending in the Y direction from the N-type area 181NB, and a local interconnect 191BC extending in the Y direction from the N-type area 181NC are formed on the element isolation film 102 via an insulation film 105. The local interconnect 191BA and the local interconnect 191BB extend above the power supply line 920. The local interconnect 191BC extends above the power supply line 910.

As illustrated in FIG. 8, a contact hole 511B is formed in the insulation film 103 between the local interconnect 191BB and the power supply line 920. The local interconnect 191BB is connected to the power supply line 920 through a conductor in the contact hole 511B. The local interconnect 191BB electrically connects the power supply line 920 and the N-type area 181NB.

As illustrated in FIG. 4 and the like, the local interconnect 192BA extending in the Y direction from the P-type area 182PA and the local interconnect 192BB extending in the Y direction from the P-type area 182PB are formed on the element isolation film 102 via the insulation film 105. The local interconnect 192BA extends above the power supply line 910. The local interconnect 192BB extends above the power supply line 920.

As illustrated in FIG. 10, a contact hole 512A is formed in the insulation film 103 between the local interconnect 192BA and the power supply line 910. The local interconnect 192BA is connected to the power supply line 910 through a conductor in the contact hole 512A. The local interconnect 192BA electrically connects the power supply line 910 and the P-type area 182PA.

An insulation film 106 is formed on the local interconnects 191BA, 191BB, 191BC, 192BA, and 192BB.

As illustrated in FIG. 5 and the like, via the insulation film 106, a local interconnect 291TA is formed on the local interconnect 191BA, a local interconnect 291TB is formed on the local interconnect 191BB, and a local interconnect 291TC is formed on the local interconnect 191BC.

As illustrated in FIG. 7, a contact hole 521A is formed in the insulation film 106 between the local interconnect 291TA and the local interconnect 191BA above the power supply line 920. The local interconnect 291TA and the local interconnect 191BA are electrically connected to each other through a conductor in the contact hole 521A.

As illustrated in FIG. 9, a contact hole 521C is formed in the insulation film 106 between the local interconnect 291TC and the local interconnect 191BC above the power supply line 910. The local interconnect 291TC and the local interconnect 191BC are electrically connected to each other through a conductor in the contact hole 521C.

As illustrated in FIG. 8, the local interconnect 291TB and the local interconnect 191BB are electrically insulated and separated from each other by the insulation film 106.

As illustrated in FIG. 5 and the like, via the insulation film 106, a local interconnect 292TA is formed on the local interconnect 192BA and a local interconnect 292TB is formed on the local interconnect 192BB. As illustrated in FIG. 10, a contact hole 522A is formed in the insulation film 106 between the local interconnect 292TA and the local interconnect 192BA above the power supply line 910. The local interconnect 292TA and the local interconnect 192BA are electrically connected to each other through a conductor in the contact hole 522A.

As illustrated in FIG. 11, a contact hole 522B is formed in the insulation film 106 between the local interconnect 292TB and the local interconnect 192BB above the P-type area 182PB. The local interconnect 292TB and the local interconnect 192BB are electrically connected to each other through a conductor in the contact hole 522B.

As illustrated in FIG. 5 and FIG. 6, a semiconductor area 281 extending in the X direction and overlapping the local interconnects 291TA, 291TB, and 291TC in a plan view is provided above the fin 181. A semiconductor area 282 extending in the X direction and overlapping the local interconnect 292TA and the local interconnect 292TB in a plan view is provided above the fin 182. Although only one each of semiconductor areas 281 and 282 is arranged, for example, multiple semiconductor areas 281 and 282 may be arranged in the Y direction. The number may be changed in the same manner in other embodiments and modifications.

As illustrated in FIG. 6 and the like, the semiconductor area 281 includes a P-type area 281PA, a P-type area 281PC, and a P-type area 281PB between the P-type area 281PA and the P-type area 281PC. The P-type area 281PA serves as a drain of the P-channel MOS transistor 1311P. The P-type area 281PC serves as a drain of the P-channel MOS transistor 1321P. The P-type area 281PB serves as a source of the P-channel MOS transistor 1311P and a source of the P-channel MOS transistor 1321P. The portion of the semiconductor area 281 between the P-type area 281PA and the P-type area 281PB becomes a channel 281C of the P-channel MOS transistor 1311P. The portion of the semiconductor area 281 between the P-type area 281PB and the P-type area 281PC becomes the channel 281C of the P-channel MOS transistor 1321P.

The semiconductor area 282 includes alternately arranged P-type areas 282PA and P-type areas 282PB. The P-type area 282PA serves as a drain of the switch transistor 112. The P-type area 282PB serves as a source of the switch transistor 112. The portion of the semiconductor area 282 between the P-type area 282PA and the P-type area 282PB becomes a channel 282C of the switch transistor 112.

As illustrated in FIG. 4 to FIG. 6 and the like, a gate electrode 131 both of the N-channel MOS transistor 1311N and the P-channel MOS transistor 1311P is formed between a laminate of the local interconnect 191BA and the local interconnect 291TA and a laminate of the local interconnect 191BB and the local interconnect 291TB. A gate electrode 132 both of the N-channel MOS transistor 1321N and the P-channel MOS transistor 1321P is formed between a laminate of the local interconnect 191BC and the local interconnect 291TC and a laminate of the local interconnect 191BB and the local interconnect 291TB. A gate electrode 133 both of the switch transistor 111 and the switch transistor 112 is formed between a laminate of the local interconnect 192BA and the local interconnect 292TA and a laminate of the local interconnect 192BB and the local interconnect 292TB.

A gate insulation film 135 is formed between the gate electrode 133 and the fin 182, and between the gate electrode 133 and the semiconductor area 282. The gate insulation film 135 is also formed between the gate electrode 131 and the fin 181, between the gate electrode 131 and the fin 182, between the gate electrode 132 and the fin 181, and between the gate electrode 132 and the fin 182.

As illustrated in FIG. 6 and the like, an insulation film 151 is formed above the substrate 101 and the element isolation film 102. The local interconnects 191BA, 191BB, 191BC, 192BA, 192BB, 291TA, 291TB, 291TC, 292TA, and 292TB, and the gate electrodes 131 to 133 are embedded in the insulation film 151. Further, as illustrated in FIG. 8, in a plan view, the local interconnect 291TB does not reach the edge of the local interconnect 191BB on the power supply line 920 side. An insulation film 152 is formed on the insulation film 106 between the edge of the local interconnect 291TB and the edge of the local interconnect 191BB with respect to the power supply line 920 side.

An insulation film 153 is formed on the insulation films 151 and 152, the local interconnects 291TA, 291TB, 291TC, 292TA, and 292TB, and the gate electrodes 131 to 133, and an insulation film 154 is formed on the insulation film 153.

As illustrated in FIG. 5 and FIG. 8, a contact hole 531B reaching the local interconnect 291TB is formed in the insulation film 153 above the N-type area 181NB and the P-type area 281PB. As illustrated in FIG. 5 and FIG. 9, a contact hole 531C reaching the local interconnect 291TC is formed in the insulation film 153 above the power supply line 910. As illustrated in FIG. 5, a contact hole 541A reaching the gate electrode 131 is formed in the insulation film 153 above the power supply line 910. As illustrated in FIG. 5 and FIG. 11, a contact hole 532B reaching the local interconnect 292TB is formed in the insulation film 153 above the P-type area 182PB and the P-type area 282PB. As illustrated in FIG. 5 and FIG. 12, a contact hole 542 reaching the gate electrode 133 is formed in the insulation film 153 above the power supply line 920. A contact hole 531A reaching the local interconnect 291TA is formed in the insulation film 153 above the power supply line 920. A contact hole 541B reaching the gate electrode 132 is formed in the insulation film 153 above the power supply line 920.

As illustrated in FIG. 5 and the like, above the power supply line 910, a signal line 951 connected to the gate electrode 131 through a conductor in the contact hole 541A is formed in the insulation film 154, and a signal line 952 connected to the local interconnect 291TC through a conductor in the contact hole 531C is formed in the insulation film 154. The signal lines 951 and 952 extend in the X direction. An input signal IN to the inverter 1310 is input to the signal line 951, and an output signal OUT from the inverter 1320 is output from the signal line 952.

Above the power supply line 920, a control signal line 940 is formed in the insulation film 154. The control signal line 940 is connected to the local interconnect 291TA through a conductor in the contact hole 531A. The control signal line 940 is connected to the gate electrode 132 through a conductor in the contact hole 541B. The control signal line 940 is connected to the gate electrode 133 through a conductor in the contact hole 542. The control signal line 940 extends in the X direction. A control signal is transmitted from the power supply switch control circuit 113 to the switch transistors 111 and 112 through the control signal line 940.

In the Y direction, a power supply line 930 is arranged between the signal lines 951 and 952 and the control signal line 940. The power supply line 930 is formed in the insulation film 154. The power supply line 930 is connected to the local interconnect 291TB through a conductor in the contact hole 531B, and is connected to the local interconnect 292TB through a conductor in the contact hole 532B. The power supply line 930 corresponds to, for example, the VDD line.

For example, the power supply lines 910 and 920 may be made of ruthenium (Ru), cobalt (Co), tungsten (W), or the like. For example, the power supply line 930, the control signal line 940, and the signal lines 951 to 952 may be made of copper (Cu), ruthenium (Ru), cobalt (Co), or the like. When copper or cobalt is used, it is preferable to form a conductive base film (barrier metal film), for example, a tantalum (Ta) film or tantalum nitride (TaN) film. On the other hand, when ruthenium is used, the base film is not required to be formed.

For example, the local interconnect may be made of copper (Cu), ruthenium (Ru), cobalt (Co), tungsten (W), or the like. When copper, cobalt, or tungsten is used, it is preferable to form a conductive base film (barrier metal film), for example, a titanium (Ti) film or a titanium nitride (TiN) film. On the other hand, when ruthenium is used, the base film is not required to be formed. For example, for the conductive film (via) in the contact hole, for example, a material similar to the material for local interconnect, or a material similar to the material for the power supply line 930, the control signal line 940, and the signal lines 951-952 may be used.

For example, a semiconductor such as silicon (Si) may be used for the substrate 101. For example, the fins 181 and 182 may be formed by patterning the substrate 101. A silicide of a high melting point metal such as nickel (Ni) or cobalt (Co) may be provided at a portion of the fins 181 and 182 in contact with the local interconnect. For example, semiconductor nanowires such as silicon (Si) may be used for channels of the semiconductor areas 281 and 282. Further, semiconductors such as Si, silicon carbide (SiC), and silicon germanium (SiGe) obtained epitaxially grown from the edge of the nanowires of the channel may be used in the P-type area and N-type area of the semiconductor areas 281 and 282.

For example, conductive materials such as titanium (Ti), titanium nitride (TiN), and polycrystalline silicon (polySi) may be used for the gate electrodes 131 to 133. For example, a high-dielectric material such as hafnium oxide, aluminum oxide, hafnium, and aluminum oxide may be used for the gate insulation film.

For example, the power supply line 930, the control signal line 940, and the signal lines 951 to 952 are formed by a dual damascene method together with the contact holes arranged below them. Further, the power supply line 930, the control signal line 940, and the signal lines 951 to 952 may be formed by a single damascene method separately from the contact holes arranged below them. Further, the power supply lines 910 and 920 may be arranged above the transistors of the power supply switch circuit 110 and the power supply switch control circuit 113, for example. These changes may be applied to other embodiments and modifications.

In the first embodiment, the inverters 1310 and 1320 include the CFET. Further, although the switch transistors 111 and 112 are both P-channel MOS transistors, the switch transistors 111 and 112 have a laminated structure like the CFET. According to the first embodiment, the power supply switch circuit 110 can be implemented by using the CFET. Therefore, further miniaturization of semiconductor devices can be implemented.

First Modification of First Embodiment

Figure 13:
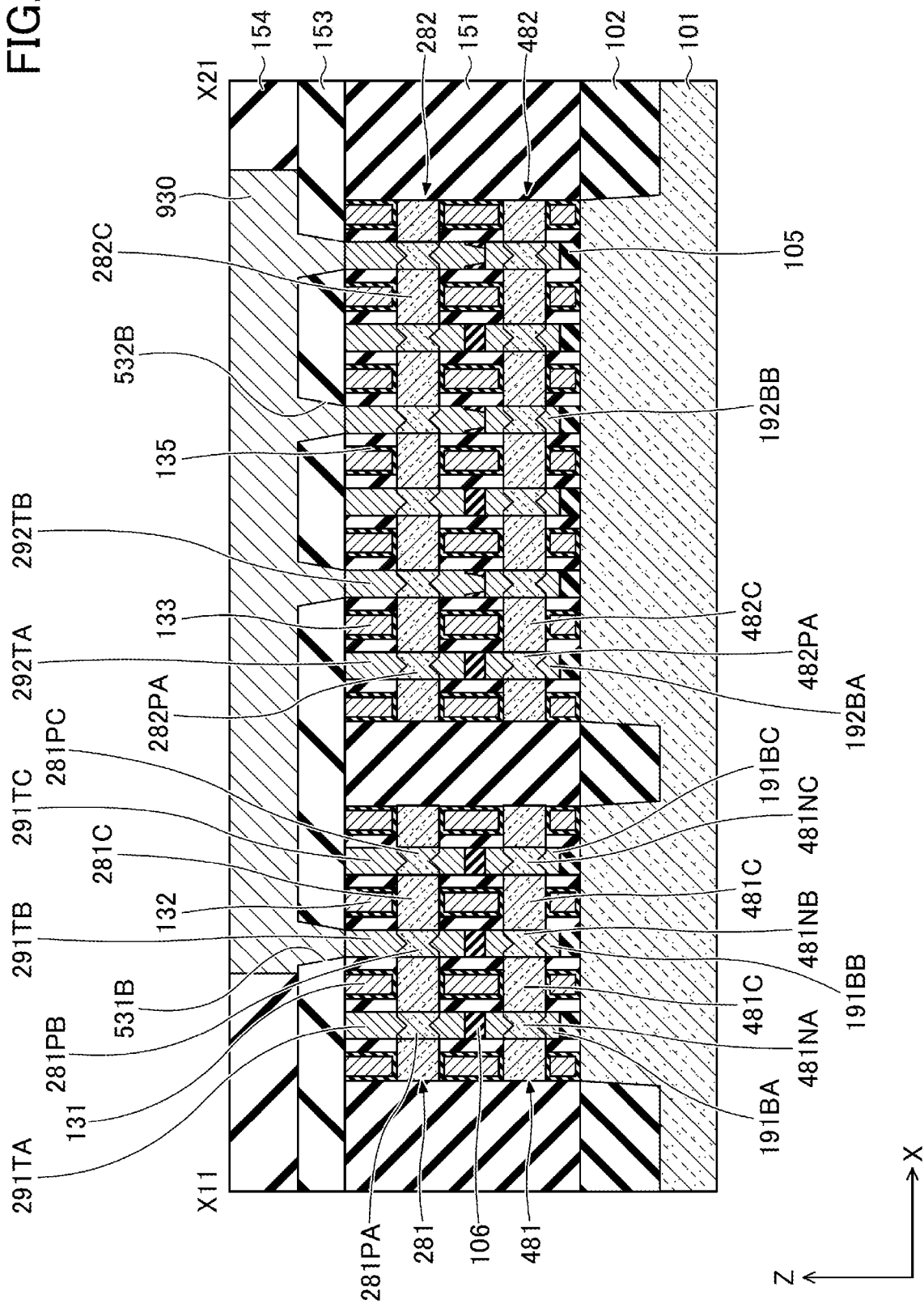
FIG. 13 is a cross-sectional view (Part 1) illustrating a standard cell area according to a first modification of the first embodiment.
Figure 14:
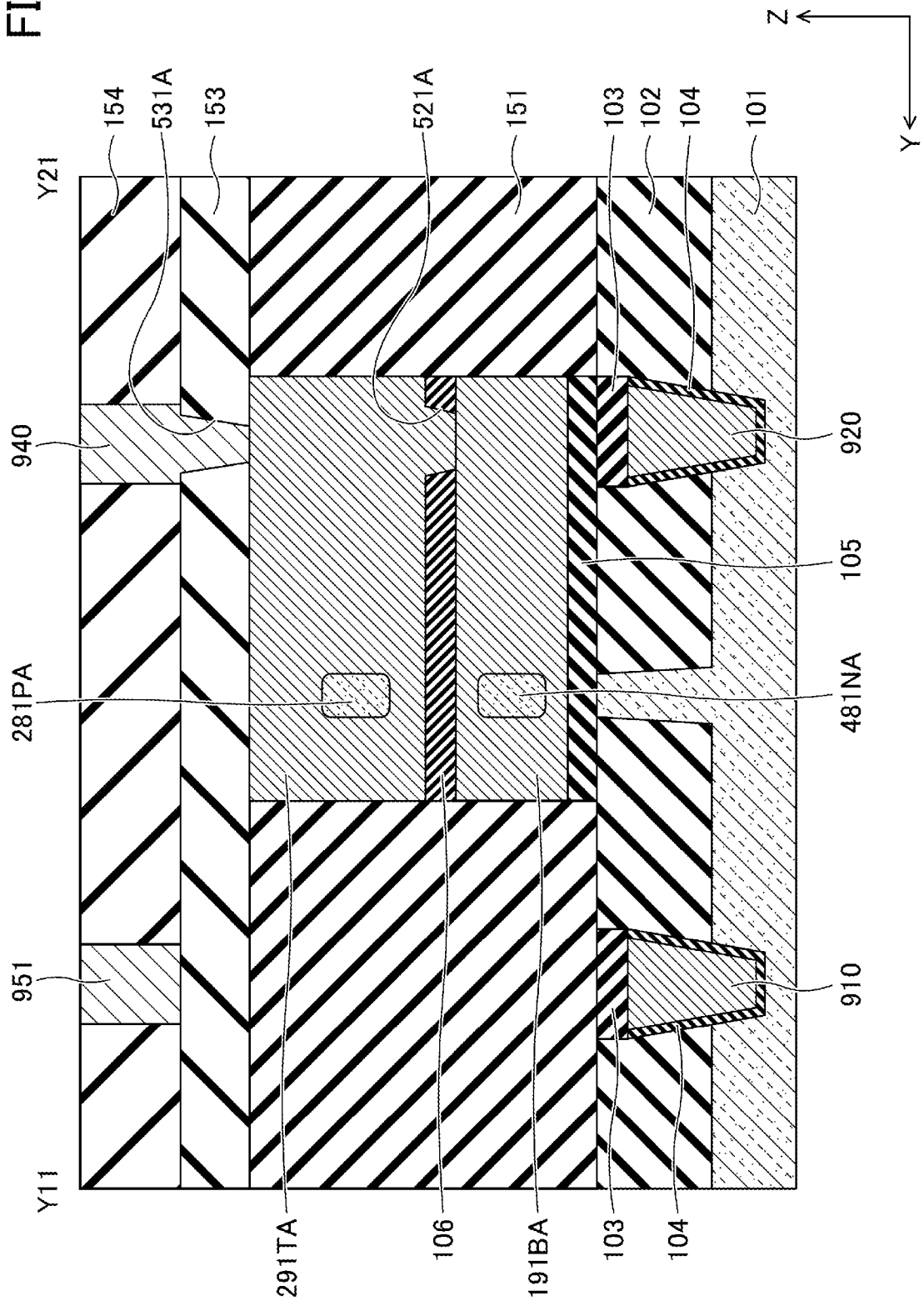
FIG. 14 is a cross-sectional view (Part 2) illustrating the standard cell area according to the first modification of the first embodiment.
Figure 15:
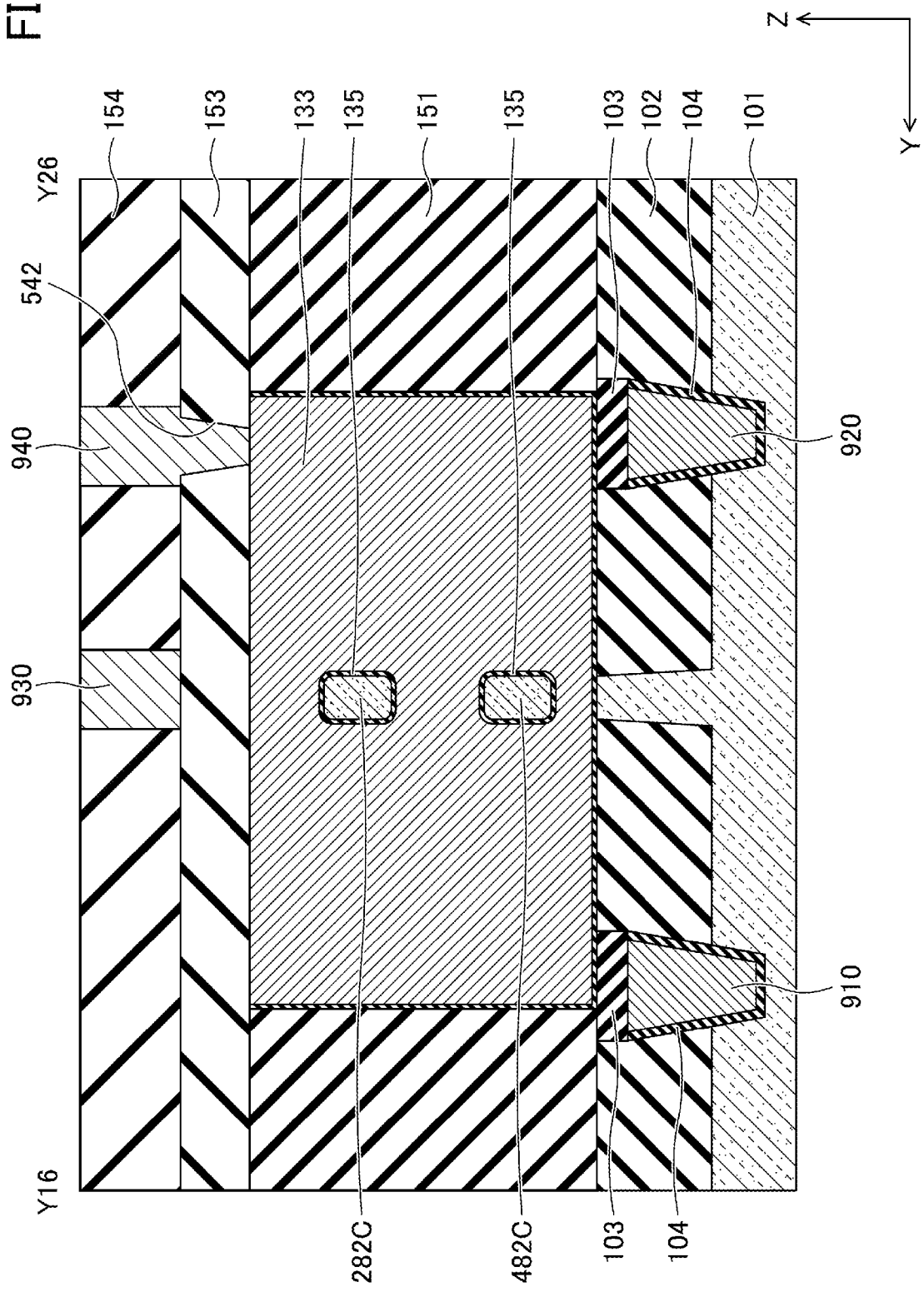
FIG. 15 is a cross-sectional view (Part 3) illustrating the standard cell area according to the first modification of the first embodiment.

Next, a first modification of the first embodiment will be described. The first modification is different from the first embodiment in that nanowires are used instead of the fins for the N-channel MOS transistors 1311N and 1321N and the switch transistor 111. FIGS. 13 to 15 are cross-sectional views illustrating a standard cell area 10 according to the first modification of the first embodiment. FIG. 13 corresponds to a cross-sectional view taken along line X11-X21 in FIG. 4 and FIG. 5. FIG. 14 corresponds to a cross-sectional view taken along line Y11-Y21 in FIG. 4 and FIG. 5. FIG. 15 corresponds to a cross-sectional view taken along line Y16-Y26 in FIG. 4 and FIG. 5.

In the first modification, as illustrated in FIG. 13 to FIG. 15, an insulation film 105 is formed between the lower surfaces of the local interconnects 191BA, 191BB, 191BC, 192BA, and 192BB and the upper surface of the substrate 101. Below the semiconductor area 281, a semiconductor area 481 extending in the X direction and overlapping the local interconnects 191BA, 191BB, and 191BC in a plan view is provided. Below the semiconductor area 282, a semiconductor area 482 extending in the X direction and overlapping the local interconnects 192BA and 192BB in a plan view is provided.

The semiconductor area 481 includes an N-type area 481NA, an N-type area 481NC, and an N-type area 481NB between the N-type area 481NA and the N-type area 481NC. The N-type area 481NA serves as a drain of the N-channel MOS transistor 1311N. The N-type area 481NC serves as a drain of the N-channel MOS transistor 1321N. The N-type area 481NB serves as a source of the N-channel MOS transistor 1311N and a source of the N-channel MOS transistor 1321N. The portion of the semiconductor area 481 between the N-type area 481NA and the N-type area 481NB becomes a channel 481C of the N-channel MOS transistor 1311N. The portion of the semiconductor area 481 between the N-type area 481NB and the N-type area 481NC becomes a channel 481C of the N-channel MOS transistor 1321N.

The semiconductor area 482 includes alternately arranged P-type areas 482PA and P-type areas 482PB. The P-type area 482PA serves as a drain of the switch transistor 111. The P-type area 482PB serves as a source of the switch transistor 111. The portion of the semiconductor area 482 between the P-type area 482PA and the P-type area 482PB serves as a channel 482C of the switch transistor 111.

For example, semiconductor nanowires such as silicon (Si) may be used for channels of the semiconductor areas 481 and 482. Further, semiconductors such as Si, silicon carbide (SiC), and silicon germanium (SiGe) obtained epitaxially grown from the edge of the nanowires of the channel may be used in the P-type area and N-type area of the semiconductor areas 481 and 482.

Other configurations are the same as in the first embodiment.

The same effect as that of the first embodiment can be obtained by the first modification. The semiconductor areas 481 and 482 may be used instead of the fins 181 and 182 in other embodiments and modifications. Further, the fins 181 and 182 may be used instead of the semiconductor areas 481 and 482.

Second Modification of First Embodiment

Figure 16:
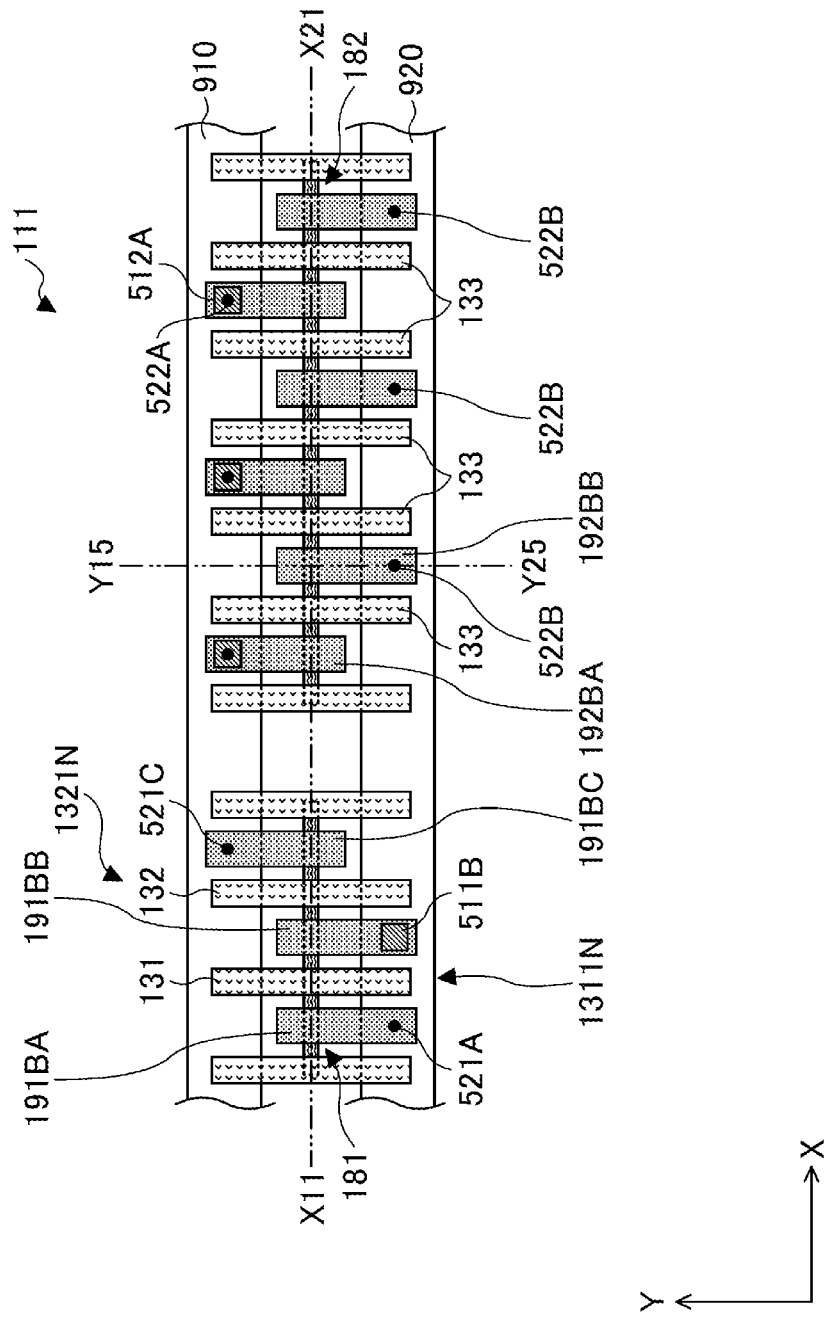
FIG. 16 is a schematic view illustrating a planar configuration of a standard cell area according to a second modification of the first embodiment.
Figure 17:
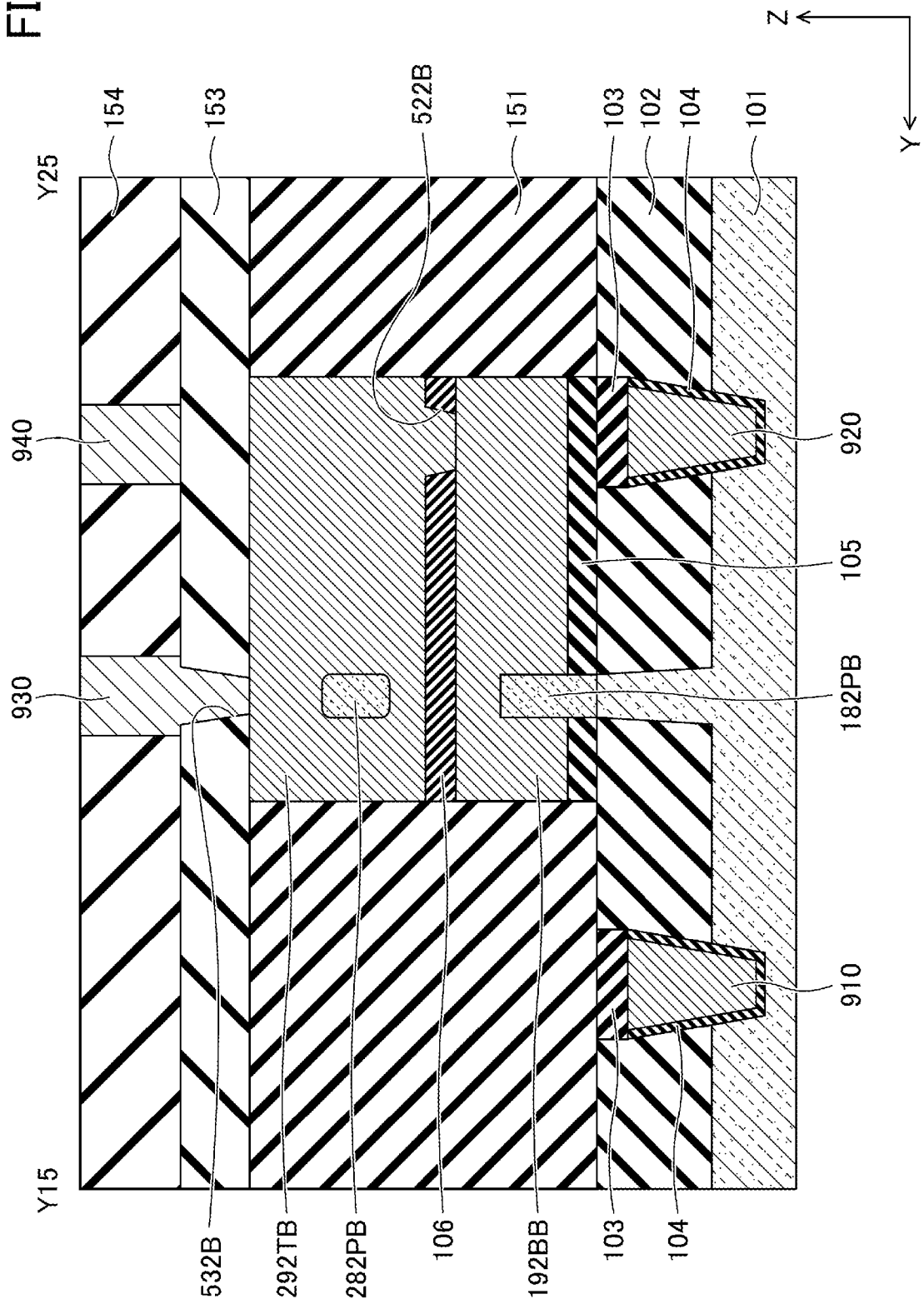
FIG. 17 is a cross-sectional view illustrating the standard cell area according to the second modification of the first embodiment.

Next, a second modification of the first embodiment will be described. The second modification is different from the first embodiment in the arrangement of the contact hole 522B. FIG. 16 is a schematic view illustrating a planar configuration of a standard cell area according to the second modification of the first embodiment. FIG. 16 mainly illustrates a layout of the N-channel MOS transistor of the power supply switch control circuit 113 and the switch transistor 111. FIG. 17 is a cross-sectional view illustrating the standard cell area according to the second modification of the first embodiment. FIG. 17 corresponds to a cross-sectional view taken along line Y15-Y25 in FIG. 16.

In the second modification, as illustrated in FIG. 16 to FIG. 17, a contact hole 522B is located above the power supply line 920. Other configurations are the same as in the first embodiment.

The same effect as that of the first embodiment can be obtained by the second modification.

Further, in the second modification, since the contact hole 522B deviates from the semiconductor area 282 in a plan view, the contact hole 522B can be formed without protecting the semiconductor area 282 with a protective film or the like. Therefore, the manufacturing process can be simplified.

Third Modification of First Embodiment

Figure 18:
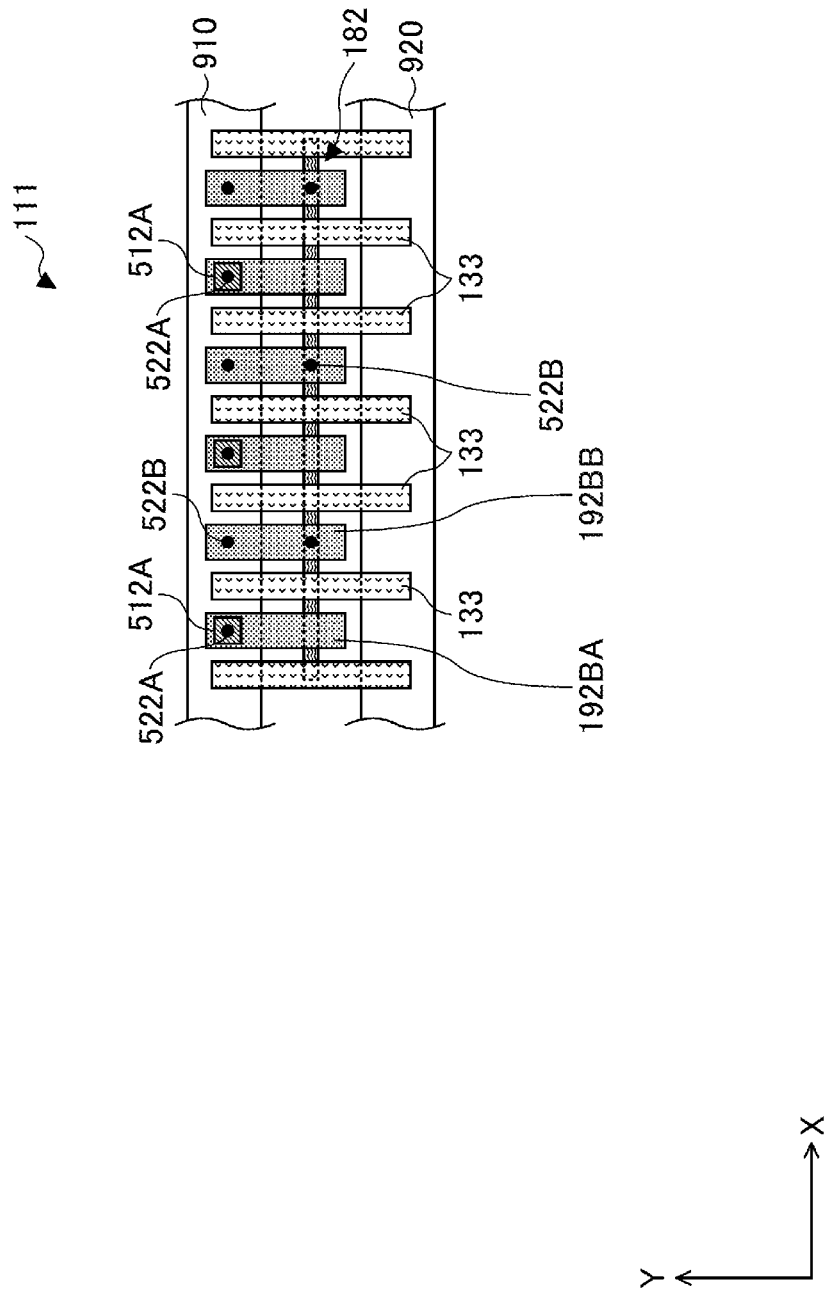
FIG. 18 is a schematic view (Part 1) illustrating a planar configuration of a switch transistor according to a third modification of the first embodiment.
Figure 19:
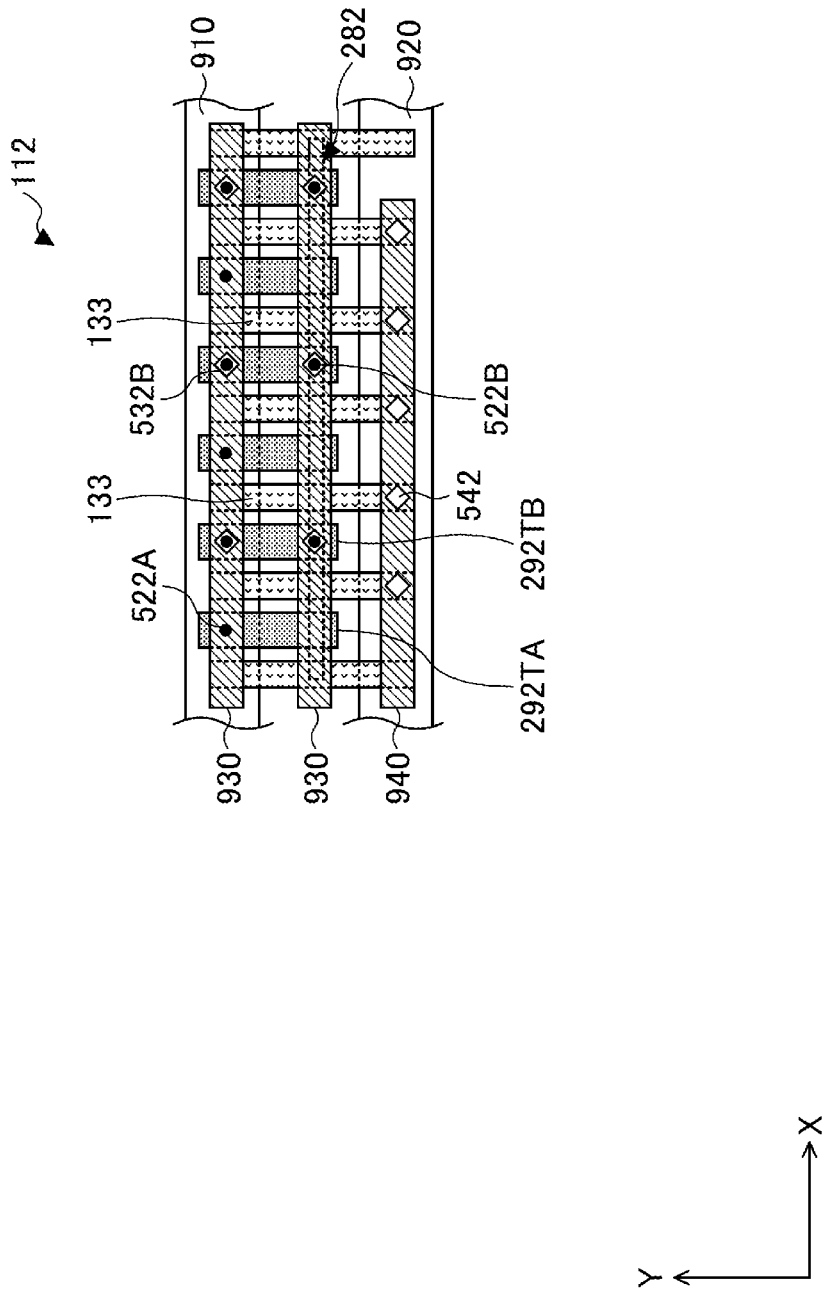
FIG. 19 is a schematic view (Part 2) illustrating a planar configuration of the switch transistor according to the third modification of the first embodiment.

Next, a third modification of the first embodiment will be described. The third modification is different from the first embodiment in the configuration of the switch transistors 111 and 112. FIG. 18 and FIG. 19 are schematic views illustrating a planar configuration of switch transistors 111 and 112 according to the third modification of the first embodiment. FIG. 18 mainly illustrates a layout of the switch transistor 111. FIG. 19 mainly illustrates a layout of the switch transistor 112. Except for the structures illustrated in both FIG. 18 and FIG. 19, the structures illustrated in FIG. 19 are located above the structures illustrated in FIG. 18.

In the third modification, as illustrated in FIG. 18, a local interconnect 192BB extends from the P-type area 182PA to above the power supply line 910, similarly to the local interconnect 192BA. A contact hole 522B is also formed above the power supply line 910. As illustrated in FIG. 19, a contact hole 532B is also formed above the power supply line 910. A power supply line 930 connected to the local interconnect 292TB through a conductor in the contact hole 532B is also formed above the power supply line 910. For example, the power supply line 930 above the power supply line 910 is connected to the power supply line 930 above the fins 182 via an upper wiring layer. That is, in the third modification, the power supply line 930, which is a part of the VDD line, is divided into multiple parts to be connected to the source of the switch transistor 112. The power supply lines 930 divided into multiple parts are electrically connected to each other. Other configurations are the same as in the first embodiment.

The same effect as that of the first embodiment can be obtained by the third modification. Further, by arranging the power supply line 930 in multiple parts, the supply of the VDD potential can be dispersed, and current channeling can be controlled. Further, since the resistance of the entire power supply line 930 is reduced by dividing the power supply line 930, a decrease in the potential supplied through the power supply line 930 can be reduced. In another embodiment or modification, the power supply line 930 may be divided into multiple parts and connected to the source of the switch transistor 112.

Fourth Modification of First Embodiment

Figure 20:
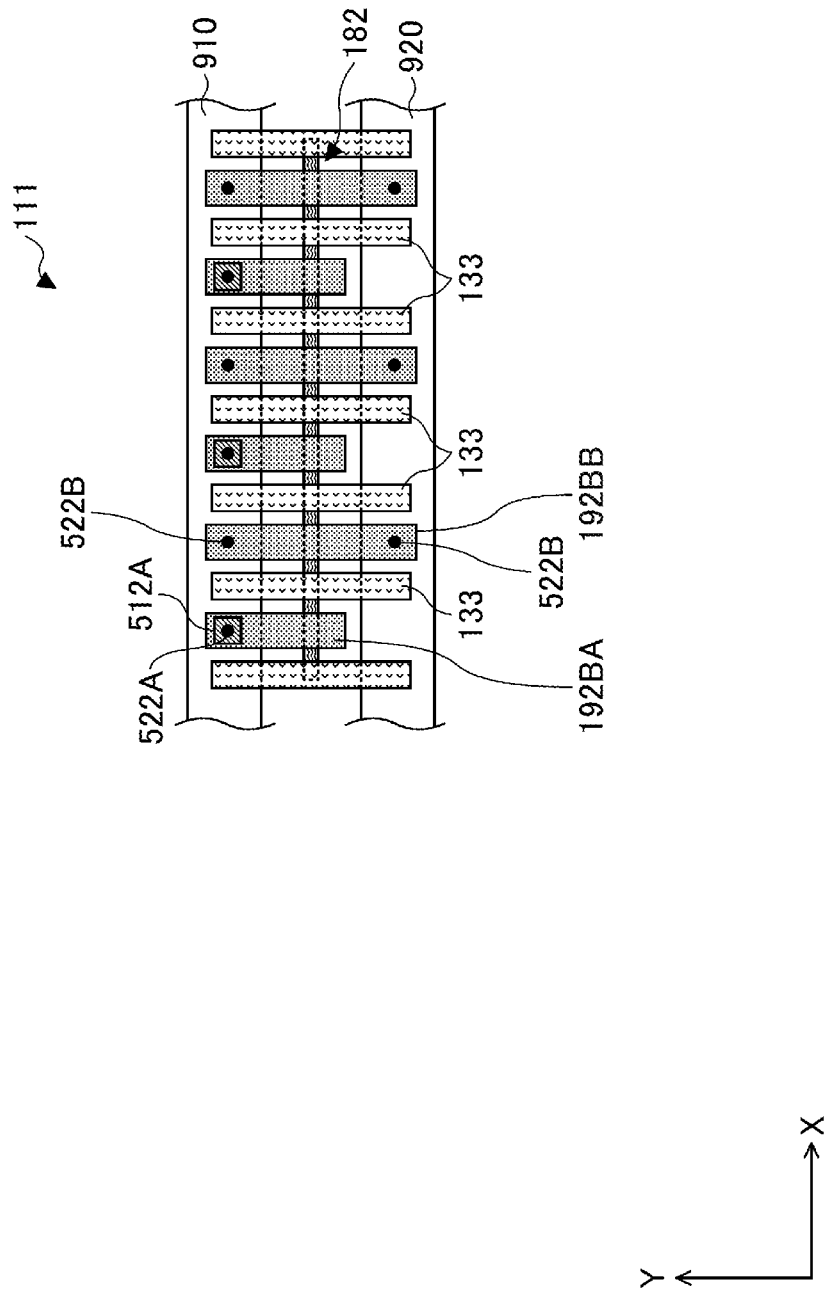
FIG. 20 is a schematic view (Part 1) illustrating a planar configuration of a switch transistor according to a fourth modification of the first embodiment.
Figure 21:
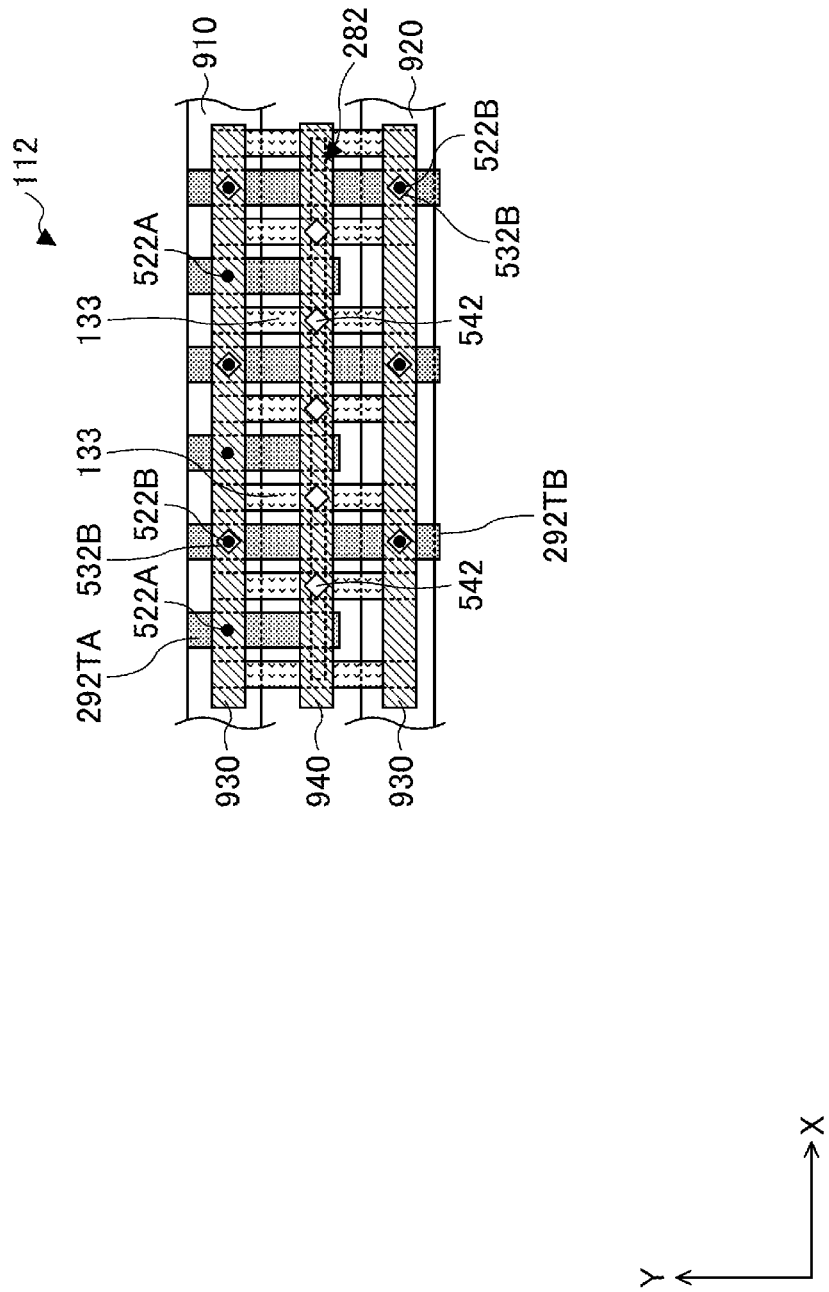
FIG. 21 is a schematic view (Part 2) illustrating a planar configuration of the switch transistor according to the fourth modification of the first embodiment.

Next, a fourth modification of the first embodiment will be described. The fourth modification is different from the first embodiment in the configuration of the switch transistors 111 and 112. FIG. 20 and FIG. 21 are schematic views illustrating a planar configuration of switch transistors 111 and 112 according to the fourth modification of the first embodiment. FIG. 20 mainly illustrates a layout of the switch transistor 111. FIG. 21 mainly illustrates a layout of the switch transistor 112. Except for the structures illustrated in both FIG. 20 and FIG. 21, the structures illustrated in FIG. 21 are located above the structures illustrated in FIG. 20.

In the fourth modification, as illustrated in FIG. 20, a local interconnect 192BB extends from above the power supply line 910 to above the power supply line 920. A contact hole 522B is located above the power supply line 910 and above the power supply line 920. As illustrated in FIG. 21, a contact hole 532B is located above the power supply line 910 and above the power supply line 920, and a contact hole 542 is located above the semiconductor area 282. A power supply line 930 is formed above the power supply lines 910 and 920, and a control signal line 940 is formed above the semiconductor area 282. A control signal line 940 is connected to the gate electrode 133 through a conductor in the contact hole 542 above the semiconductor area 282. Other configurations are the same as in the third modification.

The same effect as that of the first embodiment can be obtained by the fourth modification. Further, since the contact hole 532B and the contact hole 522B overlap in a plan view, the resistance between the power supply line 930 and the local interconnect 192BB can be reduced.

Fifth Modification of First Embodiment

Figure 22:
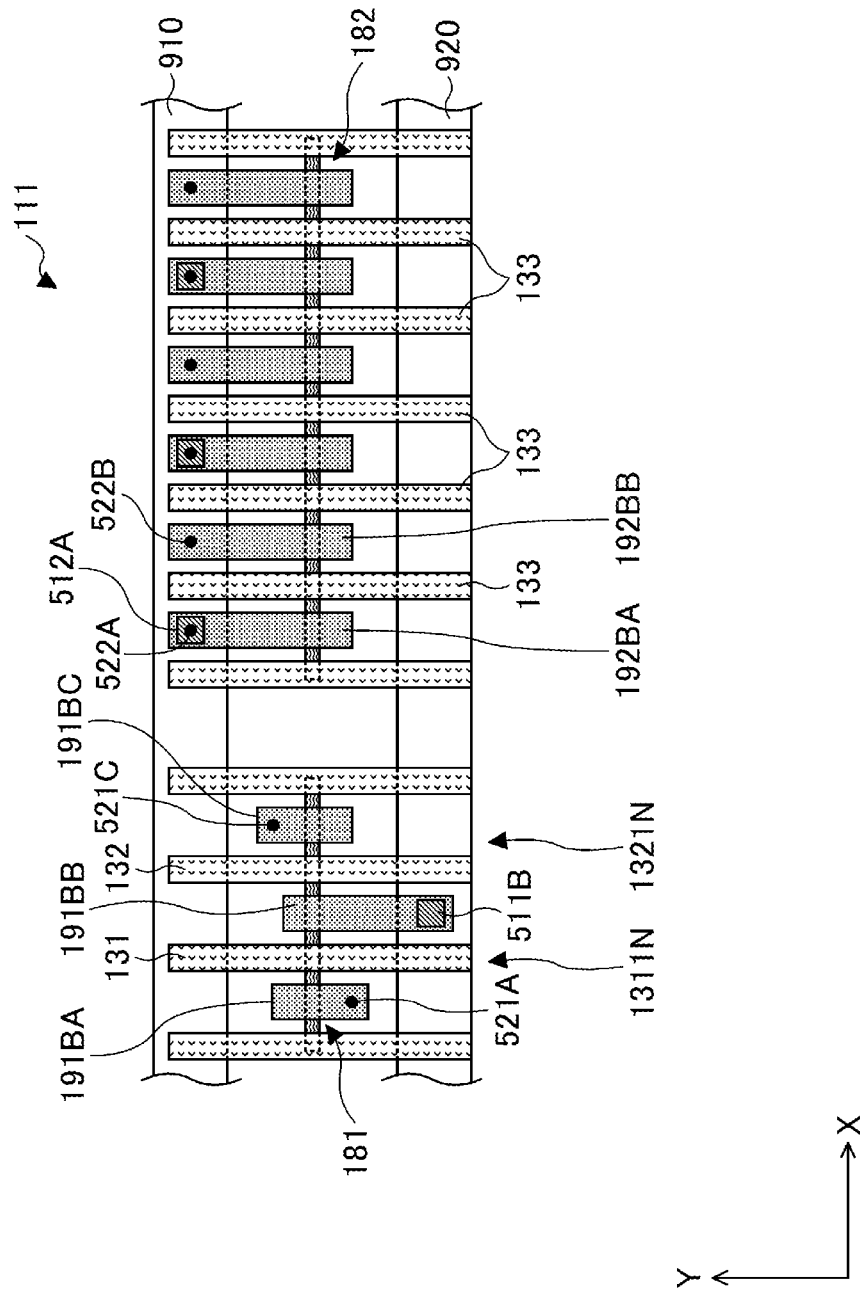
FIG. 22 is a schematic view (Part 1) illustrating a planar configuration of a standard cell area according to a fifth modification of the first embodiment.
Figure 23:
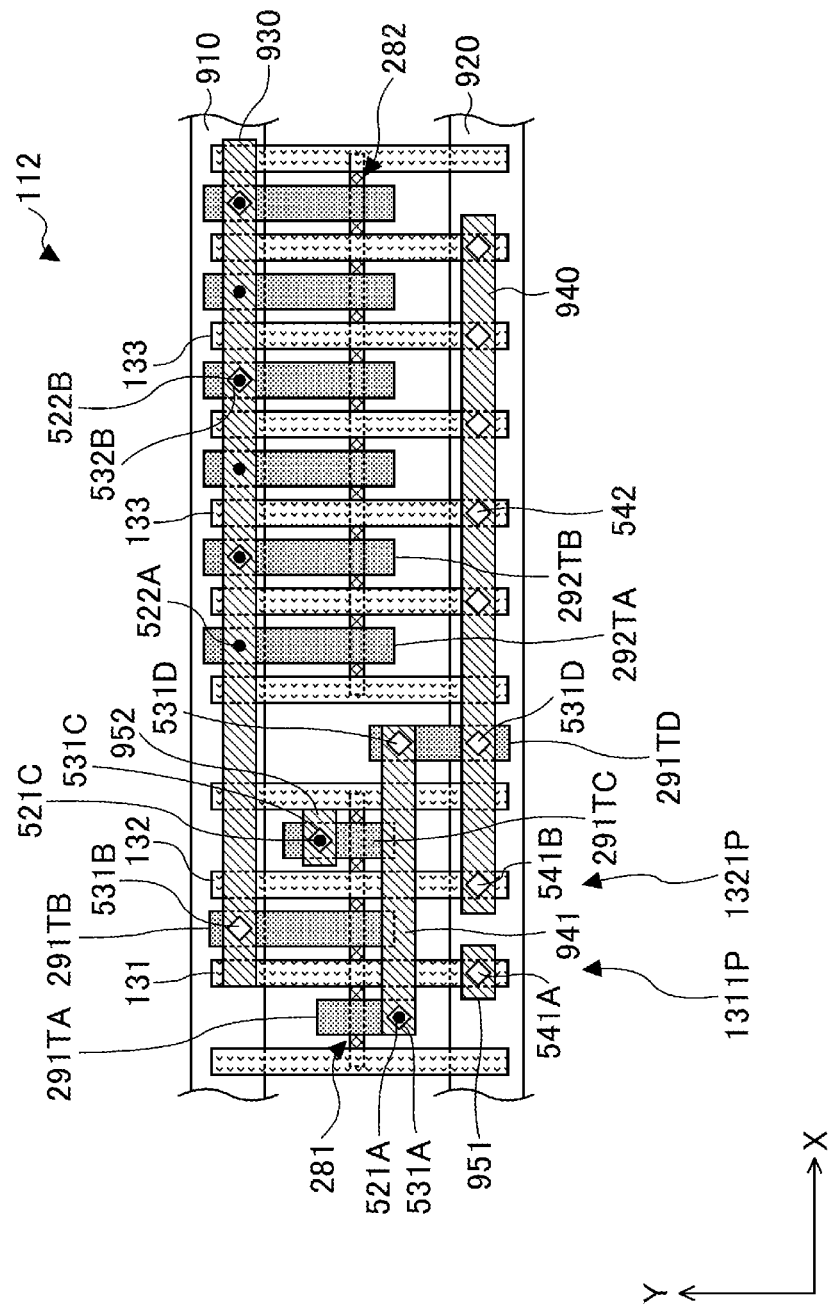
FIG. 23 is a schematic view (Part 2) illustrating a planar configuration of the standard cell area according to the fifth modification of the first embodiment.

Next, a fifth modification of the first embodiment will be described. The fifth modification is different from the first embodiment in the number of tracks of the power supply switch circuit 110. FIG. 22 and FIG. 23 are schematic views illustrating a planar configuration of standard cell area 10 according to the fifth modification of the first embodiment. FIG. 22 mainly illustrates a layout of the N-channel MOS transistor of the power supply switch control circuit 113 and the switch transistor 111. FIG. 23 mainly illustrates a layout of the P-channel MOS transistor of the power supply switch control circuit 113 and the switch transistor 111. Except for the structures illustrated in both FIG. 22 and FIG. 23, the structures illustrated in FIG. 23 are located above the structures illustrated in FIG. 22.

In the fifth modification, as illustrated in FIG. 22 and FIG. 23, the power supply switch circuit 110 consists of four tracks.

As illustrated in FIG. 22, in the Y direction, a contact hole 521A is located between the power supply line 920 and the fin 181, and a contact hole 521C is located between the power supply line 910 and the fin 181. A local interconnect 192BB extends from the P-type area 182PA to above the power supply line 910, similarly to the local interconnect 192BA. A contact hole 522B is located above the power supply line 910.

As illustrated in FIG. 23, contact holes 531B and 532B are located above the power supply line 910. A power supply line 930 is connected to the local interconnect 291TB through a conductor in the contact hole 531B and connected to the local interconnect 292TB through a conductor in the contact hole 532B above the power supply line 910. A contact hole 541A and a signal line 951 are located above the power supply line 920. A contact hole 531C and a signal line 952 are located above the contact hole 521C. A local interconnect 291TC is located between the local interconnect 291TB and the local interconnect 291TD in the X direction. The local interconnect 291TD extends from above the power supply line 920 toward above the power supply line 910. At the same position as a contact hole 531A in the Y direction, a contact hole 531D is formed in the insulation film 153 on the local interconnect 291TD. A control signal line 941 is connected to the local interconnect 291TA through a conductor in the contact hole 531A and is connected to the local interconnect 291TD through a conductor in the contact hole 531D. The control signal line 941 is formed in the insulation film 154.

Other configurations are the same as in the first embodiment.

The same effect as that of the first embodiment can be obtained by the fifth modification. Further, according to the fifth modification, the distance between the power supply line 930 and the control signal line 940 can be increased in the Y direction. Therefore, a parasitic capacitance between the power supply line 930 and the control signal line 940 can be reduced. Further, since the contact hole 532B and the contact hole 522B overlap in a plan view, the resistance between the power supply line 930 and the local interconnect 192BB can be reduced.

Two or more sets of the fin 181 (or the semiconductor area 481), the fin 182 (or the semiconductor area 482), the semiconductor area 281, and the semiconductor area 282 may be arranged between the power supply line 910 and the power supply line 920 in the Y direction. The same applies to other embodiments and modifications.

Second Embodiment

Figure 24:
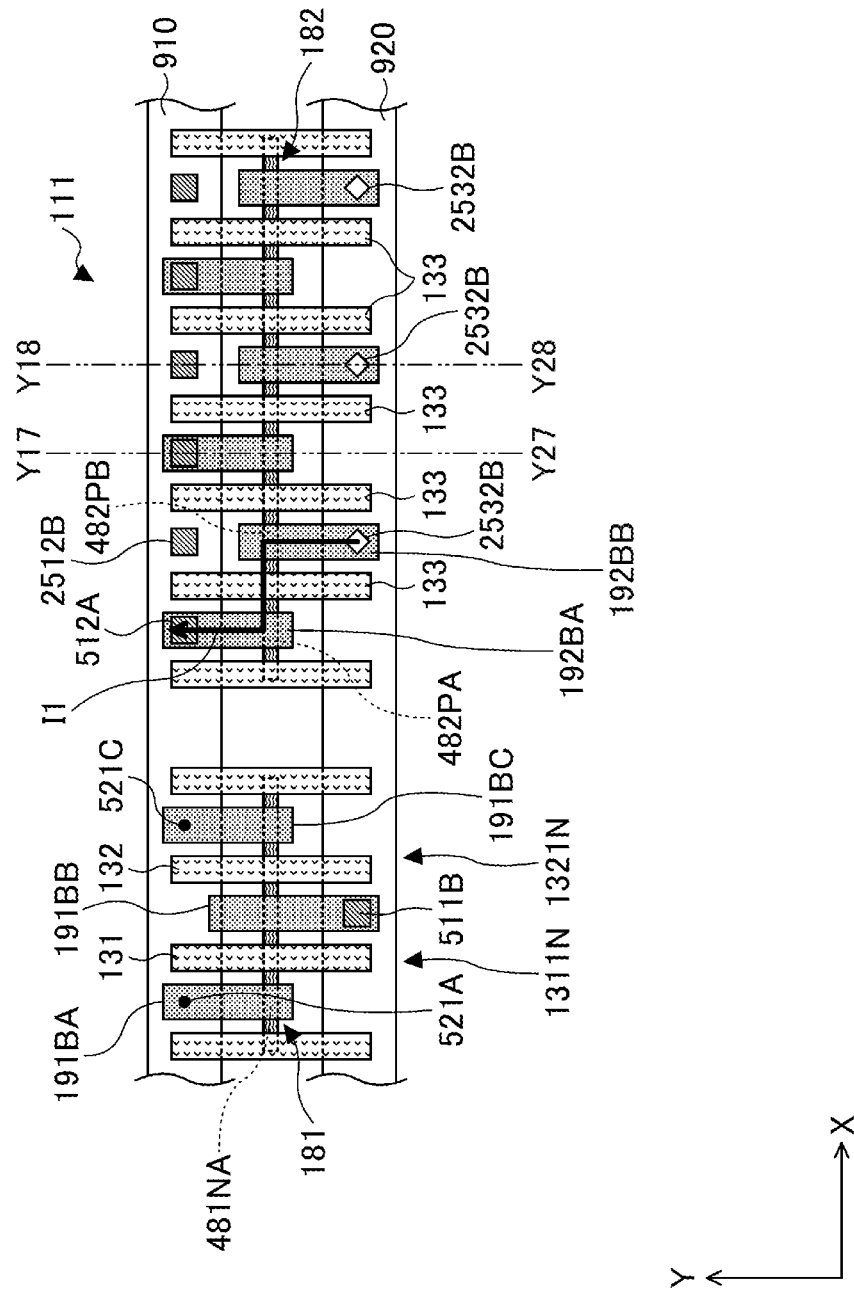
FIG. 24 is a schematic view (Part 1) illustrating a planar configuration of a standard cell area according to a second embodiment.
Figure 25:
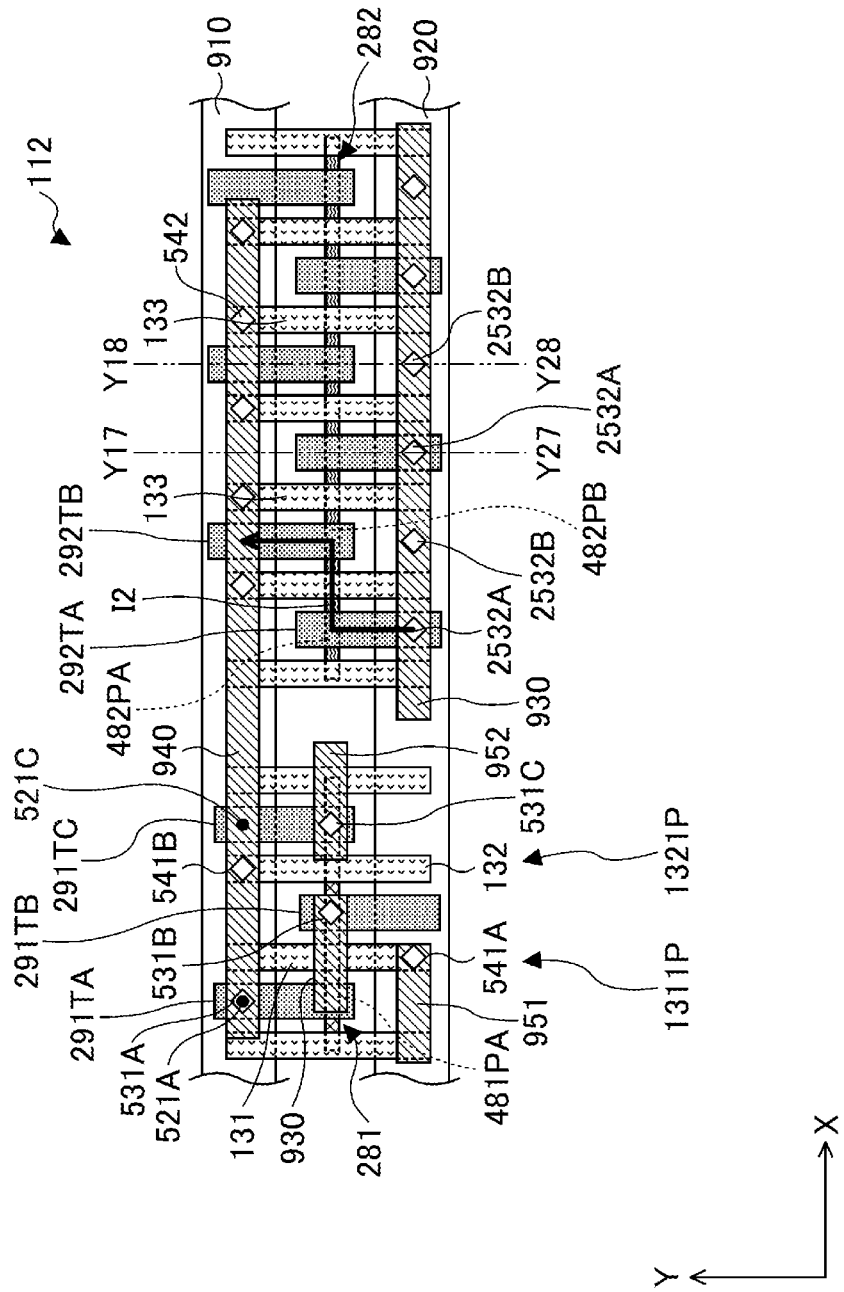
FIG. 25 is a schematic view (Part 2) illustrating a planar configuration of the standard cell area according to the second embodiment.
Figure 26:
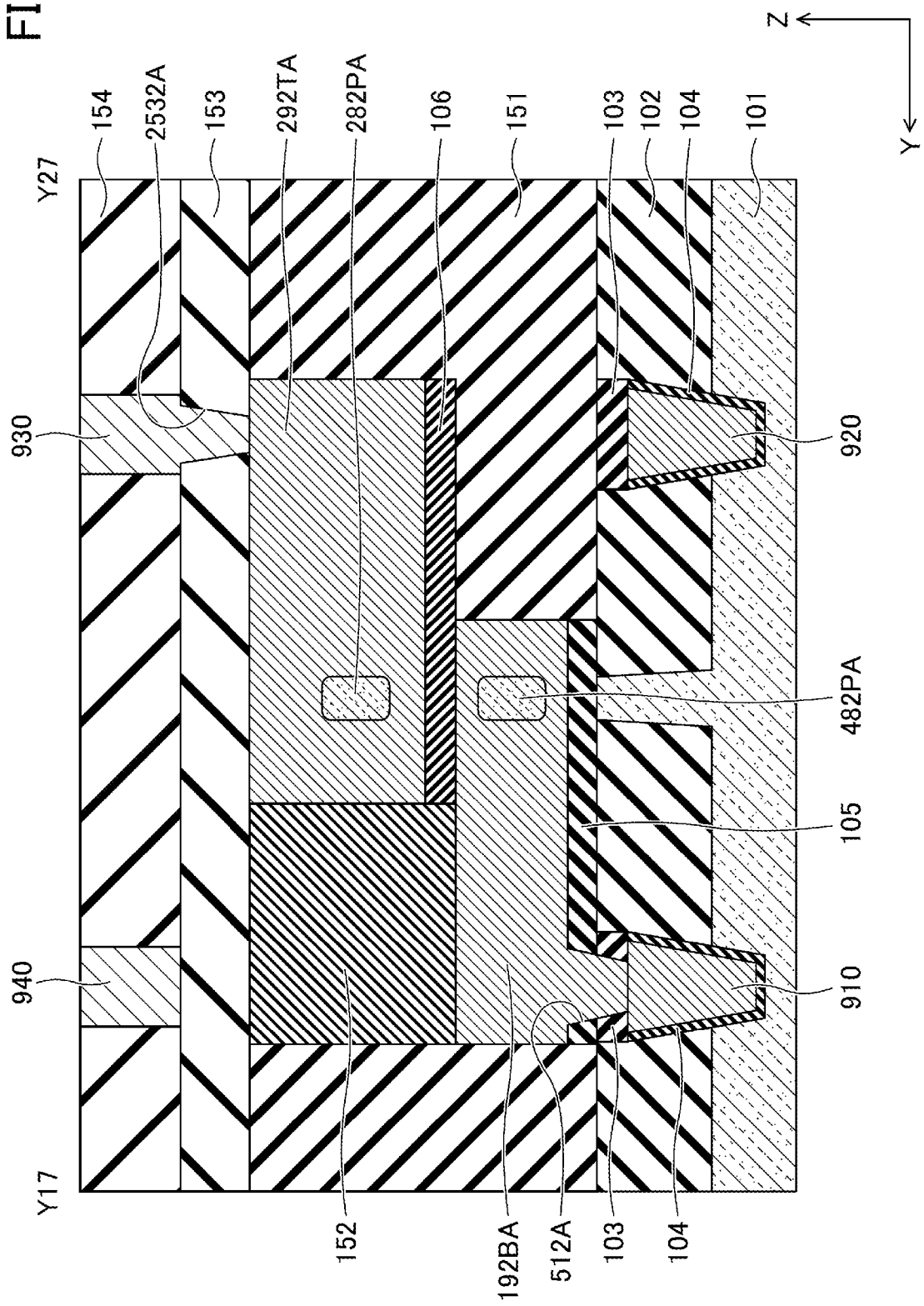
FIG. 26 is a cross-sectional view (Part 1) illustrating the standard cell area according to the second embodiment.
Figure 27:
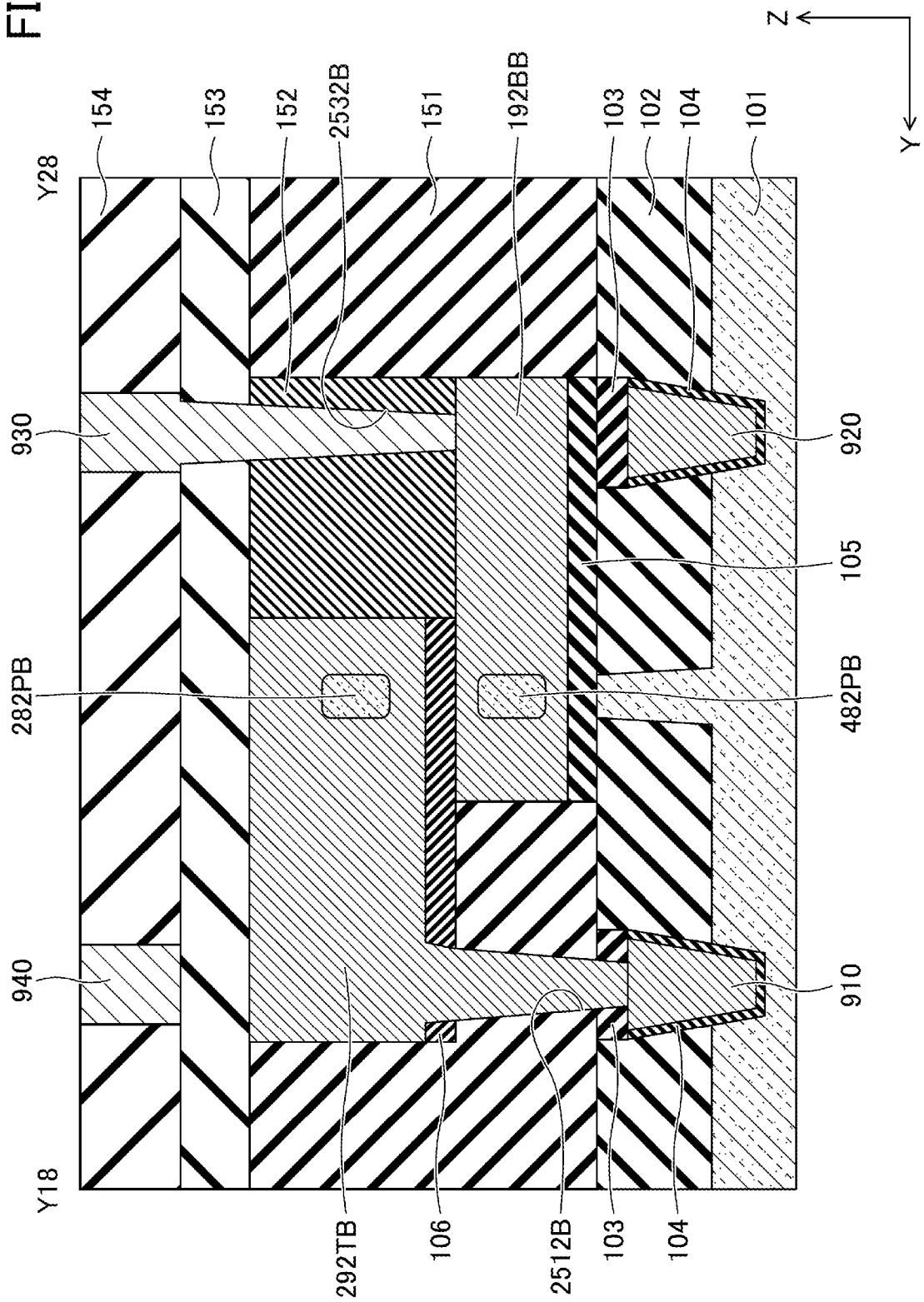
FIG. 27 is a cross-sectional view (Part 2) illustrating the standard cell area according to the second embodiment.

Next, a second embodiment will be described. The second embodiment differs from the first embodiment in the arrangement of local interconnects. FIG. 24 and FIG. 25 are schematic views illustrating a planar configuration of a standard cell area 10 according to the second embodiment. FIG. 24 mainly illustrates a layout of the N-channel MOS transistor of the power supply switch control circuit 113 and the switch transistor 111. FIG. 25 mainly illustrates the layout of the P-channel MOS transistor of the power supply switch control circuit 113 and the switch transistor 111. Except for the structures illustrated in both FIG. 24 and FIG. 25, the structures illustrated in FIG. 25 are located above the structures illustrated in FIG. 24. FIG. 26 and FIG. 27 are cross-sectional views illustrating the standard cell area 10 according to the second embodiment. FIG. 26 corresponds to a cross-sectional view taken along line Y17-Y27 in FIG. 24 and FIG. 25. FIG. 27 corresponds to a cross-sectional view taken along line Y18-Y28 in FIG. 24 and FIG. 25.

In the second embodiment, as illustrated in FIG. 24, a local interconnect 191BA extends to above the power supply line 910 from the N-type area 481NA, and a contact hole 521A is located above the power supply line 910. A local interconnect 192BA extends to above the power supply line 910 from the P-type area 482PA, and a local interconnect 192BB extends to above the power supply line 920 from the P-type area 482PB.

As illustrated in FIG. 25, a local interconnect 291TA extends to above the power supply line 910 from the P-type area 281PA. A contact hole 531A is located above the power supply line 910. A contact hole 541A is located above the power supply line 920. A contact hole 541B is located above the power supply line 910. A contact hole 531C is located above the semiconductor area 281. A local interconnect 292TA extends to above the power supply line 920 from the P-type area 282PA, and the local interconnect 292TB extends to above the power supply line 910 from the P-type area 282PB.

As illustrated in FIG. 26, a contact hole 2532A is formed in the insulation film 153 above the power supply line 920, and the power supply line 930 is connected to the local interconnect 292TA through a conductor in the contact hole 2532A.

As illustrated in FIG. 27, a contact hole 2512B is formed in the insulation films 151 and 103 above the power supply line 910, and the local interconnect 292TB is connected to the power supply line 910 through a conductor in the contact hole 2512B. A contact hole 2532B is formed in the insulation films 153 and 152 above the power supply line 920, and the power supply line 930 is connected to the local interconnect 192BB through a conductor in the contact hole 2532B.

As described above, in the second embodiment, the source of the switch transistor 111 (the P-type area 482PB) and the drain of the switch transistor 112 (the P-type area 282PB) overlap each other in a plan view, and the drain of the switch transistor 111 (the P-type area 482PA) and the source of the switch transistor 112 (the P-type area 282PA) overlap each other in a plan view.

Other configurations are the same as in the first modification of the first embodiment.

In the second embodiment, the power supply line 930 is connected to the local interconnect 192BB through a conductor in the contact hole 2352B without going through the local interconnect 292TB. Therefore, uniformity between the power supply potential of VDD to be supplied to the local interconnect 192BB and the power supply potential of VDD to be supplied to the local interconnect 292TA can be improved. Further, in a plan view, a current path I1 in the switch transistor 111 and a current path I2 in the switch transistor 112 are dispersed. Therefore, the current channeling can be further controlled, and the power supply drop can be reduced.

The second to fifth modifications of the first embodiment may be applied to the second embodiment.

Third Embodiment

Figure 28:
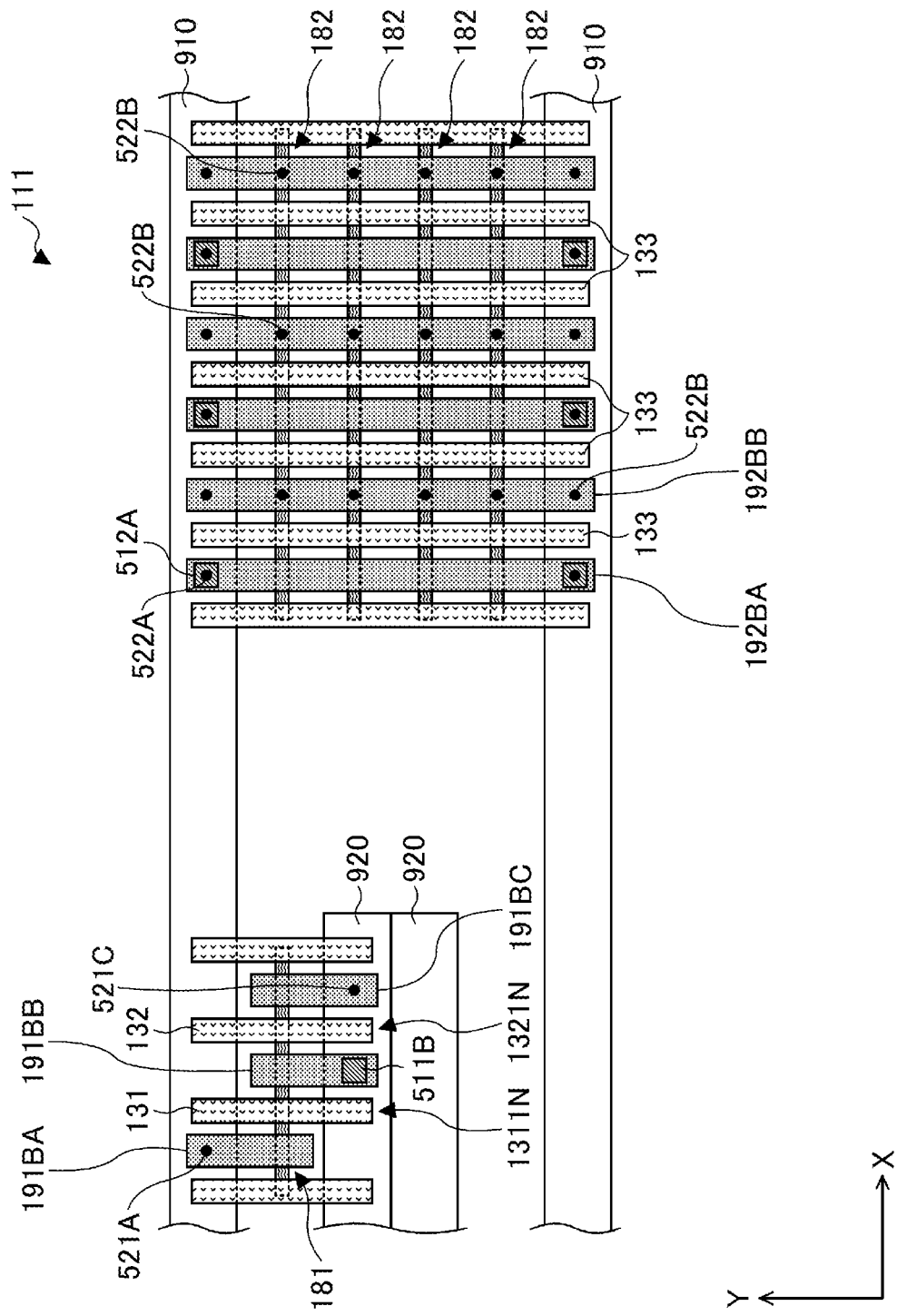
FIG. 28 is a schematic view (Part 1) illustrating a planar configuration of a standard cell area according to a third embodiment.
Figure 29:
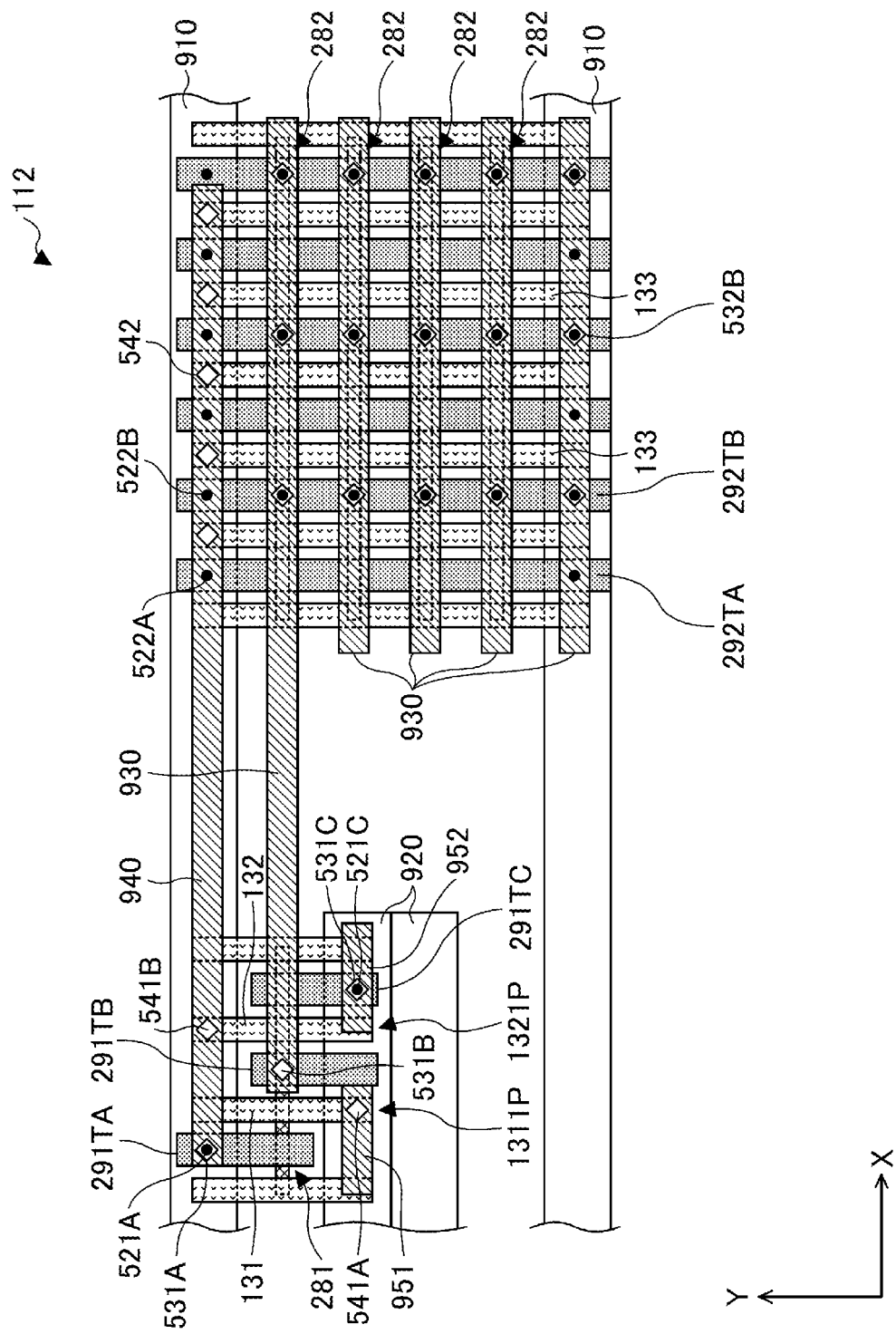
FIG. 29 is a schematic view (Part 2) illustrating a planar configuration of the standard cell area according to the third embodiment.

Next, a third embodiment will be described. The third embodiment differs from the first embodiment in height of cells. FIG. 28 and FIG. 29 are schematic views illustrating a planar configuration of a standard cell area 10 according to the third embodiment. FIG. 28 mainly illustrates a layout of the N-channel MOS transistor of the power supply switch control circuit 113 and the switch transistor 111. FIG. 29 mainly illustrates the layout of the P-channel MOS transistor of the power supply switch control circuit 113 and the switch transistor 111.

In the third embodiment, as illustrated in FIG. 28 and FIG. 29, the power supply switch circuit 110 is a double height cell. That is, the power supply switch circuit 110 is formed over the two power supply lines 910, and the power supply line 920 is located between the two power supply lines 910 in the Y direction.

As illustrated in FIG. 28, a local interconnect 191BA extends above the power supply line 910 from the N-type area 181NA, and a local interconnect 191BC extends above the power supply line 920 from the N-type area 181NC. A contact hole 521A is located above one power supply line 910, and a contact hole 521C is located above the power supply line 920.

As illustrated in FIG. 28 and FIG. 29, the gate electrode 133, the local interconnect 192BA, 192BB, 292TA, and 292TB extend from above one power supply line 910 to above the other power supply line 910. Four fins 182 and the semiconductor areas 282 are arranged at equal intervals between one power supply line 910 and the other power supply line 910 in the Y direction. A contact hole 522B is formed between the local interconnect 192BB and the local interconnect 292TB so as to overlap the fins 182 and the semiconductor areas 282 in a plan view. The numbers of fins 182 and semiconductor areas 282 in FIG. 28 and FIG. 29 are examples, and are not limited to these.

As illustrated in FIG. 29, a control signal line 940 is located above one power supply line 910, and a power supply line 930 is located above the power supply line 920. Further, the power supply line 930 is also formed in the insulation film 154 above the fins 182 and the semiconductor areas 282. Of multiple power supply lines 930, the one closest to the control signal line 940 is connected to the local interconnect 291TB through a conductor in the contact hole 531B.

The same effect as that of the first embodiment can be obtained by the third embodiment. In other embodiments and modifications, the power supply switch circuit 110 may be the double height cell.

The formation of the contact hole 522B between the fin 182 (or the semiconductor areas 482) and the semiconductor area 282 may be omitted. In this case, the contact hole 522B may be arranged only at a position overlapping the power supply line 910 in a plan view.

First Modification of Third Embodiment

Figure 30:
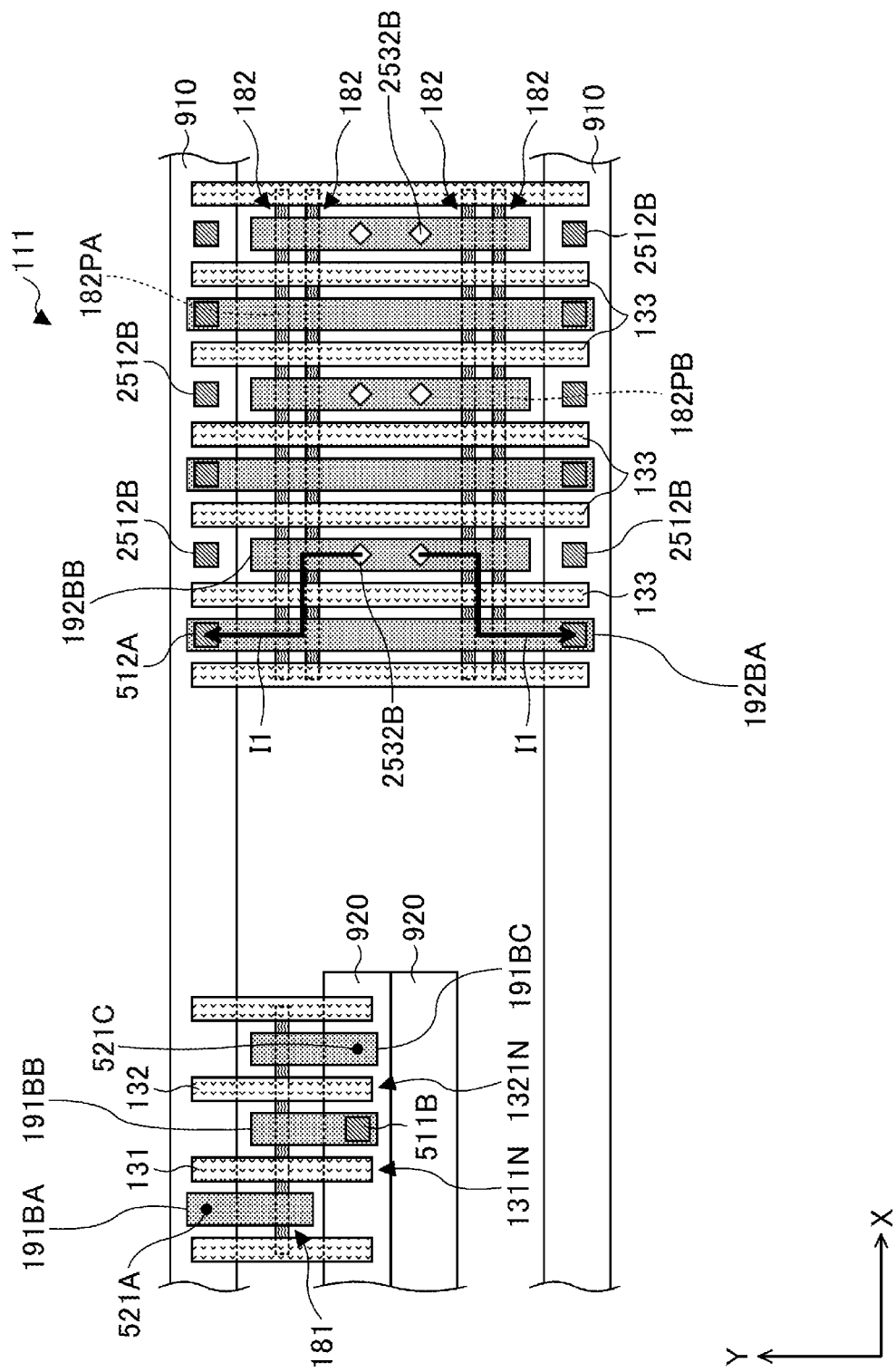
FIG. 30 is a schematic view (Part 1) illustrating a planar configuration of a standard cell area according to a first modification of the third embodiment.
Figure 31:
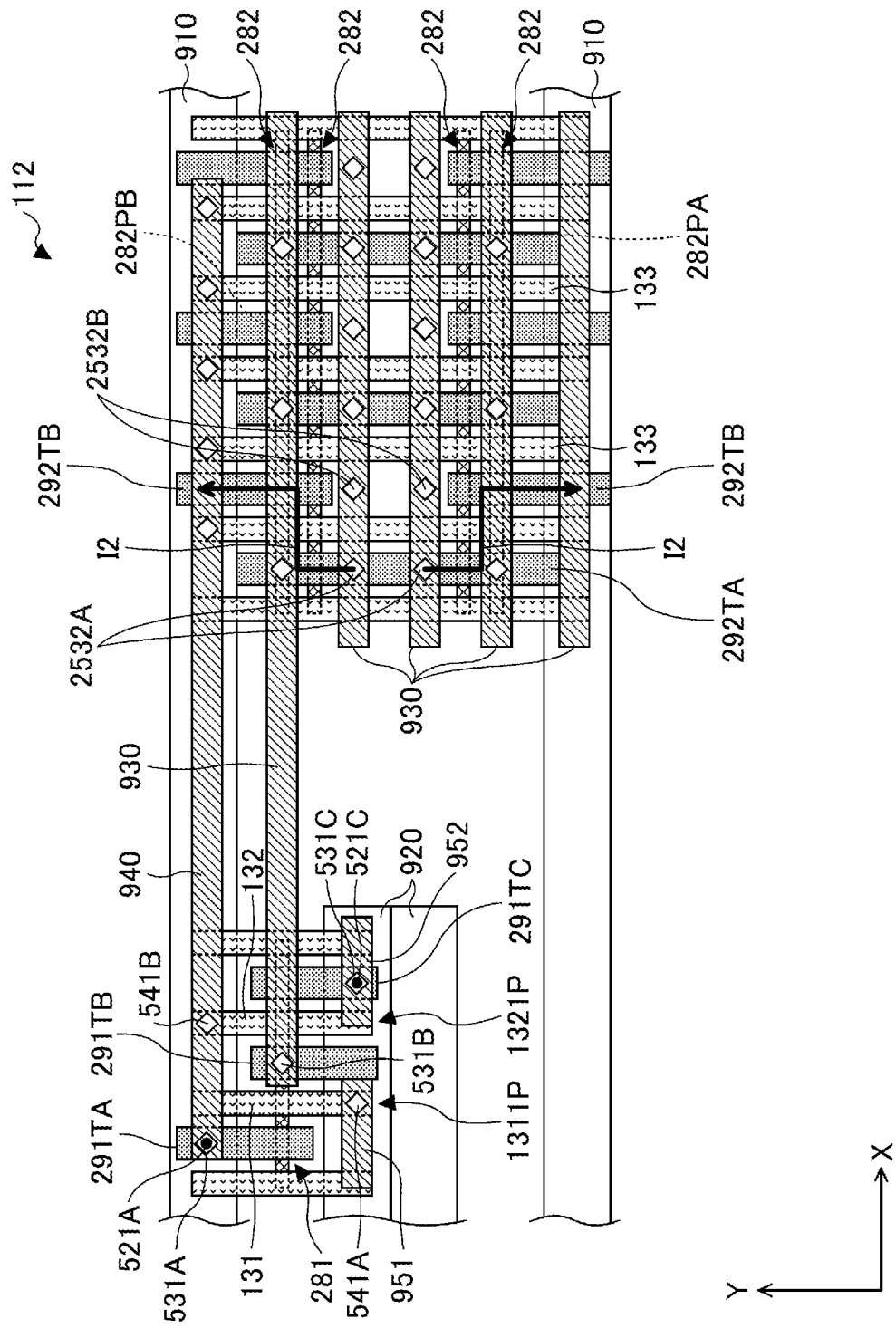
FIG. 31 is a schematic view (Part 2) illustrating a planar configuration of the standard cell area according to the first modification of the third embodiment.

Next, a first modification of the third embodiment will be described. The first modification is different from the second embodiment in height of cells. FIG. 30 and FIG. 31 are schematic views illustrating a planar configuration of a standard cell area 10 according to the first modification of the third embodiment. FIG. 30 mainly illustrates a layout of the N-channel MOS transistor of the power supply switch control circuit 113 and the switch transistor 111. FIG. 31 mainly illustrates the layout of the P-channel MOS transistor of the power supply switch control circuit 113 and the switch transistor 111.

In the first modification, as illustrated in FIG. 30 and FIG. 31, a power supply switch circuit 110 is a double height cell. That is, the power supply switch circuit 110 is formed over the two power supply lines 910, and the power supply line 920 is located between the two power supply lines 910 in the Y direction. A local interconnect 192BA extends to above the two power supply lines 910 from the P-type area 182PA. A local interconnect 192BB is arranged at a position overlapping each of the P-type areas 182PB, and is apart from the two power supply lines 910 in a plan view. A local interconnect 292TA is arranged at a position overlapping each of the P-type areas 282PA, and is apart from the two power supply lines 910 in a plan view. A local interconnect 292TB extends to above the two power supply lines 910 from the P-type area 282PB. A part of the local interconnect 292TA is arranged above a part of the local interconnect 192BA. A part of the local interconnect 292TB is arranged above a part of the local interconnect 192BB. The local interconnect 192BB is connected to the power supply line 930 through a conductor in the contact hole 2532B. The local interconnect 292TA is connected to the power supply line 930 through a conductor in the contact hole 2532A. The local interconnect 192BA is connected to each of the two power supply lines 910 through a conductor in the contact hole 512A. The local interconnect 292TB is connected to each of the two power supply lines 910 through a conductor in the contact hole 2512B.

That is, the first modification includes a configuration in which the third embodiment and the second embodiment are combined. However, in the third embodiment, the fins 182 and the semiconductor areas 282 are located on the extension lines of the power supply line 920 in the X direction in a plan view, whereas in the first modification, the fins 182 and the semiconductor areas 282 are located in proximity to the power supply line 910 of each cell. The contact hole 2532B is located on the extension line of the power supply line 920 in a plan view. In this case, the contact hole 2532B is located between the fin 182 and the semiconductor area 282 in a plan view.

According to the first modification, the same effect as that of the second embodiment and the same effect as that of the third embodiment can be obtained.

Second Modification of Third Embodiment

Figure 32:
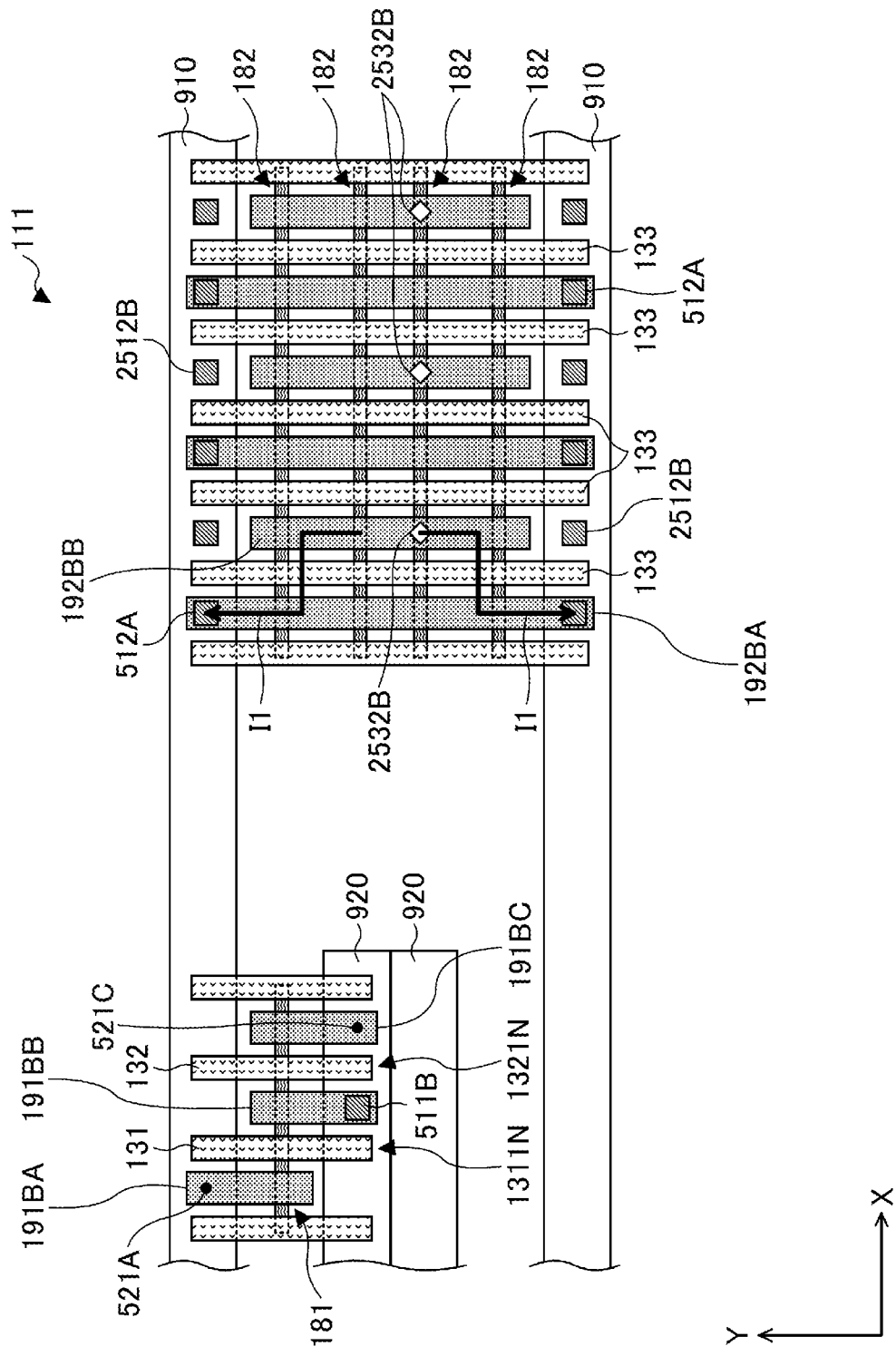
FIG. 32 is a schematic view (Part 1) illustrating a planar configuration of a standard cell area according to a second modification of the third embodiment.
Figure 33:
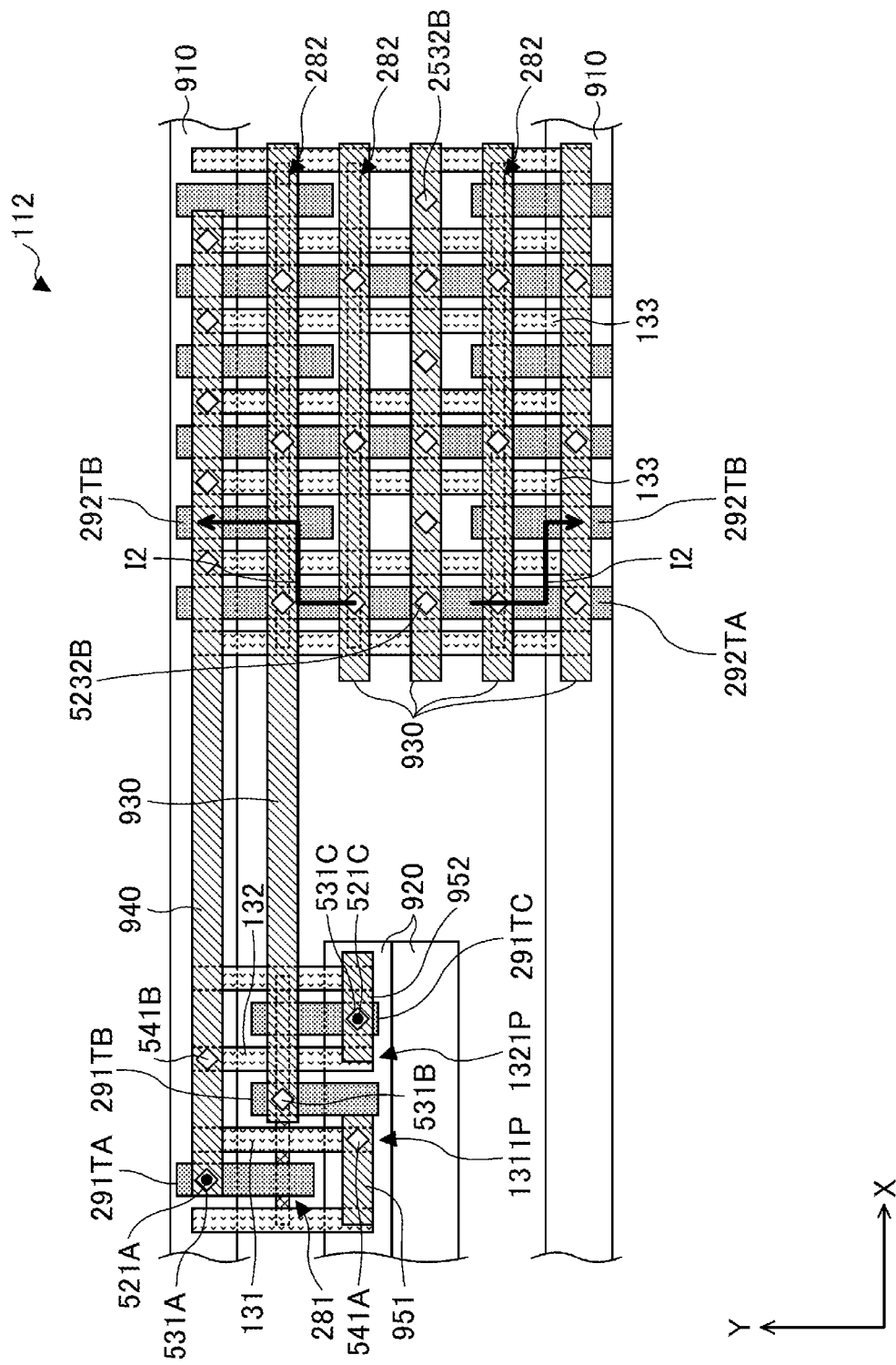
FIG. 33 is a schematic view (Part 2) illustrating a planar configuration of the standard cell area according to the second modification of the third embodiment.

Next, a second modification of the third embodiment will be described. The second modification is different from the first modification in the configuration of the switch transistors 111 and 112. FIG. 32 and FIG. 33 are schematic views illustrating a planar configuration of a standard cell area 10 according to the second modification of the third embodiment. FIG. 32 mainly illustrates a layout of the N-channel MOS transistor of the power supply switch control circuit 113 and the switch transistor 111. FIG. 33 mainly illustrates the layout of the P-channel MOS transistor of the power supply switch control circuit 113 and the switch transistor 111.

In the second modification, as illustrated in FIG. 32 and FIG. 33, four fins 182 are arranged at equal intervals between the two power supply lines 910. A semiconductor area 282 is arranged above three of the four fins 182. A contact hole 2532B is located in a portion where the fin 182 is arranged and the semiconductor area 282 is not arranged in a plan view. The number of arranged fins 182 is an example, and is not limited to four. Further, the number of fins 182 in which the semiconductor area 282 is not arranged above is not limited to one, and may be two or more.

The same effect as that of the second embodiment and the same effect as that of the third embodiment can be obtained by the second modification.

In the second modification, the semiconductor area 282 is not arranged above a part of the multiple fins 182, but if the P-type areas 282PA and 282PB of the semiconductor area 282 are omitted, a dummy channel 282C may be formed. Further, in a formation process, after epitaxially growing the P-type areas 282PA and 282PB, the P-type areas 282PA and 282PB may be removed.

Fourth Embodiment

Figure 34:
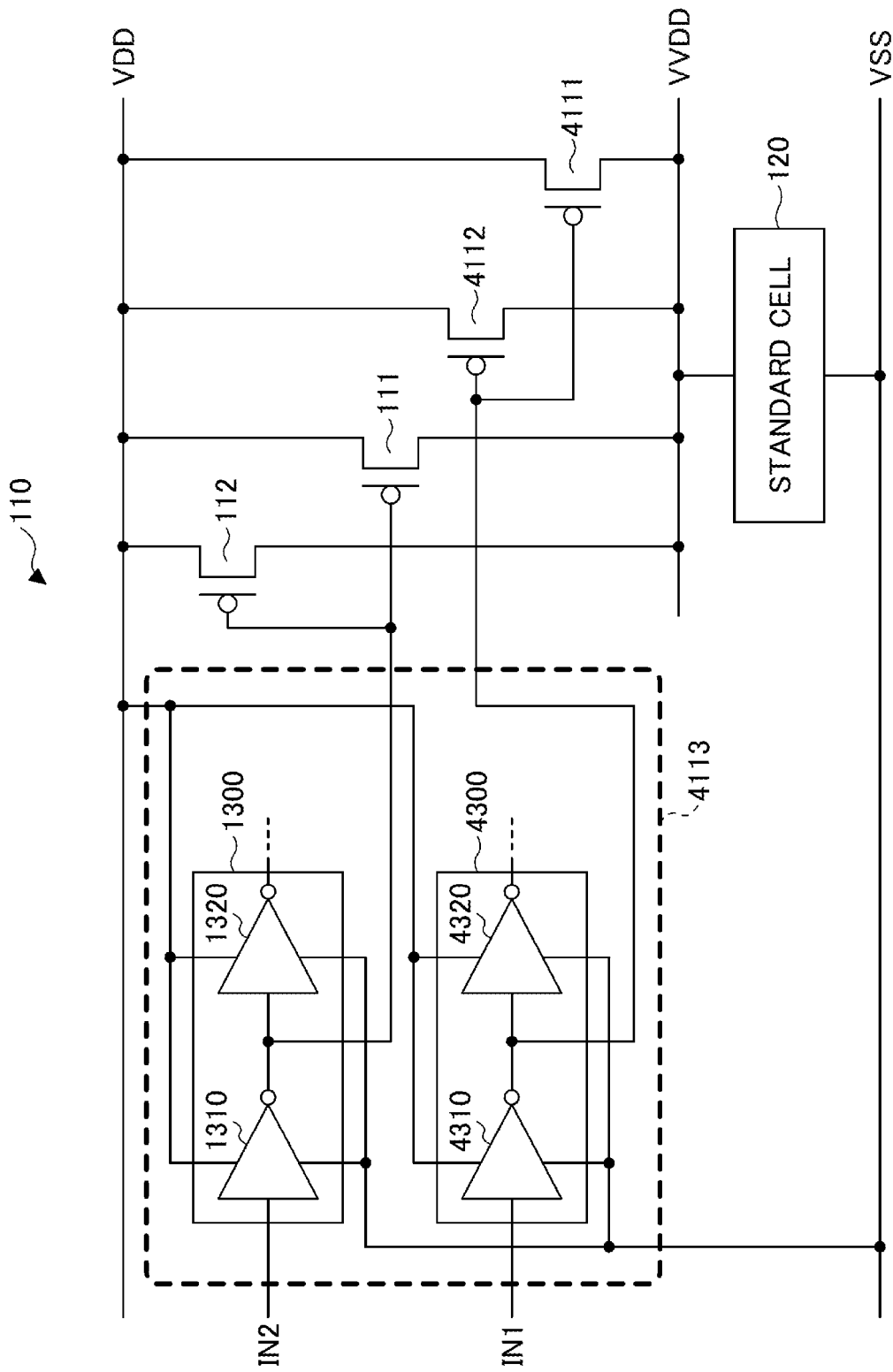
FIG. 34 is a circuit diagram illustrating a configuration of a power supply switch circuit according to a fourth embodiment.

Next, the fourth embodiment will be described. The fourth embodiment is different from the first embodiment in the number of buffers and switch transistors included in the power supply switch circuit 110. FIG. 34 is a circuit diagram illustrating a configuration of a power supply switch circuit according to the fourth embodiment.

As illustrated in FIG. 34, the power supply switch circuit 110 includes switch transistors 4111, 4112, 111, and 112, and a power supply switch control circuit 4113. The switch transistors 4111 and 4112 are, for example, P-channel MOS transistors, and are connected between the VDD line and the VVDD line. A gate of the switch transistor 4111 is connected to a gate of the switch transistor 4112. The power supply switch control circuit 4113 is connected to each gate of the switch transistors 4111, 4112, 111, and 112 to control the operation of the switch transistors 4111, 4112, 111, and 112. The power supply switch control circuit 4113 switches the on/off state of the switch transistors 4111, 4112, 111, and 112 to control conduction between the VDD line and the VVDD line. The power supply switch control circuit 113 includes buffers 1300 and 4300.

The buffer 1300 includes inverters 1310 and 1320 as in the first embodiment. An input signal IN2 is input to the inverter 1310, the output of the inverter 1310 is input to the gate of the switch transistor 111, the gate of the switch transistor 112, and the inverter 1320, and an output signal OUT2 is output from the inverter 1320.

The buffer 4300 includes inverters 4310 and 4320. An input signal IN1 is input to the inverter 4310, the output of the inverter 4310 is input to the gate of the switch transistor 4111, the gate of the switch transistor 4112, and the inverter 4320, and an output signal OUT1 is output from the inverter 4320.

Figure 35:
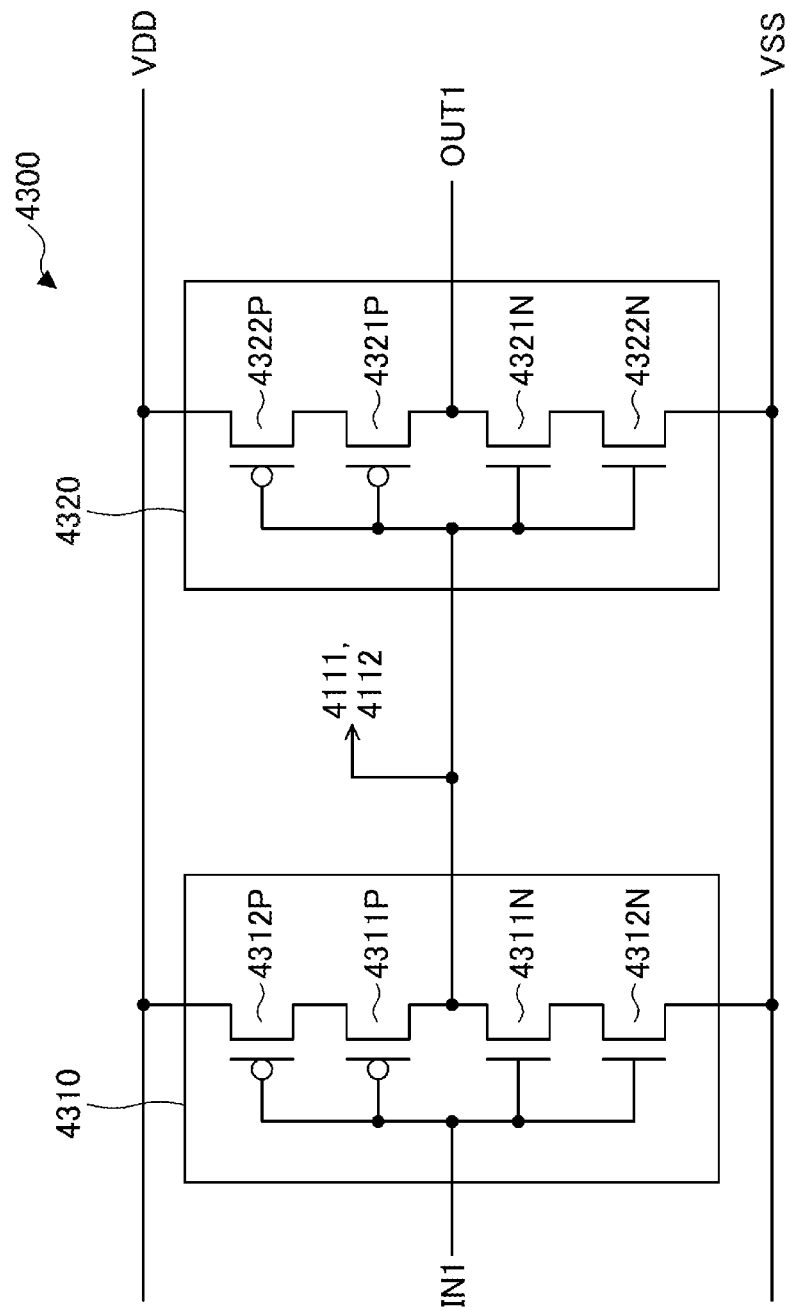
FIG. 35 is a circuit diagram illustrating a configuration of a buffer included in the semiconductor device according to the fourth embodiment.

FIG. 35 is a circuit diagram illustrating a configuration of the buffer 4300. The inverter 4310 includes two pairs of P-channel MOS transistors and N-channel MOS transistors. That is, the inverter 4310 includes P-channel MOS transistors 4311P and 4312P and N-channel MOS transistors 4311N and 4312N. The inverter 4320 includes two pairs of P-channel MOS transistors and N-channel MOS transistors. That is, the inverter 4320 includes P-channel MOS transistors 4321P and 4322P and N-channel MOS transistors 4321N and 4322N.

Figure 36:
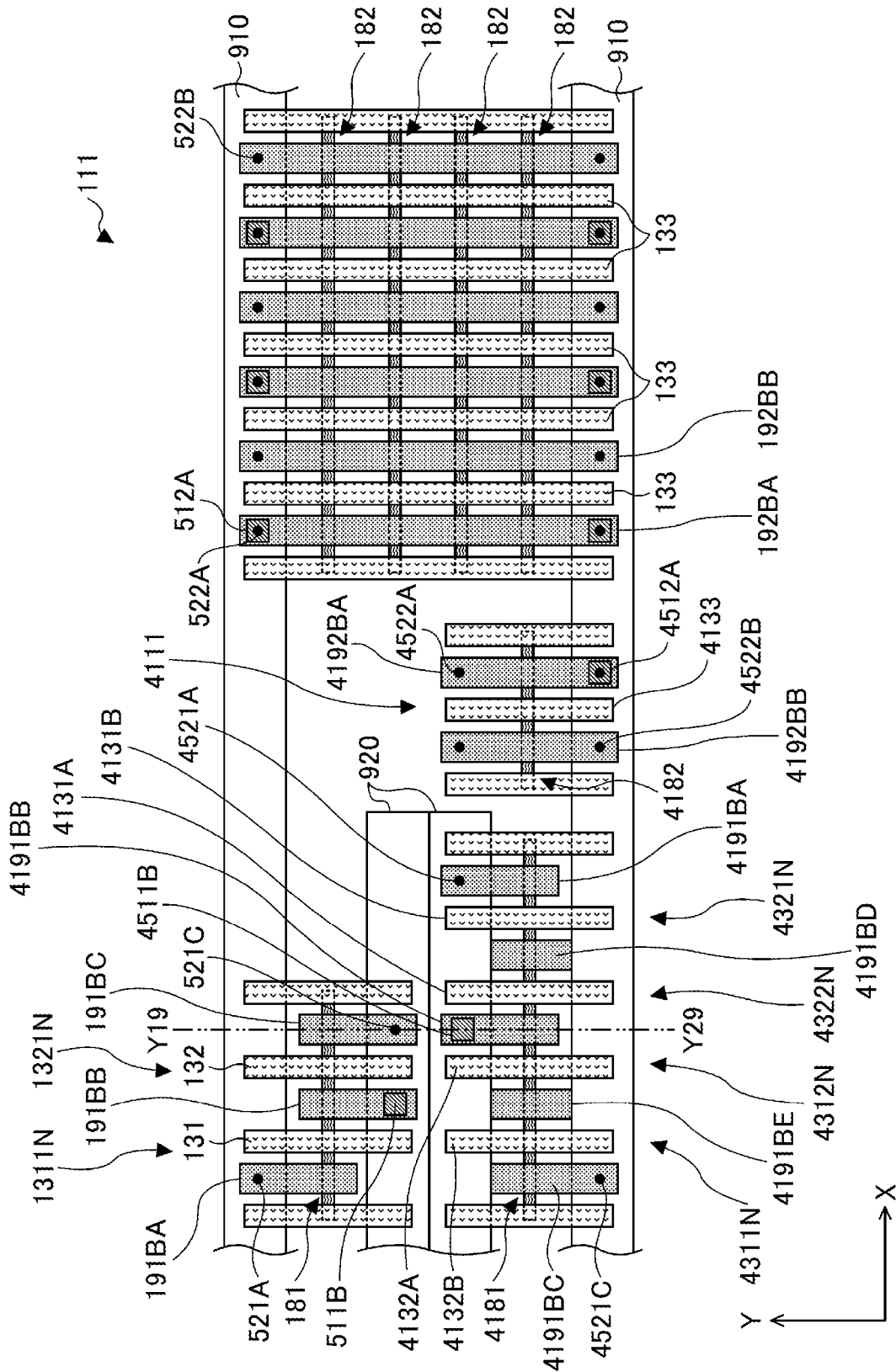
FIG. 36 is a schematic view (Part 1) illustrating a planar configuration of a standard cell area according to the fourth embodiment.
Figure 37:
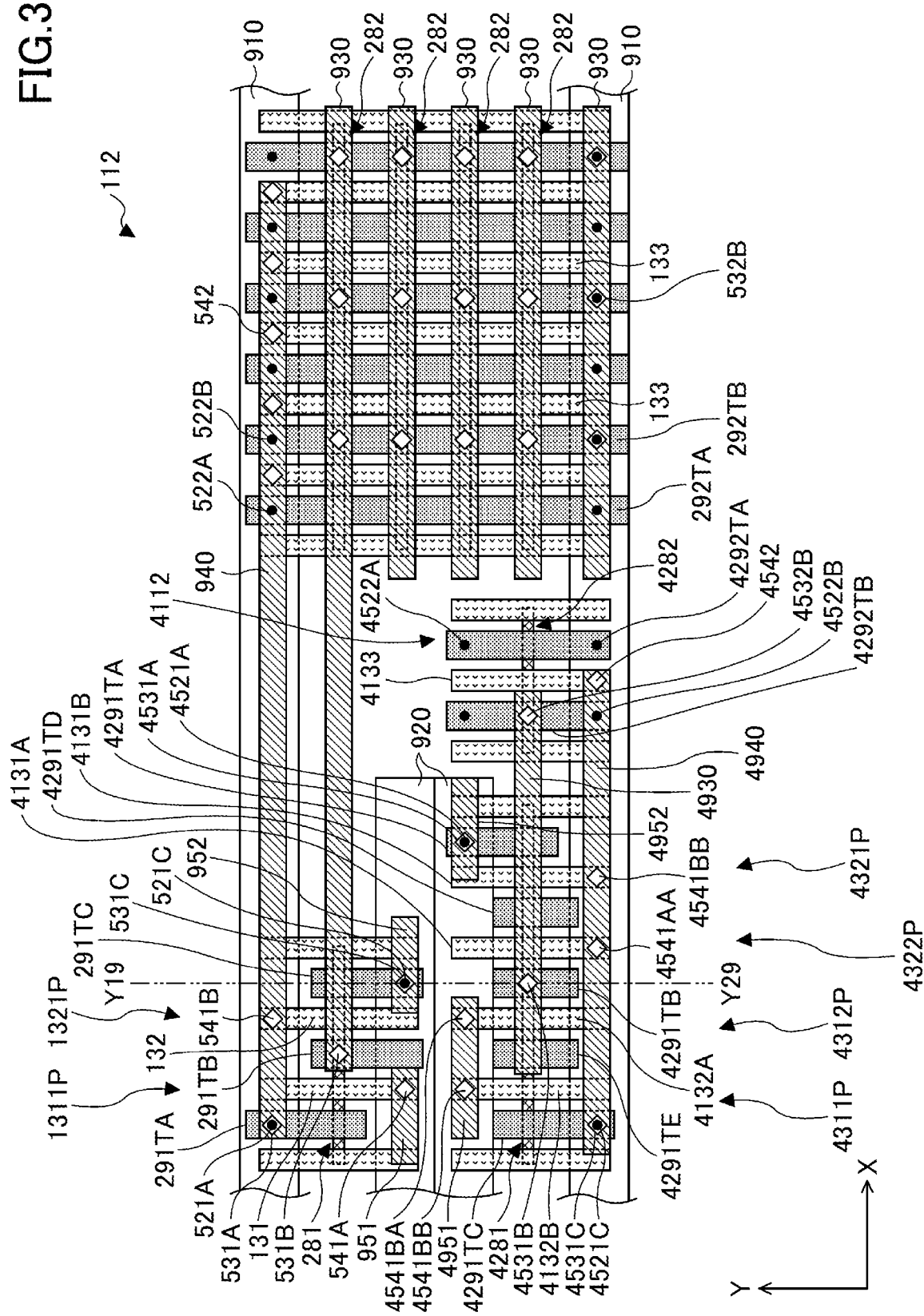
FIG. 37 is a schematic view (Part 2) illustrating a planar configuration of the standard cell area according to the fourth embodiment.
Figure 38:
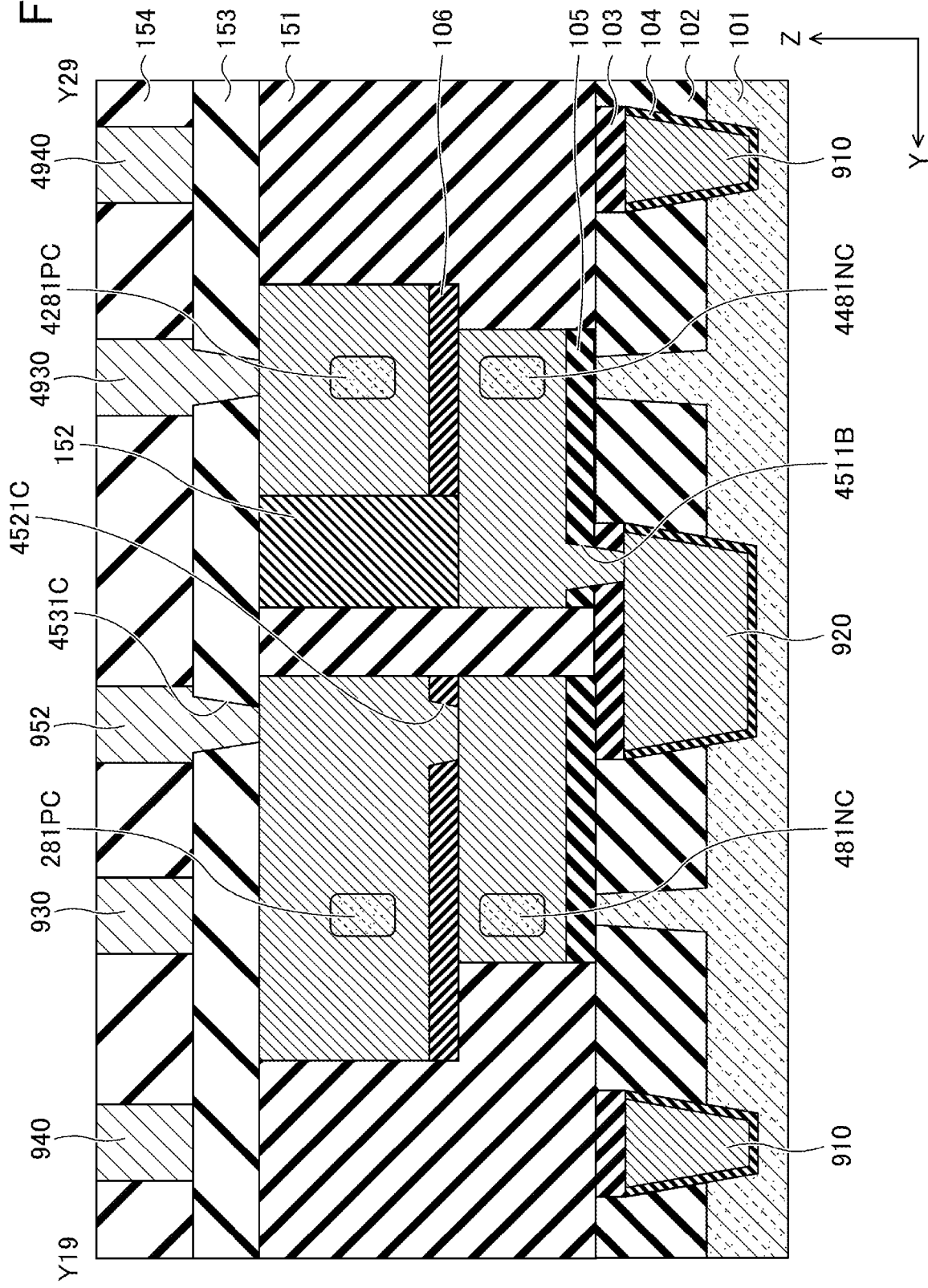
FIG. 38 is a cross-sectional view illustrating the standard cell area according to the fourth embodiment.

FIGS. 36 and 37 are schematic views illustrating a planar configuration of a standard cell area 10 according to the fourth embodiment. FIG. 36 mainly illustrates a layout of the N-channel MOS transistor of the power supply switch control circuit 4113 and the switch transistors 111 and 4111. FIG. 37 mainly illustrates the layout of the P-channel MOS transistor of the power supply switch control circuit 4113 and the switch transistors 112 and 4112. Except for the structures illustrated in both FIG. 36 and FIG. 37, the structures illustrated in FIG. 37 are located above the structures illustrated in FIG. 36. FIG. 38 is a cross-sectional view illustrating the standard cell area 10 according to the fourth embodiment. FIG. 38 corresponds to a cross-sectional view taken along line Y19-Y29 in FIG. 36 and FIG. 37.

As illustrated in FIG. 36 to FIG. 38, the power supply switch circuit 110 is a double height cell as in the third embodiment. That is, the power supply switch circuit 110 is formed over the two power supply lines 910, and the power supply line 920 is located between the two power supply lines 910 in the Y direction. The buffer 1300 and the switch transistors 111 and 112 are configured in the same manner as in the third embodiment.

The buffer 4300 and the switch transistors 4111 and 4112 are provided on the other power supply line 910 side with respect to the one power supply line 910 side in which the buffer 1300 is provided.

The buffer 4300 includes a semiconductor area 4181 extending in the X direction as the semiconductor area 481 and a semiconductor area 4282 extending in the X direction as the semiconductor area 281.

The semiconductor area 4181 includes an N-type area such as an N-type area 4481NC and a channel. As illustrated in FIG. 36, the buffer 4300 is provided with a local interconnect 4191BC aligned with the local interconnect 191BA in the Y direction, a local interconnect 4191BE aligned with the local interconnect 191BB in the Y direction, and a local interconnect 4191BB aligned with the local interconnect 191BC in the Y direction. Further, the buffer 4300 is provided with a local interconnect 4191BD and a local interconnect 4191BA. The local interconnect 4191BB is located between the local interconnect 4191BE and the local interconnect 4191BD, and the local interconnect 4191BD is located between the local interconnect 4191BB and the local interconnect 4191BA. The local interconnect 4191BB is connected to the power supply line 920 through a conductor in a contact hole 4511B formed in the insulation films 105 and 103.

The semiconductor area 4282 includes a P-type area such as a P-type area 4481PC and a channel. As illustrated in FIG. 37, the buffer 4300 is provided with a local interconnect 4291TC aligned with the local interconnect 291TA in the Y direction, a local interconnect 4291TE aligned with the local interconnect 291TB in the Y direction, and a local interconnect 4291TB aligned with the local interconnect 291TC in the Y direction. Further, the buffer 4300 is provided with a local interconnect 4291TD and a local interconnect 4291TA. The local interconnect 4291TB is located between the local interconnect 4291TE and the local interconnect 4291TD, and the local interconnect 4291TD is located between the local interconnect 4291TB and the local interconnect 4291TA. The local interconnect 4291TC is connected to the local interconnect 4191BC through a conductor in a contact hole 4521C formed in the insulation film 106. The local interconnect 4291TA is connected to the local interconnect 4191BA through a conductor in a contact hole 4521A formed in the insulation film 106.

A gate electrode 4132B both of the N-channel MOS transistor 4311N and the P-channel MOS transistor 4311P is formed between a laminate of the local interconnect 4191BC and the local interconnect 4291TC and a laminate of the local interconnect 4191BE and the local interconnect 4291TE. A gate electrode 4132A both of the N-channel MOS transistor 4312N and the P-channel MOS transistor 4312P is formed between a laminate of the local interconnect 4191BE and the local interconnect 4291TE and a laminate of the local interconnect 4191BB and the local interconnect 4291TB. A gate electrode 4131A both of the N-channel MOS transistor 4322N and the P-channel MOS transistor 4322P is formed between a laminate of the local interconnect 4191BB and the local interconnect 4291TB and a laminate of the local interconnect 4191BD and the local interconnect 4291TD. A gate electrode 4131B both of the N-channel MOS transistor 4321N and the P-channel MOS transistor 4321P is formed between a laminate of the local interconnect 4191BD and the local interconnect 4291TD and a laminate of the local interconnect 4191BA and the local interconnect 4291TA.

Above the power supply line 920, a signal line 4951 to which the input signal IN2 is input, and a signal line 4952 to which the output signal OUT2 is output are provided. The signal line 4951 is connected to the gate electrode 4132B through a conductor in a contact hole 4541BB and is connected to the gate electrode 4132A through a conductor in a contact hole 4541BA. The signal line 4952 is connected to the local interconnect 4291TA through a conductor in a contact hole 4531A.

A control signal line 4940 is provided above the power supply line 910. The control signal line 4940 is connected to the local interconnect 4291TC through a conductor in a contact hole 4531C, is connected to the gate electrode 4131A through the conductor in a contact hole 4541AA, and is connected to the gate electrode 4131B through the conductor in a contact hole 4541AB.

A power supply line 930 is provided between the signal lines 4951 and 4952 and the control signal line 4940 in the Y direction. The power supply line 930 is connected to the local interconnect 4291TB through a conductor in a contact hole 4531B.

As illustrated in FIG. 36, the switch transistor 4111 includes a semiconductor area 4182 extending in the X direction as the semiconductor area. The semiconductor area 4182 includes an N-type area and a channel. The switch transistor 4111 is provided with local interconnects 4192BB and 4192BA extending in the Y direction. The local interconnect 4192BA is connected to the power supply line 910 through a conductor in a contact hole 4512A formed in the insulation films 105 and 103.

As illustrated in FIG. 37, the switch transistor 4112 includes a semiconductor area 4282 extending in the X direction as the semiconductor area 282. The semiconductor area 4282 includes a P-type area and a channel. The switch transistor 4112 is provided with a local interconnect 4292TB formed on the local interconnect 4192BB and a local interconnect 4292TA formed on the local interconnect 4192BA via the insulation film 106. The local interconnect 4292TA is connected to the local interconnect 4192BA through a conductor in a contact hole 4522A formed in the insulation film 106. The local interconnect 4292TB is connected to the local interconnect 4192BB through a conductor in a contact hole 4522B formed in the insulation film 106.

A gate electrode 4133 both of the switch transistors 4111 and 4112 is formed between a laminate of the local interconnect 4192BA and the local interconnect 4292TA and a laminate of the local interconnect 4192BB and the local interconnect 4292TB.

The power supply line 930 is connected to the local interconnect 4292TB through the conductor in a contact hole 4532B, and the control signal line 4940 is connected to the gate electrode 4133 through a conductor in the contact hole 4542.

In the present embodiment, the switch transistors 4111 and 4112 have a smaller drive capability than the switch transistors 111 and 112, and the current flowing through the switch transistors 4111 and 4112 when turned on is smaller than the current flowing through the switch transistors 111 and 112. Therefore, by turning on the switch transistors 111 and 112 after turning on the switch transistors 4111 and 4112, the rise of the potential supplied to the VVDD line can be moderated. If the power supply potential is supplied sharply from the VVDD line to the standard cell 120, power supply noise may occur in the VDD line. However, by moderating the rise of the potential as described above, such a malfunction can be controlled.

Note that the configuration of the transistors constituting the buffer 1300 and the buffer 4300 may be the same. For example, the number of transistors provided in the buffer 1300 and the number of transistors provided in the buffer 4300 may be the same.

In FIG. 38, since the two power supply lines 920 are illustrated as one thick power supply line 920 by coupling the two power supply lines 920, the power supply line 920 is thicker than the power supply line 910. When the power supply line 910 included in the cell adjacent to the power supply switch circuit 110 in the Y direction is adjacent to the power supply line 910 of the power supply switch circuit 110, these two power supply lines 910 may be coupled to be one thick power supply line 910. The same applies to other embodiments and modifications.

Fifth Embodiment

Figure 39:
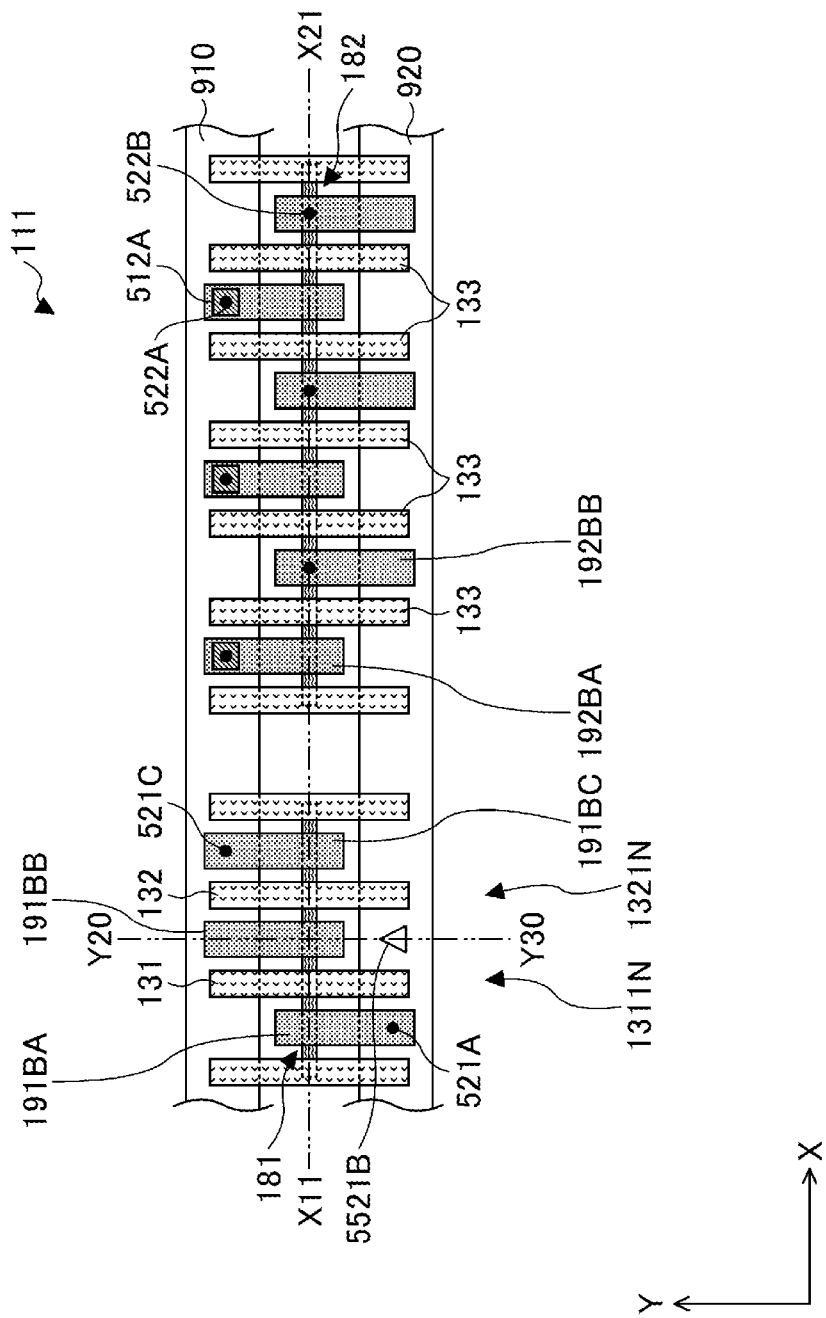
FIG. 39 is a schematic view (Part 1) illustrating a planar configuration of a standard cell area according to a fifth embodiment.
Figure 40:
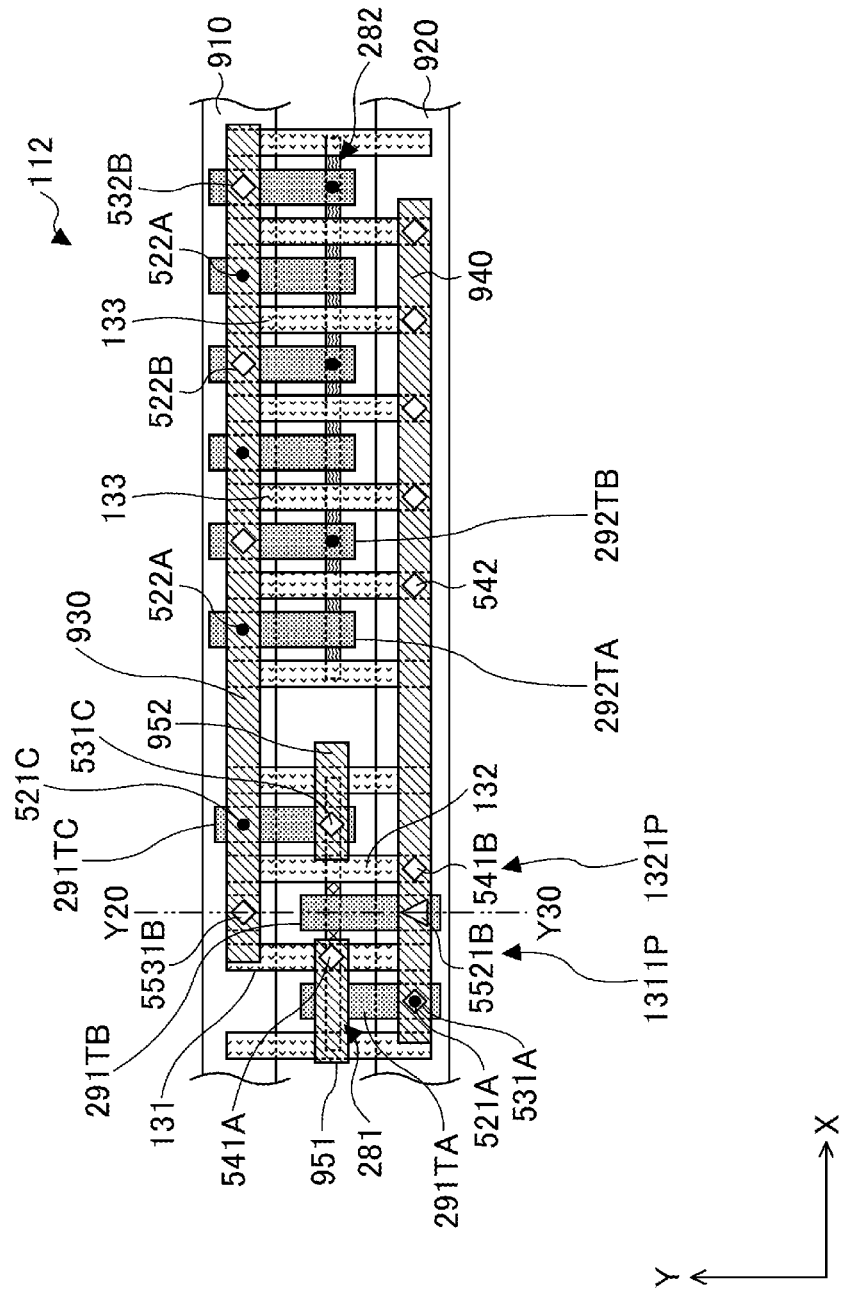
FIG. 40 is a schematic view (Part 2) illustrating a planar configuration of a standard cell area according to the fifth embodiment.
Figure 41:
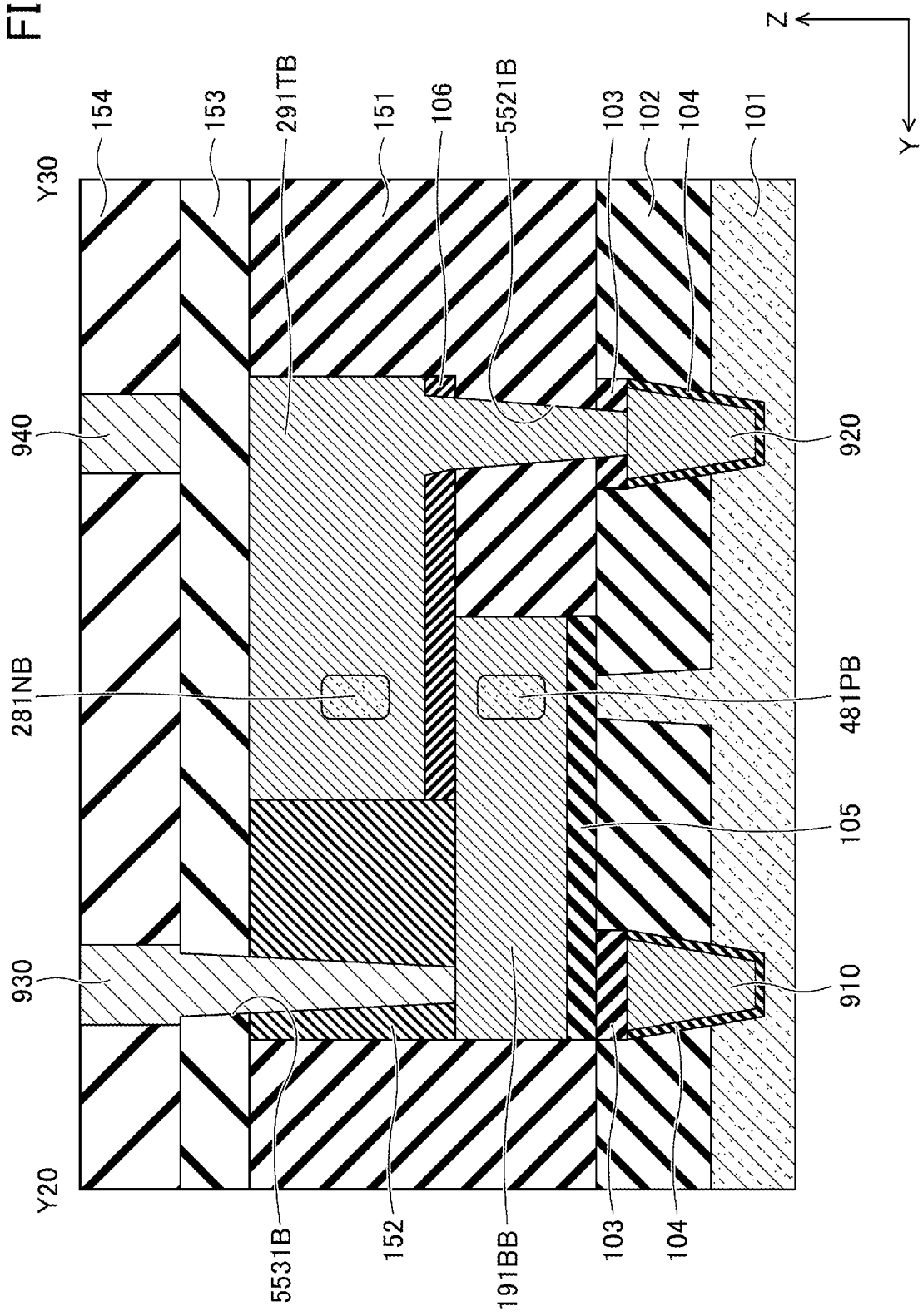
FIG. 41 is a cross-sectional view illustrating the standard cell area according to the fifth embodiment.

Next, a fifth embodiment will be described. The fifth embodiment is different from the first modification of the first embodiment in the vertical positional relationship between the P-channel MOS transistor and the N-channel MOS transistor included in the buffer. FIG. 39 and FIG. 40 are schematic views illustrating a planar configuration of a standard cell area 10 according to the fifth embodiment. FIG. 39 mainly illustrates a layout of the P-channel MOS transistor of the power supply switch control circuit 113 and the switch transistor 111. FIG. 40 mainly illustrates the layout of the N-channel MOS transistor of the power supply switch control circuit 113 and the switch transistors 112. Except for the structures illustrated in both FIG. 39 and FIG. 40, the structures illustrated in FIG. 40 are located above the structures illustrated in FIG. 39. FIG. 41 is a cross-sectional view illustrating the standard cell area 10 according to the fifth embodiment. FIG. 41 corresponds to a cross-sectional view taken along line Y20-Y30 in FIG. 39 and FIG. 40.

In the fifth embodiment, as illustrated in FIG. 39 to FIG. 41, the P-type area and the N-type area included in the buffer 1300 are interchanged as compared with the first modification of the first embodiment. For example, as illustrated in FIG. 41, a P-type area 481PB is provided in place of the N-type area 481NB of the first modification of the first embodiment, and an N-type area 281NB is provided in place of the P-type area 281PB of the first modification of the first embodiment.

Further, a local interconnect 291TB is connected to the power supply line 920 via a conductor in a contact hole 5521B formed in the insulation films 151 and 103. A power supply line 930 is connected to the local interconnect 191BB above the power supply line 910 via a conductor in a contact hole 5531B formed in the insulation films 151 and 152.

As described above, in the fifth embodiment, the N-channel MOS transistors 1311N and 1321N included in the power supply switch control circuit 113 are formed above the P-channel MOS transistors 1311P and 1321P.

Other configurations are the same as in the first embodiment.

The same effect as that of the first embodiment can be obtained by the fifth embodiment. The N-channel MOS transistor included in the power supply switch control circuit 113 may be formed above the P-channel MOS transistor also in other embodiments and modifications.

First Modification of Fifth Embodiment

Figure 42:
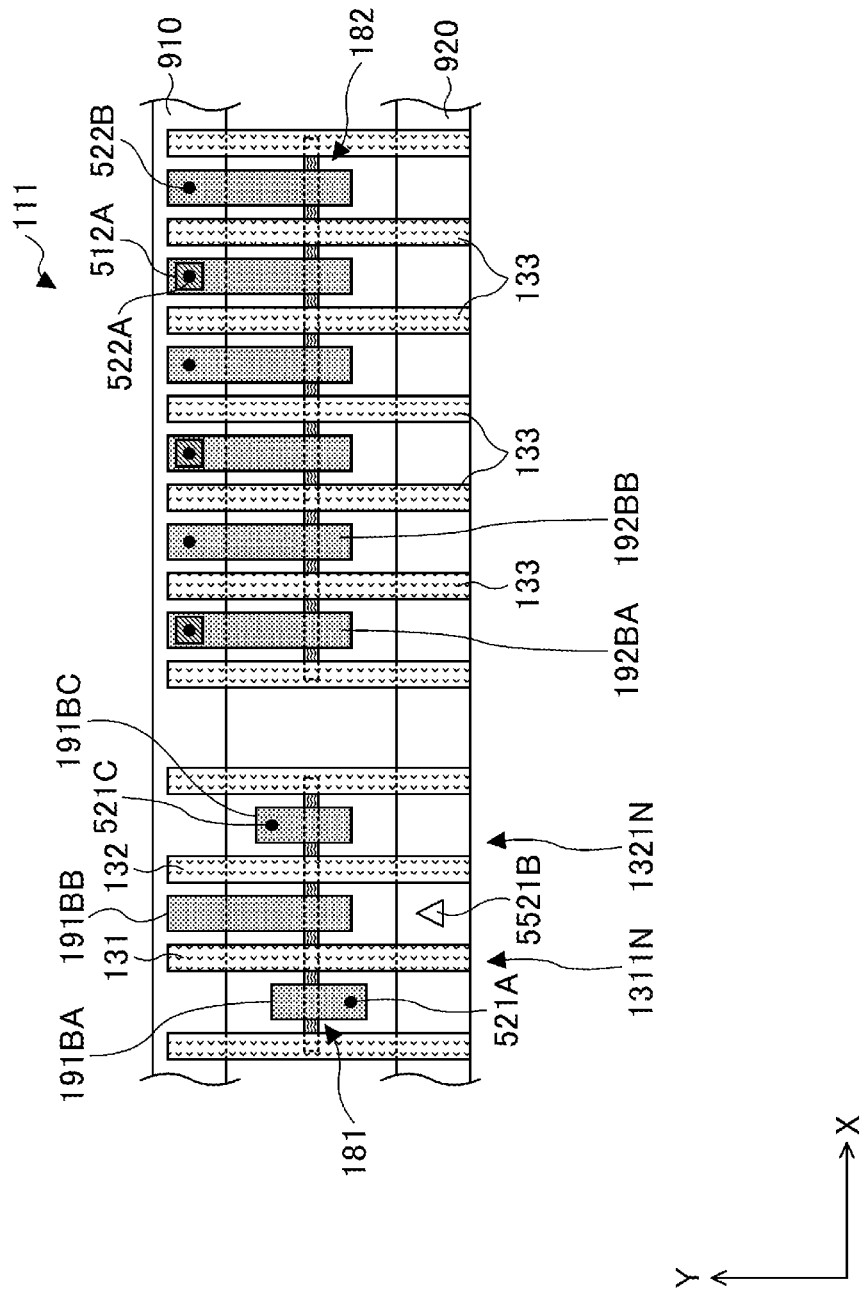
FIG. 42 is a schematic view (Part 1) illustrating a planar configuration of a standard cell area according to a first modification of the fifth embodiment.
Figure 43:
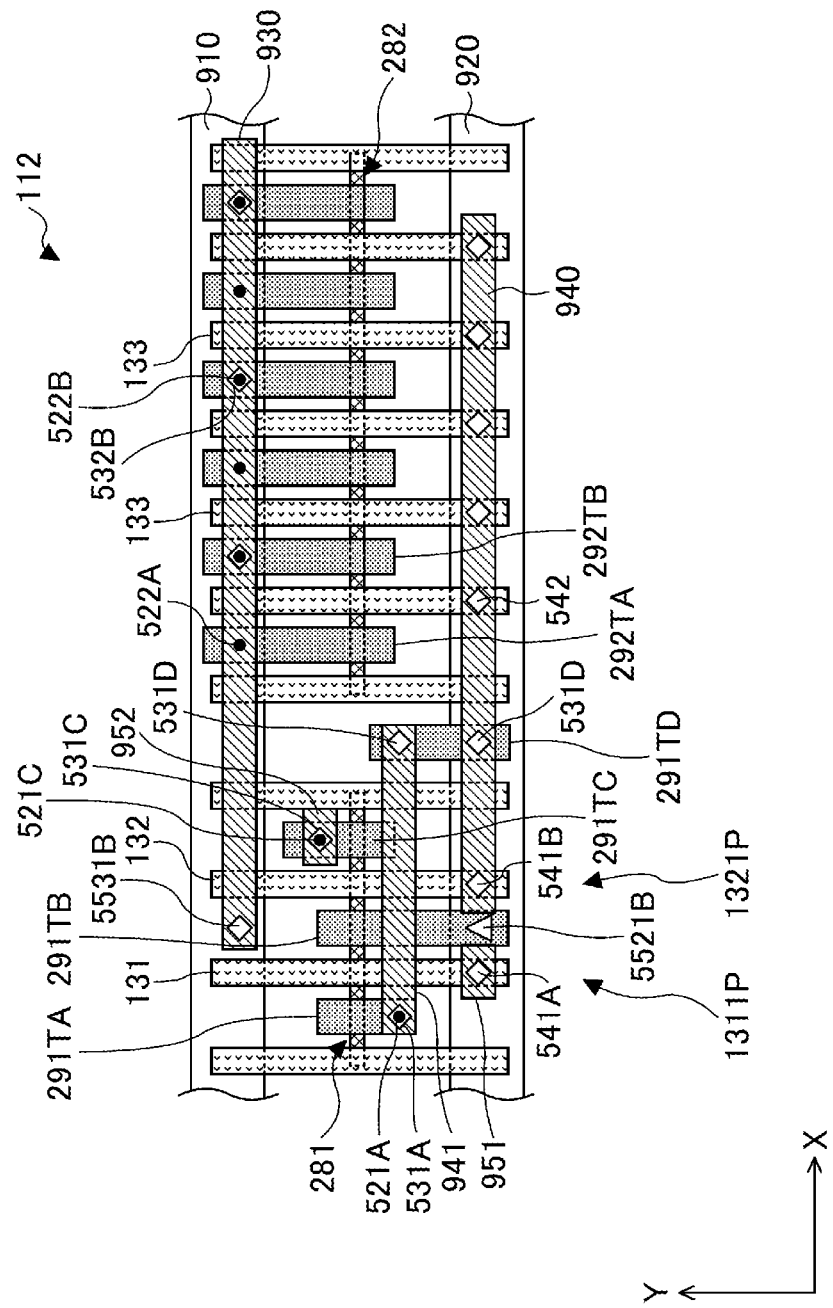
FIG. 43 is a schematic view (Part 2) illustrating a planar configuration of the standard cell area according to the first modification of the fifth embodiment.

Next, a first modification of the fifth embodiment will be described. The first modification is different from the fifth embodiment in the number of tracks of the power supply switch circuit 110. FIG. 42 and FIG. 43 are schematic views illustrating a planar configuration of a standard cell area 10 according to the first modification of the fifth embodiment. FIG. 42 mainly illustrates a layout of the N-channel MOS transistor of the power supply switch control circuit 113 and the switch transistor 111. FIG. 43 mainly illustrates the layout of the P-channel MOS transistor of the power supply switch control circuit 113 and the switch transistor 111. Except for the structures illustrated in both FIG. 42 and FIG. 43, the structures illustrated in FIG. 43 are located above the structures illustrated in FIG. 42.

In the first modification, as illustrated in FIG. 42 and FIG. 43, the power supply switch circuit 110 consists of four tracks. That is, the first modification includes a configuration in which the fifth embodiment and the fifth modification of the first embodiment are combined.

According to the first modification, the same effect as the fifth modification of the first embodiment and the same effect as the fifth embodiment can be obtained.

Second Modification of Fifth Embodiment

Figure 44:
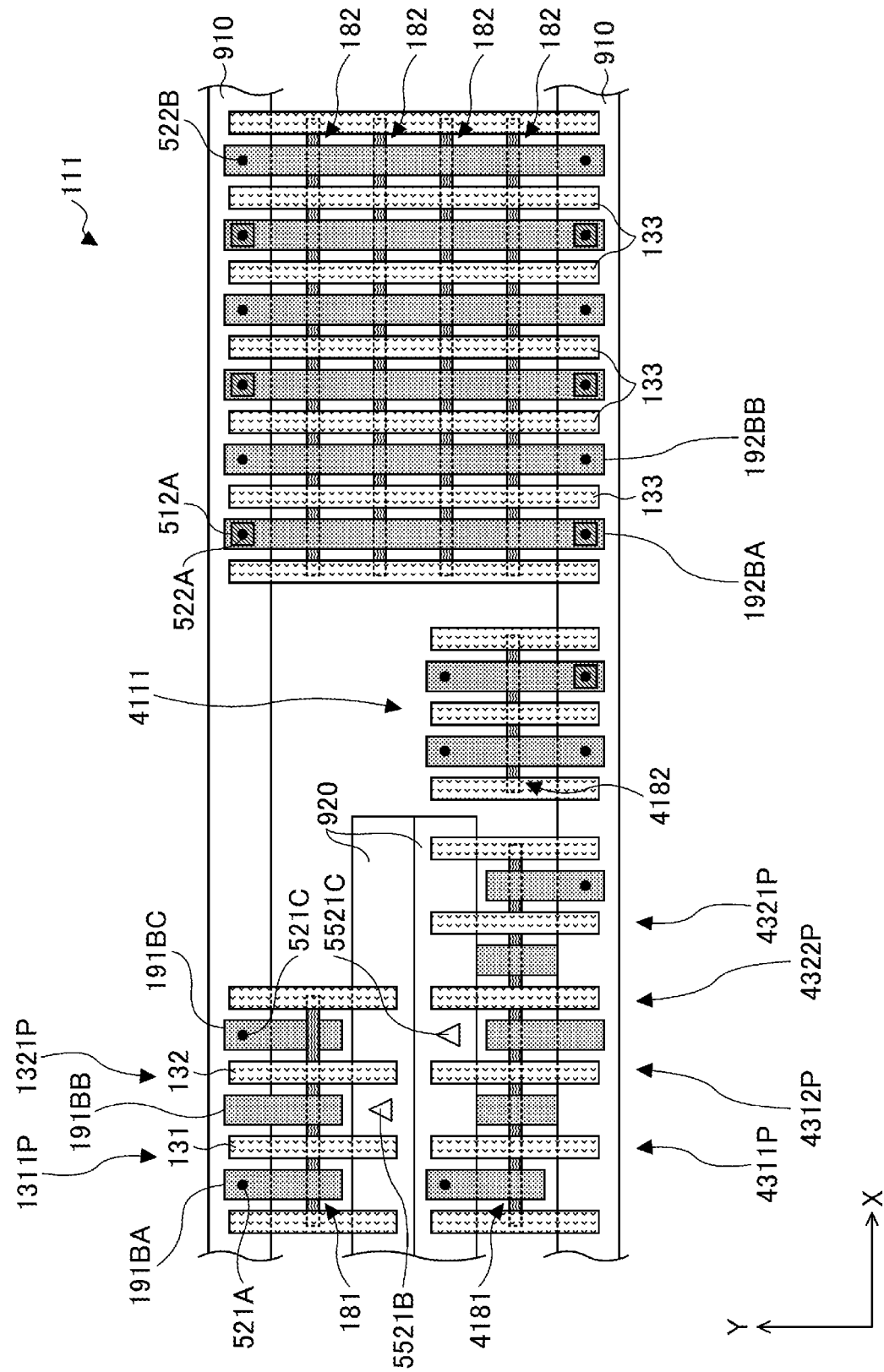
FIG. 44 is a schematic view (Part 1) illustrating a planar configuration of a standard cell area according to a second modification of the fifth embodiment.
Figure 45:
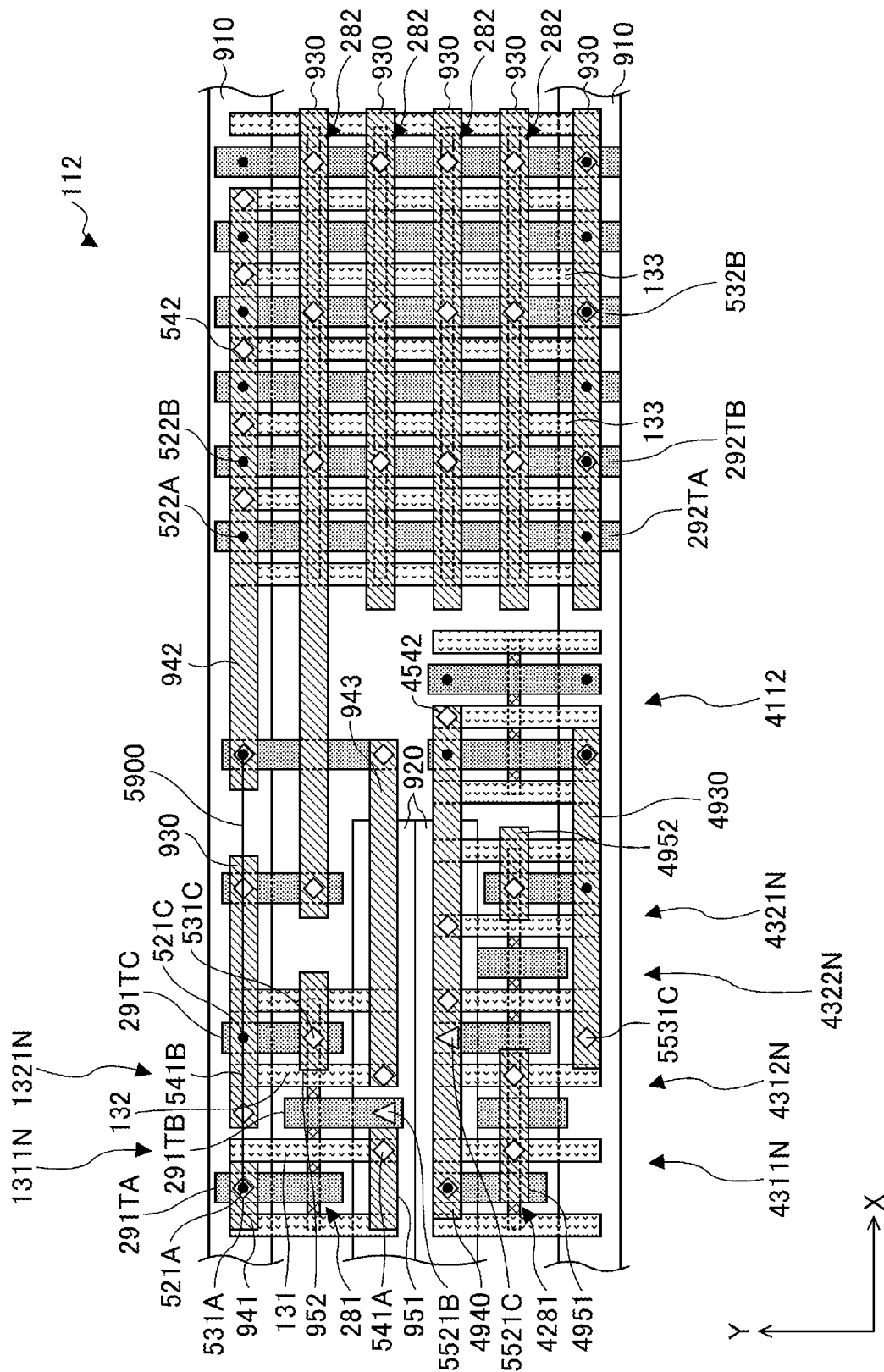
FIG. 45 is a schematic view (Part 2) illustrating a planar configuration of the standard cell area according to the second modification of the fifth embodiment.

Next, a second modification of the fifth embodiment will be described. The second modification is different from the fifth embodiment in the number of buffers and switch transistors included in the power supply switch circuit 110. FIG. 44 and FIG. 45 are schematic views illustrating a planar configuration of a standard cell area 10 according to the second modification of the fifth embodiment. FIG. 44 mainly illustrates a layout of the P-channel MOS transistor of the power supply switch control circuit 113 and the switch transistor 111. FIG. 45 mainly illustrates the layout of the N-channel MOS transistor of the power supply switch control circuit 113 and the switch transistor 111. Except for the structures illustrated in both FIG. 44 and FIG. 45, the structures illustrated in FIG. 45 are located above the structures illustrated in FIG. 44.

The second modification of the fifth embodiment has the same circuit configuration as the fourth embodiment.

In the buffer 1300, control signal lines 5941 and 5942 are formed above the power supply line 910, and a control signal line 5943 is formed above the power supply line 920 and an extension line of the power supply line 920. The control signal line 5941 and the control signal line 5942 are connected to each other via the wiring 5900 formed above the control signal line 5941 and the control signal line 5942. The control signal line 5943 is connected to the control signal line 5942 via a local interconnect formed in the same layer as the local interconnect 291TA, and the control signal line 5943 is connected to the gate electrode 132 of the P-channel MOS transistor 1321P.

In the buffer 4300, a control signal line 4940 is located above the power supply line 920 and an extension line of the power supply line 920, and a power supply line 4930 is located above the power supply line 910.

That is, the second modification includes a configuration in which the fifth embodiment and the fourth embodiment are combined.

According to the first modification, the same effect as that of the fourth embodiment and the same effect as that of the fifth embodiment can be obtained.

Although the present disclosure has been described above with reference to the embodiments, the present disclosure is not limited to the features described in the embodiments. These features can be changed without departing from the scope of the claimed subject matter, and can be appropriately determined according to the implementation to which the present disclosure is applied.

All examples and conditional language provided herein are intended for the pedagogical purposes of aiding the reader in understanding the disclosure and the concepts contributed by the inventor to further the art, and are not to be construed as limitations to such specifically recited examples and conditions, nor does the organization of such examples in the specification relate to a showing of the superiority and inferiority of the disclosure. Although one or more embodiments of the present disclosure have been described in detail, it should be understood that the various changes, substitutions, and alterations could be made hereto without departing from the spirit and scope of the disclosure.

What is claimed is:
1. A semiconductor device comprising:
 a first power supply line;
 a second power supply line;
 a first ground line;
 a switch circuit connected to the first power supply line and the second power supply line;
 a switch control circuit connected to the first ground line and the first power supply line; and
 a signal line,
 wherein the switch circuit includes:
  a first transistor of a first conductive type; and
  a second transistor, formed on the first transistor, of the first conductive type, the second transistor being connected in parallel with the first transistor between the first power supply line and the second power supply line, and
  a first gate electrode of the first transistor is connected to a second gate electrode of the second transistor,
 wherein the switch control circuit includes:
  a third transistor of a second conductive type; and
  a fourth transistor, formed on the third transistor, of a third conductive type that is different from the second conductive type, the fourth transistor being connected in series with the third transistor between the first ground line and the first power supply line, and a third gate electrode of the third transistor is connected to a fourth gate electrode of the fourth transistor, and wherein the signal line electrically connects a connection point between the third transistor and the fourth transistor to the first gate electrode and the second gate electrode.

2. The semiconductor device according to claim 1, further comprising a substrate in which the second power supply line and the first ground line are embedded, wherein the first power supply line is arranged on the substrate.

3. The semiconductor device according to claim 2, wherein VDD of the first power supply line is divided into a plurality of parts to be connected to a source of the second transistor.

4. The semiconductor device according to claim 2, further comprising:
a first local interconnect that connects a source of the first transistor with the first power supply line;
a second local interconnect that connects a drain of the first transistor with the second power supply line;
a third local interconnect that connects a source of the second transistor with the first power supply line;
a fourth local interconnect that connects a drain of the second transistor with the second power supply line;
a fifth local interconnect that connects a source of the third transistor with one of the first power supply line and the first ground line;
a sixth local interconnect that connects a drain of the third transistor with the signal line;
a seventh local interconnect that connects a source of the fourth transistor with another one of the first power supply line and the first ground line; and
an eighth local interconnect that connects a drain of the fourth transistor with the signal line.

5. The semiconductor device according to claim 4, wherein the first local interconnect is connected to the first power supply line via the third local interconnect.

6. The semiconductor device according to claim 4, wherein the first local interconnect is connected to the first power supply line through a via provided in an insulation film between the first local interconnect and the first power supply line.

7. The semiconductor device according to claim 6, wherein, in a plan view, the source of the first transistor and the drain of the second transistor overlap, and the drain of the first transistor and the source of the second transistor overlap.

8. The semiconductor device according to claim 1, wherein the second conductive type is different from the first conductive type, and the third conductive type is same as the first conductive type.

9. The semiconductor device according to claim 8, wherein the first transistor, the second transistor, and the fourth transistor are P-channel transistors, and the third transistor is an N-channel transistor.

10. The semiconductor device according to claim 1, wherein the second conductive type is same as the first conductive type, and the third conductive type is different from the first conductive type.

11. The semiconductor device according to claim 10, wherein the first transistor, the second transistor, and the third transistor are P-channel transistors, and the fourth transistor is an N-channel transistor.

12. The semiconductor device according to claim 1, wherein the second transistor and the fourth transistor include nanowires in a channel.

13. The semiconductor device according to claim 1, wherein the first transistor and the third transistor are fin type transistors.

14. The semiconductor device according to claim 1, wherein the first transistor and the third transistor include nanowires in a channel.

* * * * *